US010902913B2

(12) United States Patent
Terada

(10) Patent No.: US 10,902,913 B2
(45) Date of Patent: Jan. 26, 2021

(54) SEMICONDUCTOR DEVICE

(71) Applicant: SONY SEMICONDUCTOR SOLUTIONS CORPORATION, Kanagawa (JP)

(72) Inventor: Haruhiko Terada, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/614,483

(22) PCT Filed: Apr. 5, 2018

(86) PCT No.: PCT/JP2018/014585
§ 371 (c)(1),
(2) Date: Nov. 18, 2019

(87) PCT Pub. No.: WO2018/216365
PCT Pub. Date: Nov. 29, 2018

(65) Prior Publication Data
US 2020/0202931 A1    Jun. 25, 2020

(30) Foreign Application Priority Data

May 26, 2017  (JP) ................................ 2017-104176

(51) Int. Cl.
*G11C 13/00* (2006.01)
*H01L 23/522* (2006.01)
(Continued)

(52) U.S. Cl.
CPC ...... *G11C 13/0028* (2013.01); *G11C 13/0026* (2013.01); *H01L 23/528* (2013.01);
(Continued)

(58) Field of Classification Search
CPC ............ G11C 13/0028; G11C 13/0026; G11C 13/0023; H01L 23/5226; H01L 23/528; H01L 27/2481
See application file for complete search history.

(56) References Cited

U.S. PATENT DOCUMENTS 8,437,162 B2 *  5/2013  Maejima ............. H01L 27/1021
                                                    365/51
10,685,682 B2 *  6/2020  Jeong .................. H01L 27/2427
(Continued)

FOREIGN PATENT DOCUMENTS

JP     2014-154201 A    8/2014
KR  10-2010-0050801 A   5/2010

OTHER PUBLICATIONS

International Search Report and Written Opinion of PCT Application No. PCT/JP2018/014585, dated May 22, 2018, 08 pages of ISRWO.

*Primary Examiner* — Allison Bernstein
(74) *Attorney, Agent, or Firm* — Chip Law Group

(57) ABSTRACT

The semiconductor device of the present disclosure includes a plurality of first selection lines provided in a first region, extending in a first direction, and aligned in a second direction; a plurality of second selection lines provided in a second region having a portion that overlaps a portion of the first region, extending in the second direction, and aligned in the first direction; a plurality of third selection lines provided in a third region having a portion that overlaps a portion of the second region, extending in the first direction, and aligned in the second direction; a plurality of fourth selection lines provided in a fourth region having one portion that overlaps a portion of the first region and having another portion that overlaps a portion of the third region, extending in the second direction, and aligned in the first direction; a first coupling part, a first coupling part, a first coupling part, (Continued)

and a first coupling part coupled, respectively, to the plurality of first selection lines, the plurality of second selection lines, the plurality of third selection lines, and the plurality of fourth selection lines; a driver; and memory cells.

15 Claims, 42 Drawing Sheets

(51) Int. Cl.
*H01L 23/528* (2006.01)
*H01L 27/24* (2006.01)
*H01L 45/00* (2006.01)

(52) U.S. Cl.
CPC ...... *H01L 23/5226* (2013.01); *H01L 27/2436* (2013.01); *H01L 27/2481* (2013.01); *H01L 45/1233* (2013.01); *G11C 2213/71* (2013.01); *G11C 2213/79* (2013.01)

(56) References Cited

U.S. PATENT DOCUMENTS

| | | |
|---|---|---|
| 2010/0110770 A1 | 5/2010 | Kim |
| 2014/0104968 A1 | 4/2014 | Flores et al. |
| 2014/0219004 A1 | 8/2014 | Minemura et al. |
| 2020/0020411 A1* | 1/2020 | Terada .................... G11C 8/10 |

* cited by examiner

[ FIG. 1 ]
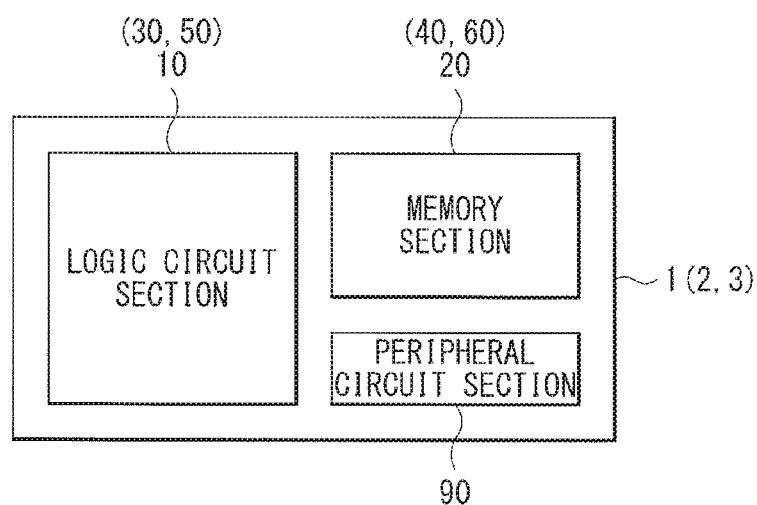

[FIG. 2]
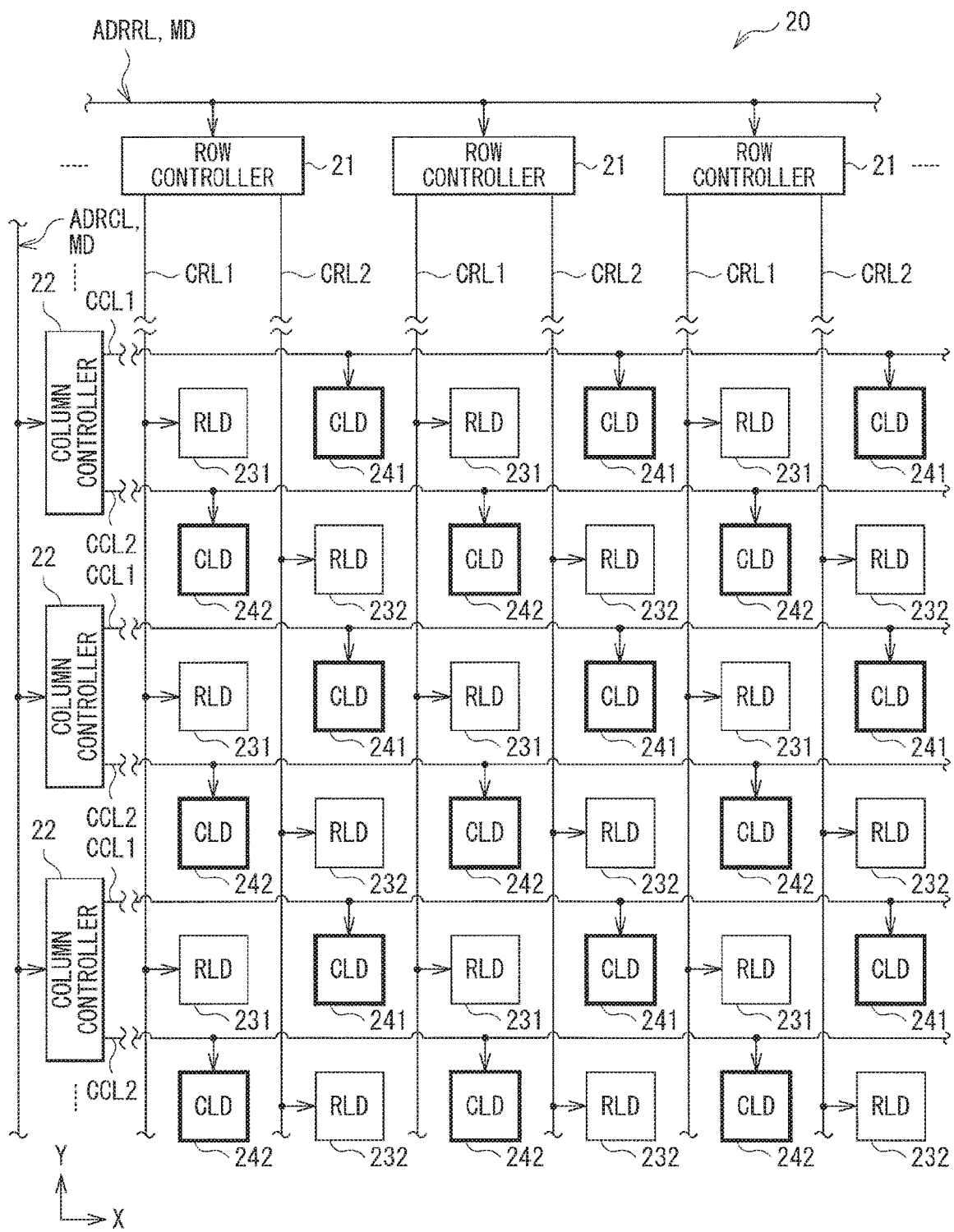

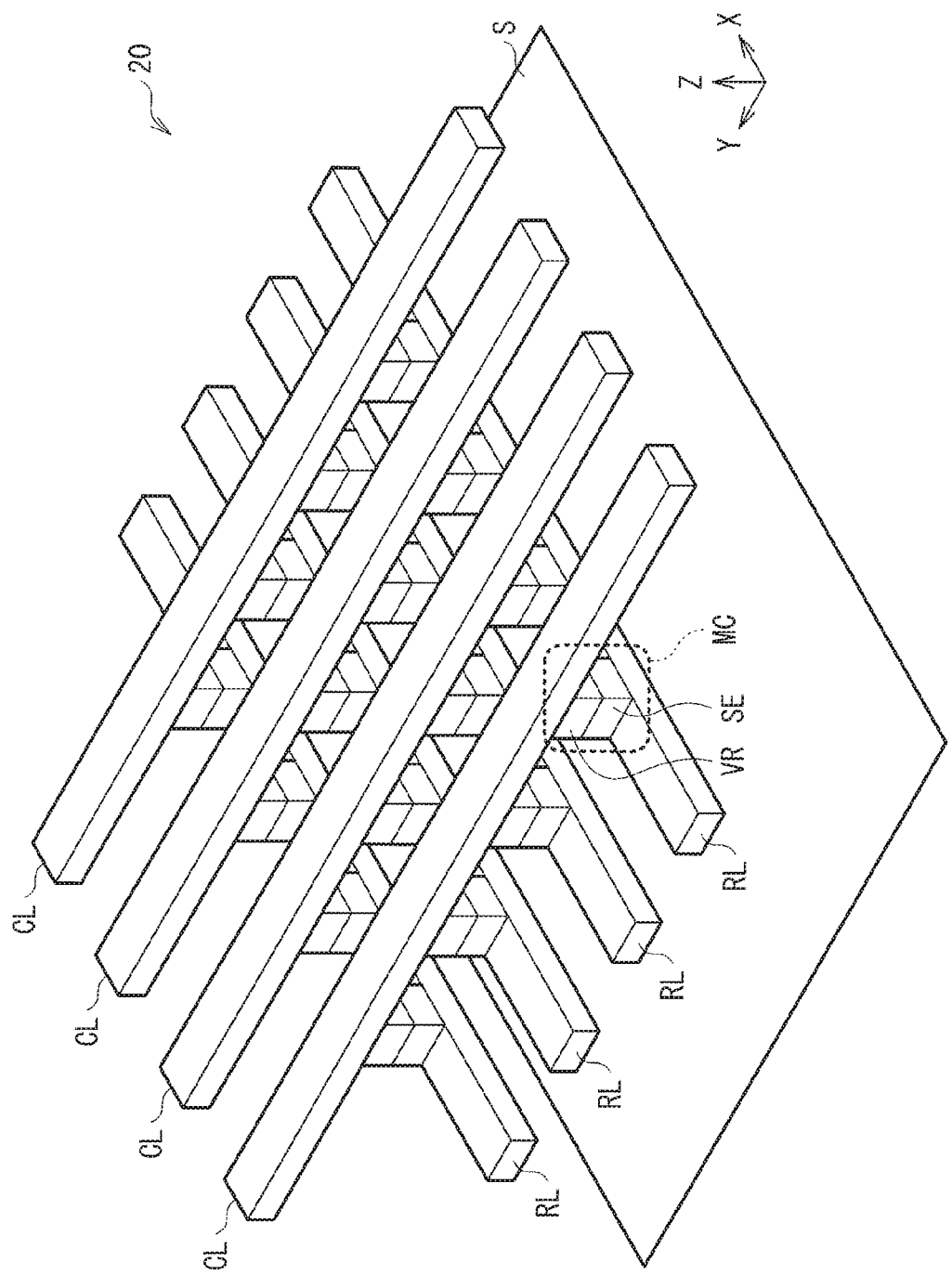
[FIG. 3]

[FIG. 4]
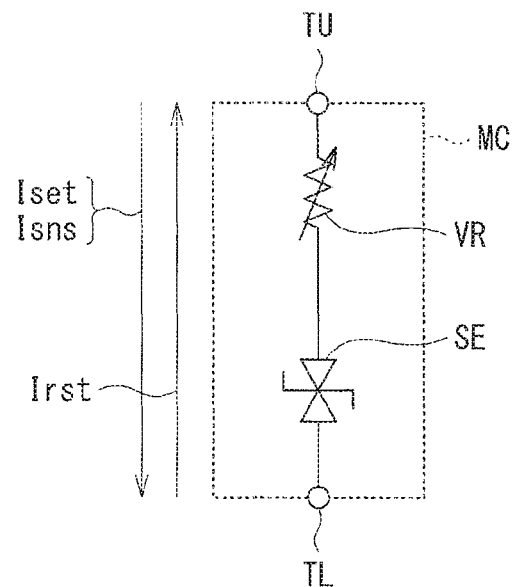
[FIG. 5]
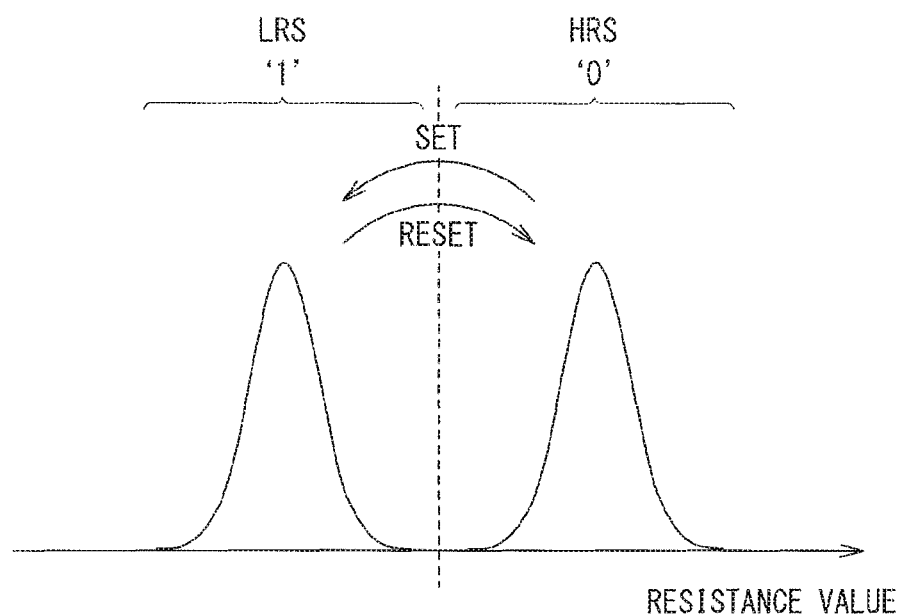

[FIG. 6]
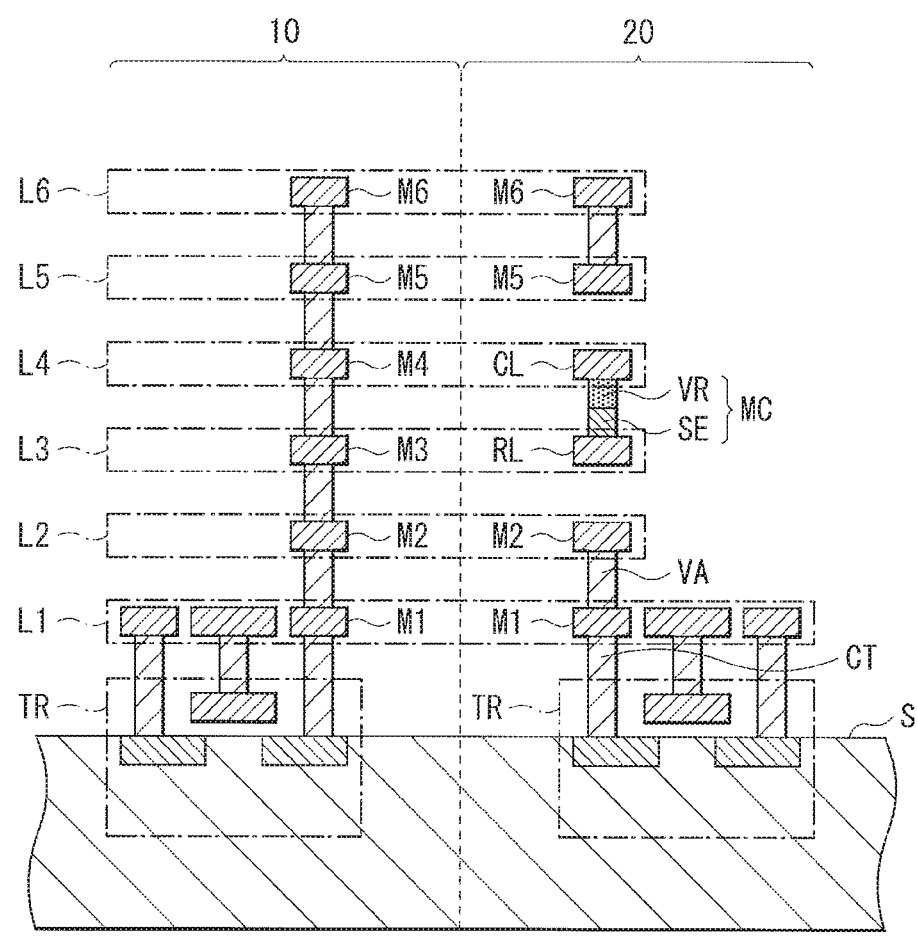

[FIG. 7]
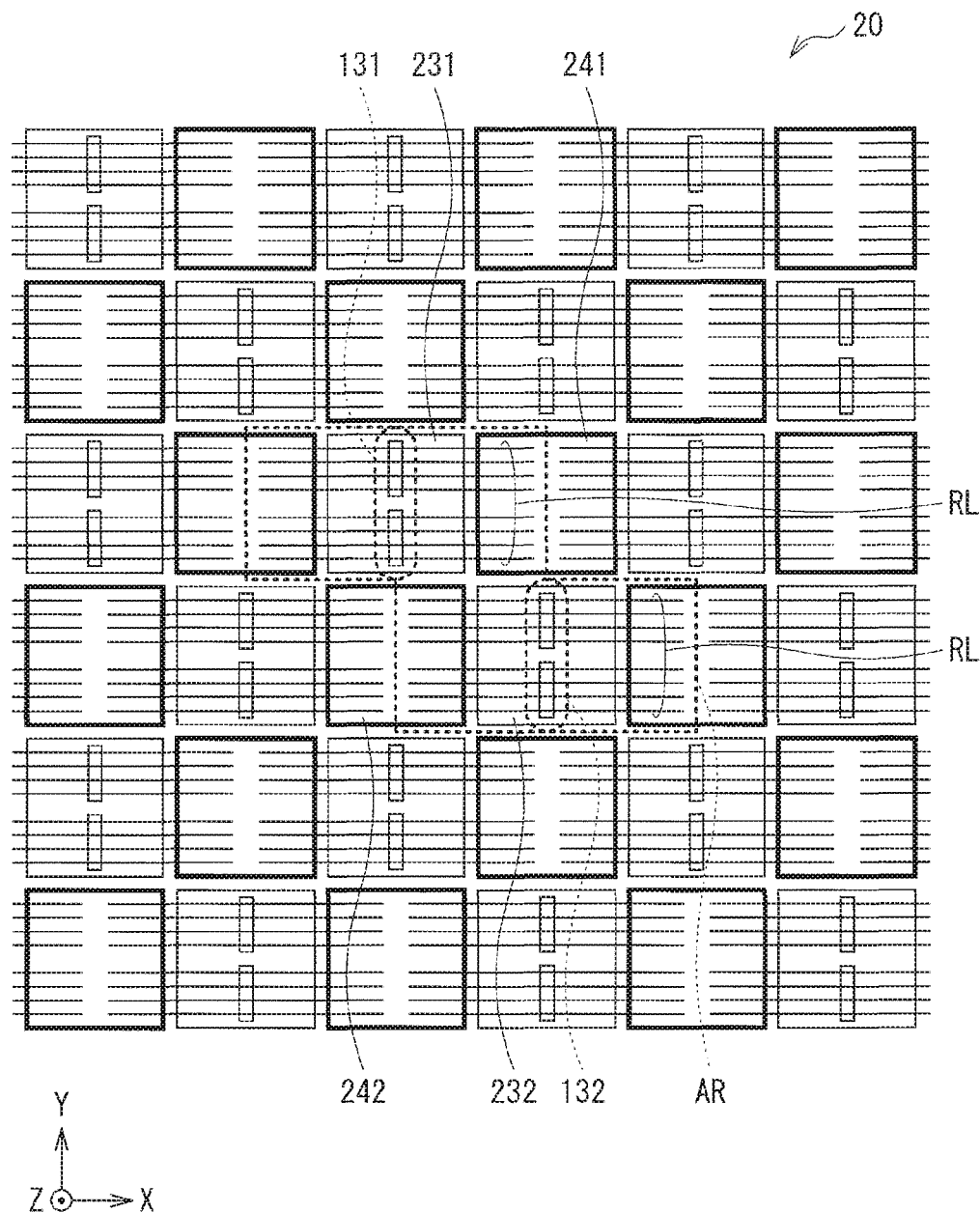

[FIG. 8]
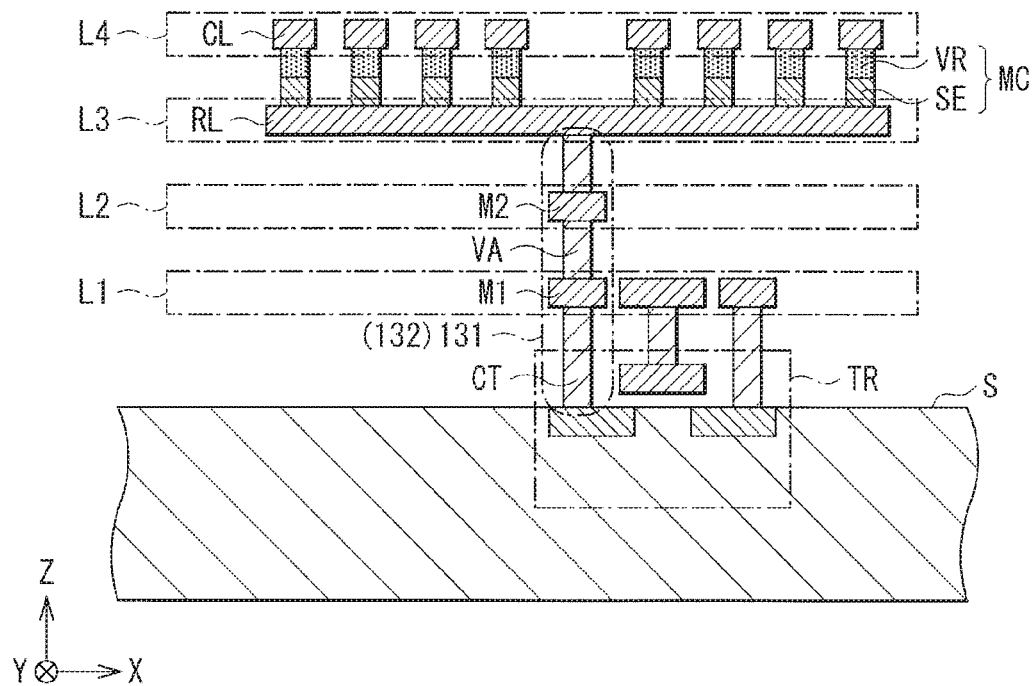

[FIG. 9]
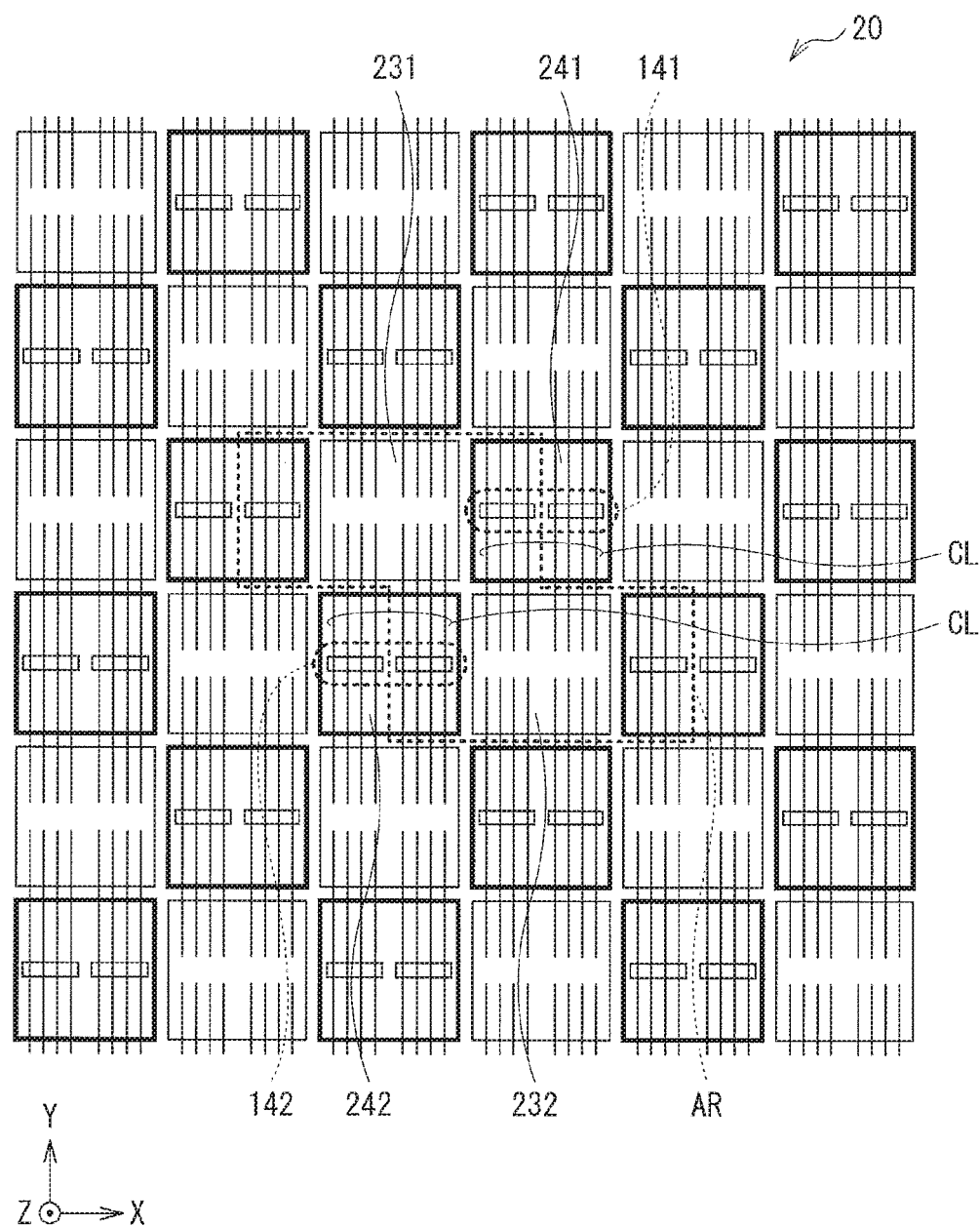

[FIG. 10]
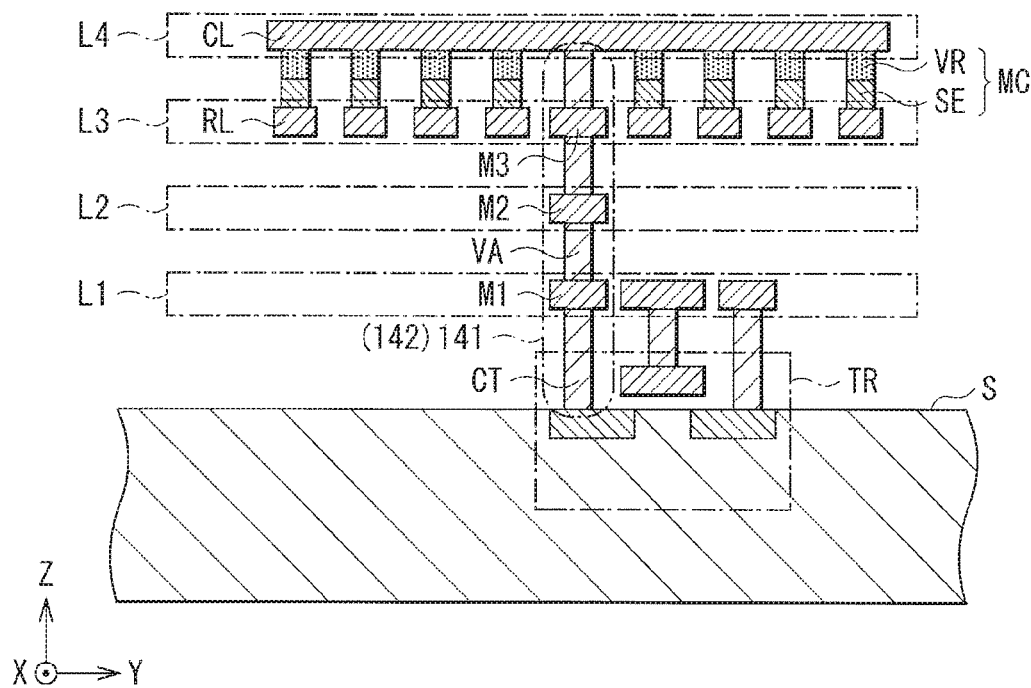

[FIG. 11]
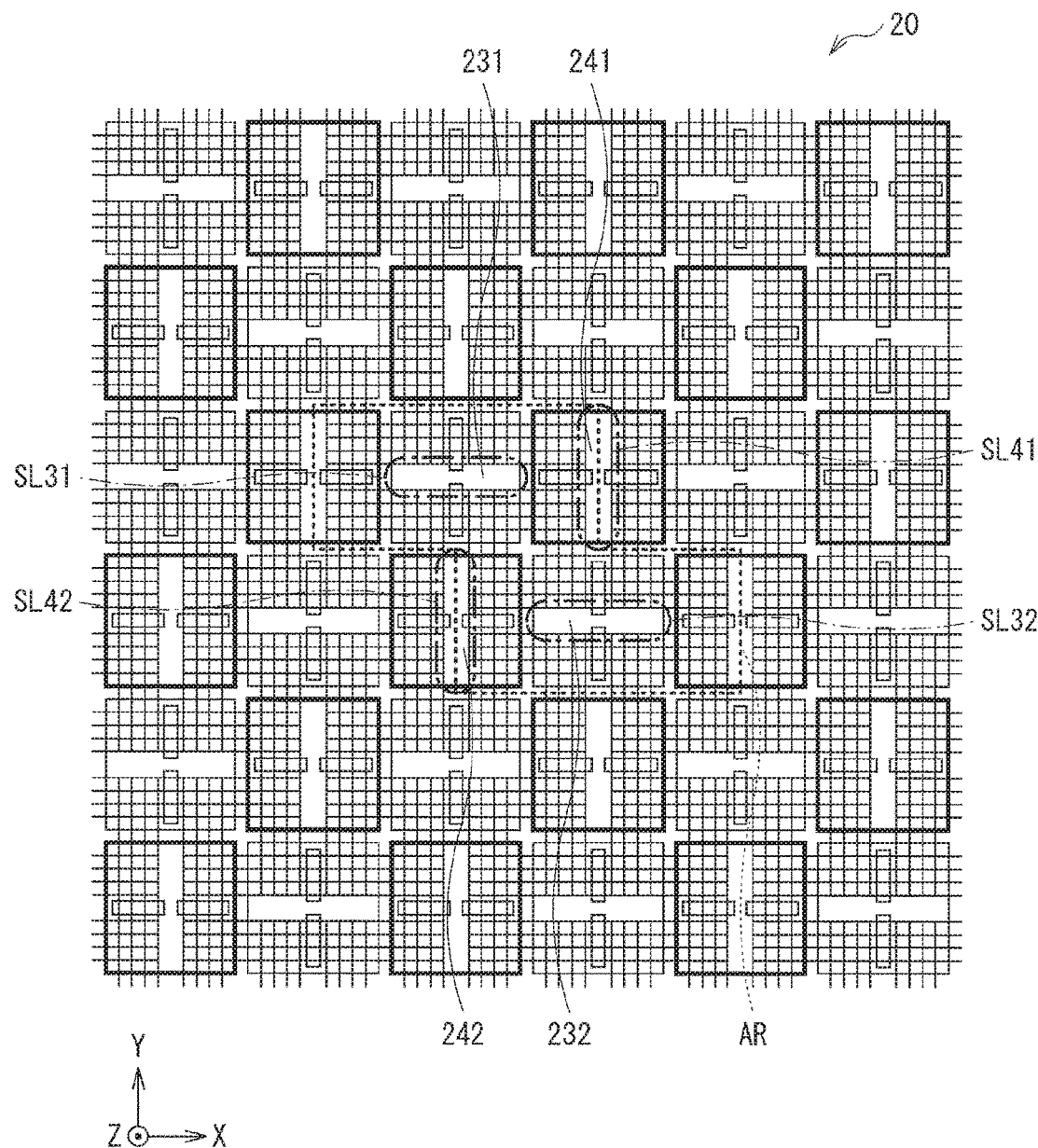

[FIG. 12]
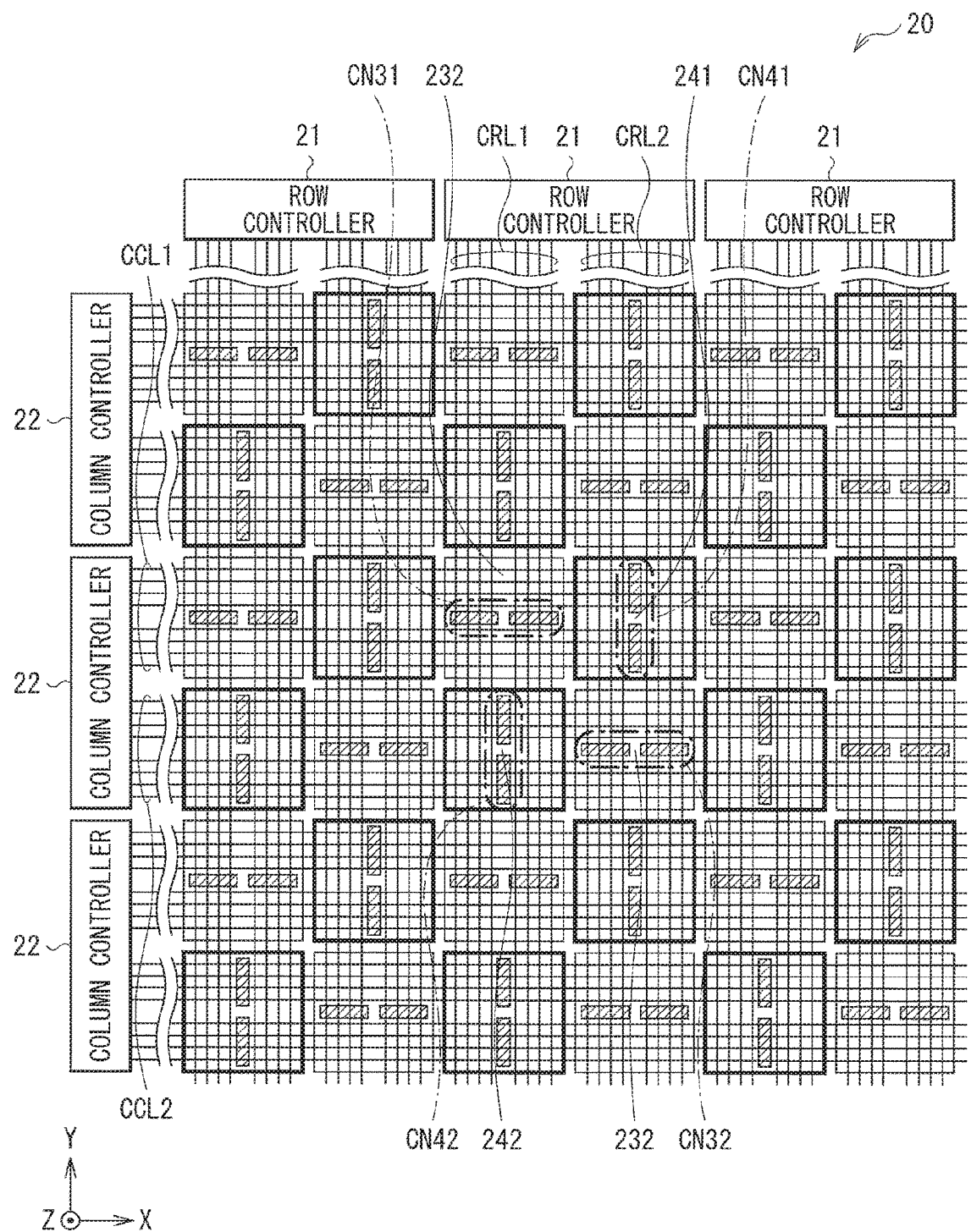

[ FIG. 13 ]
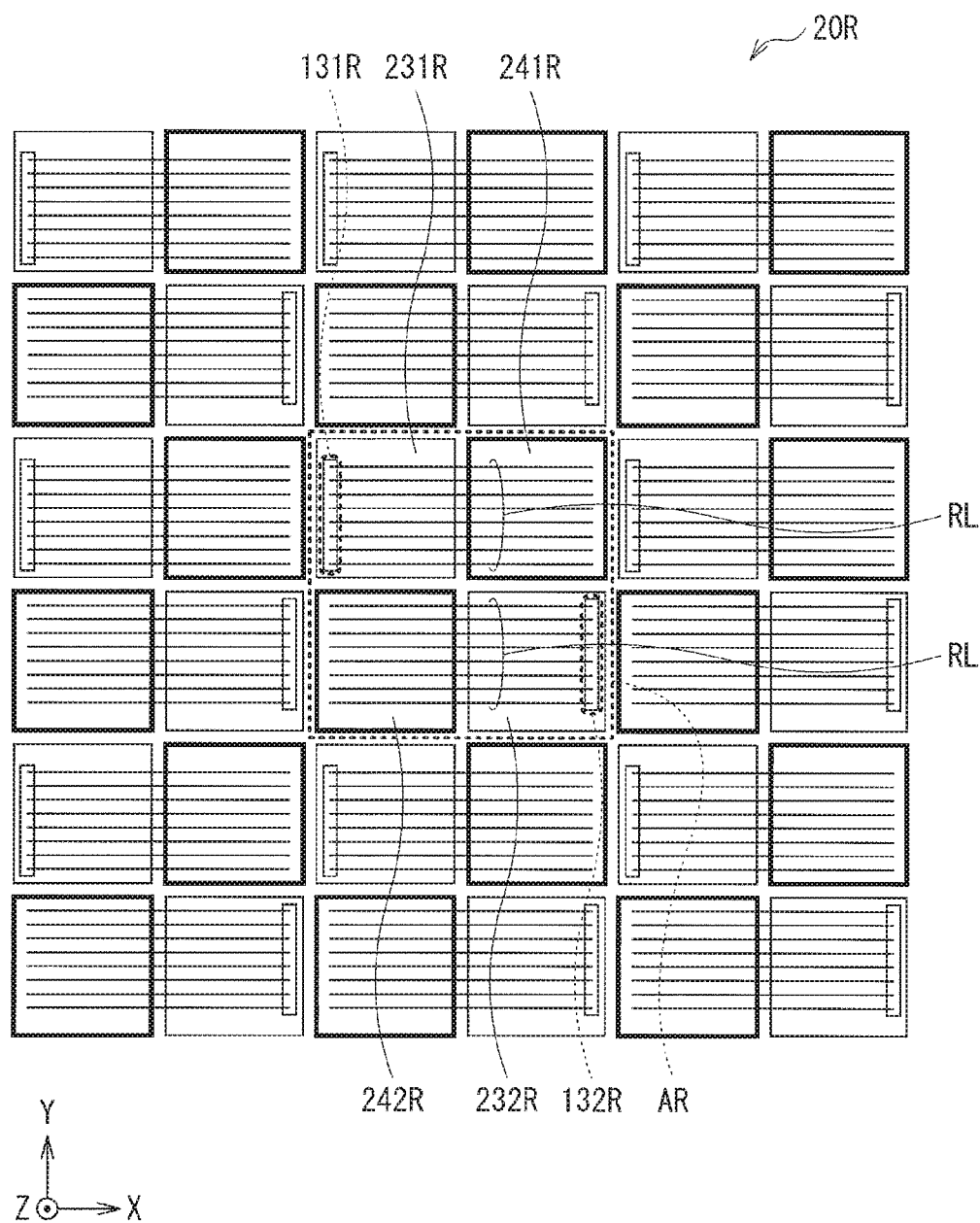

[ FIG. 14 ]
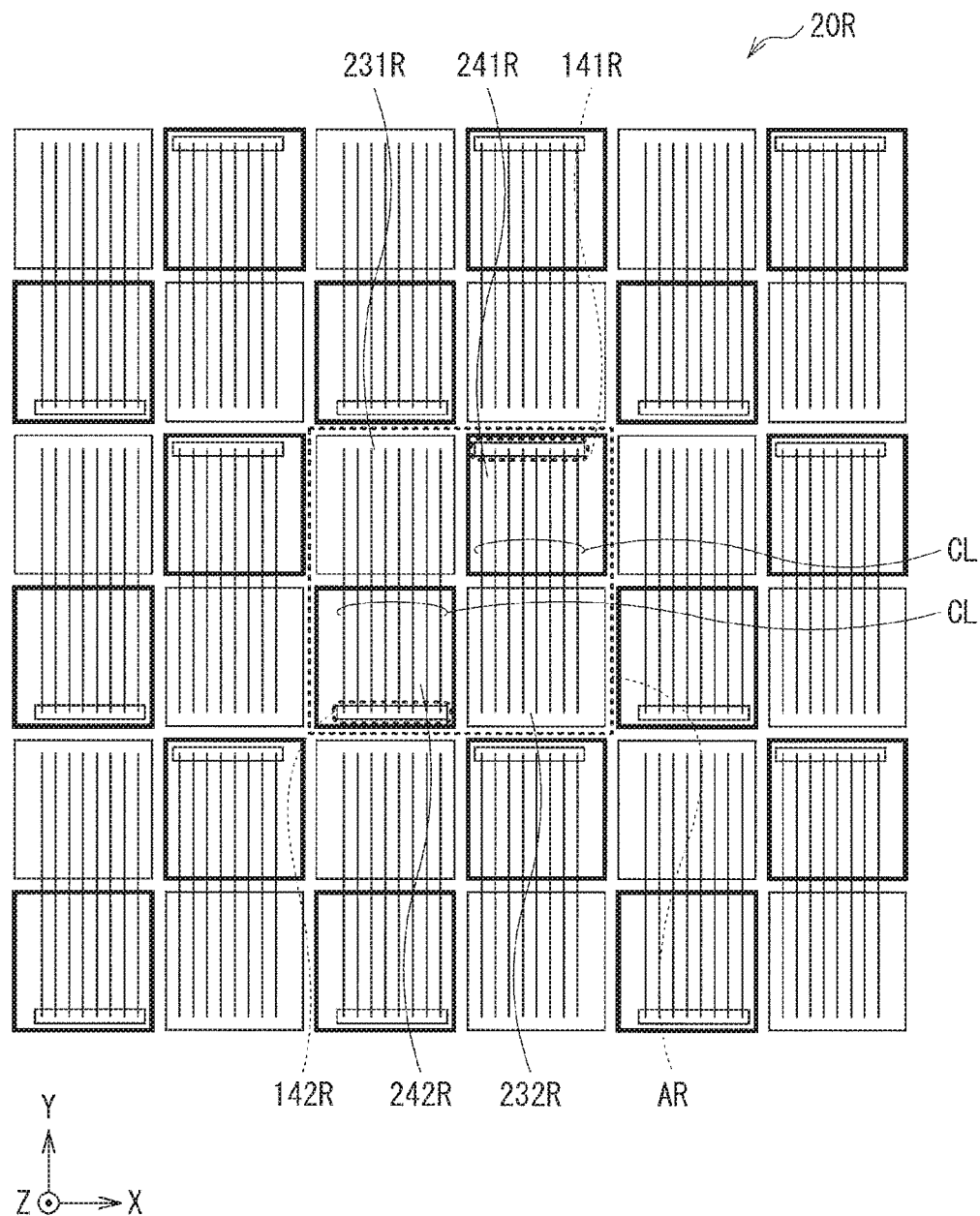

[ FIG. 15A ]
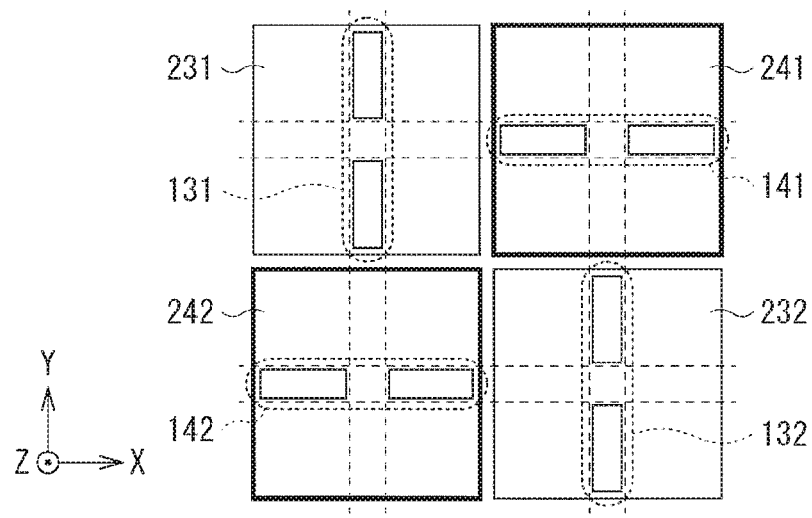
[ FIG. 15B ]
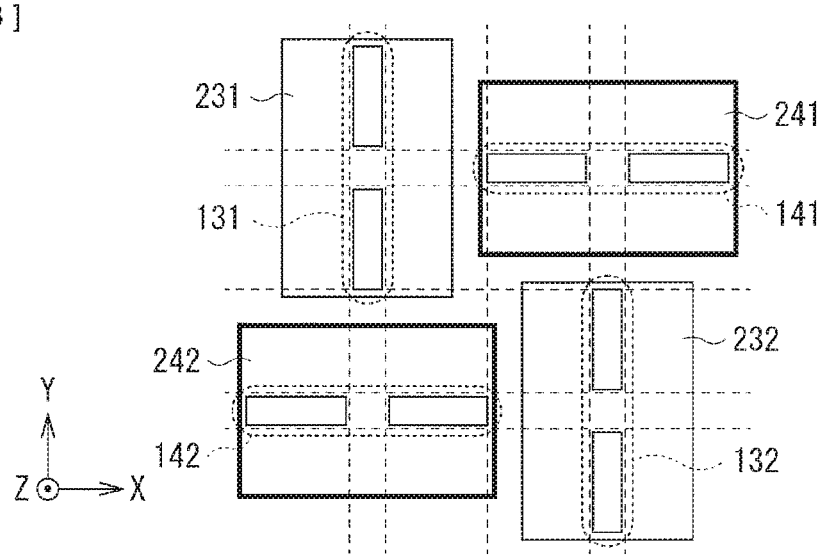
[ FIG. 15C ]
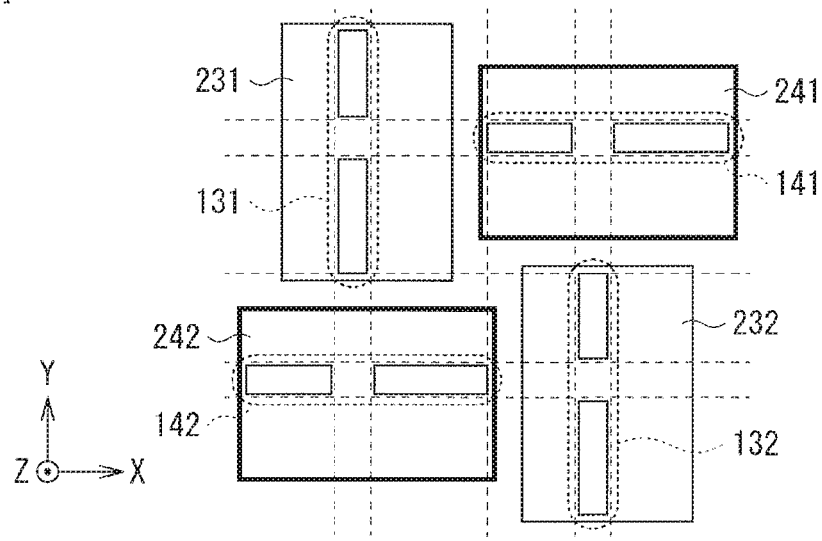

[FIG. 16]
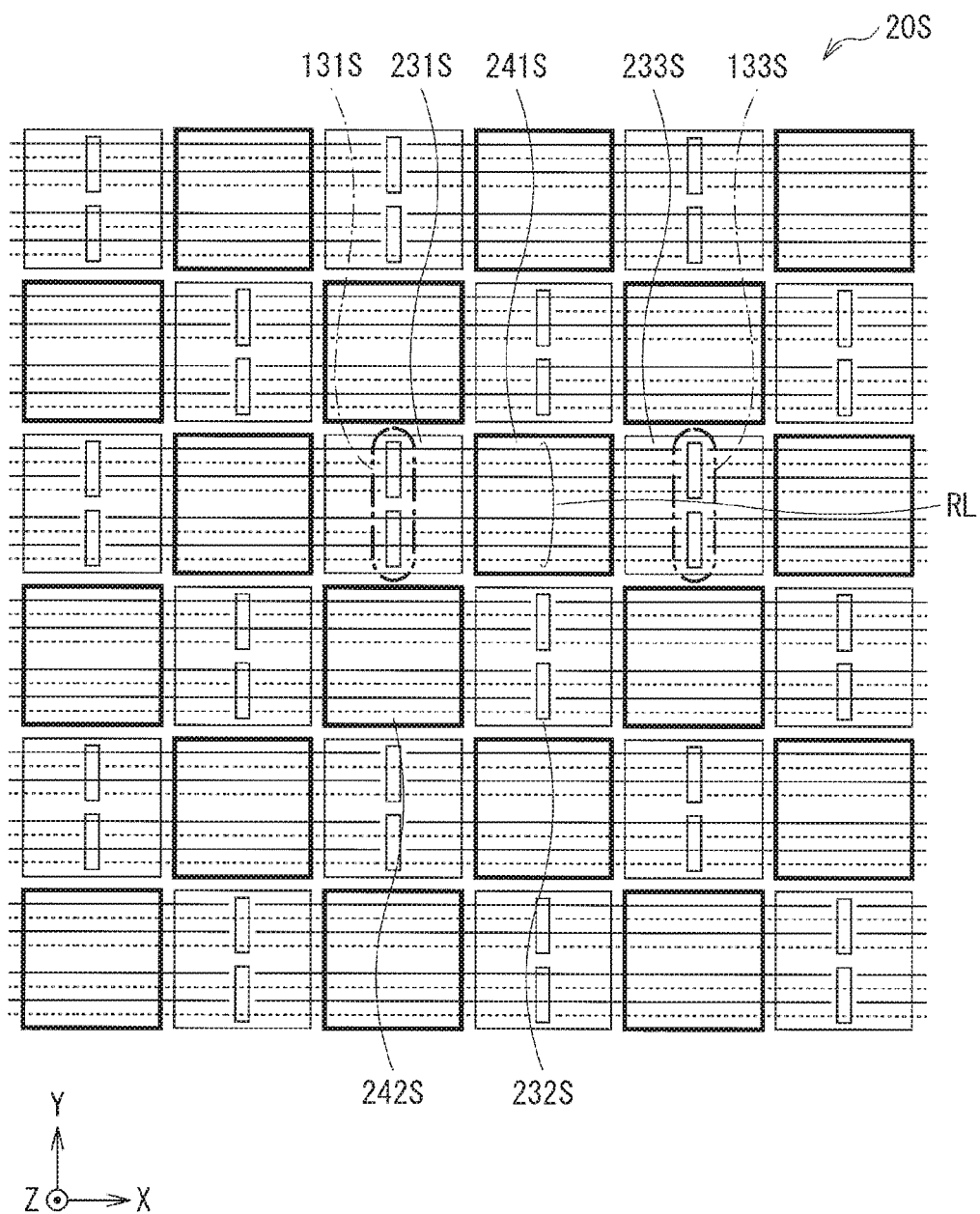

[FIG. 17]
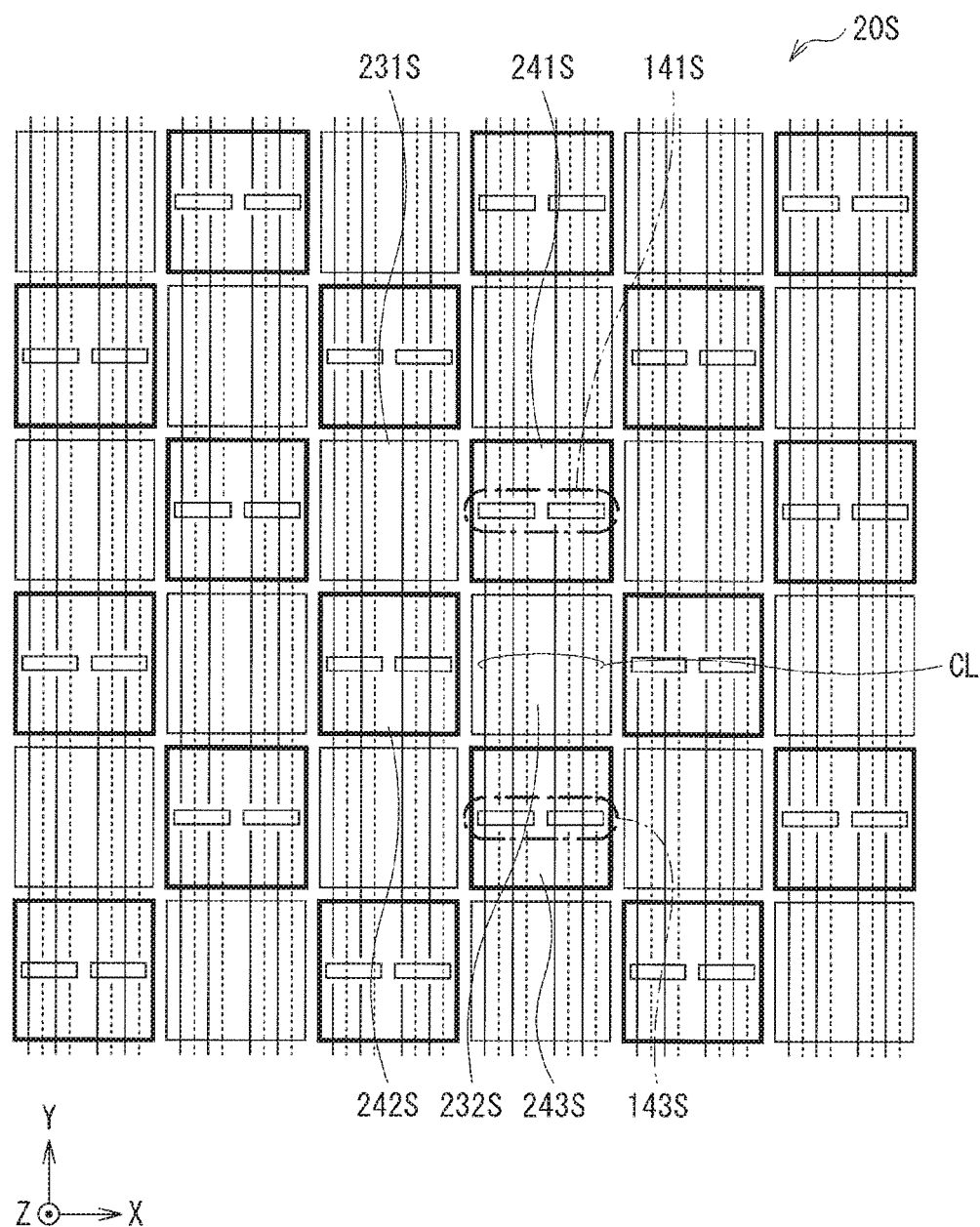

[FIG. 18]
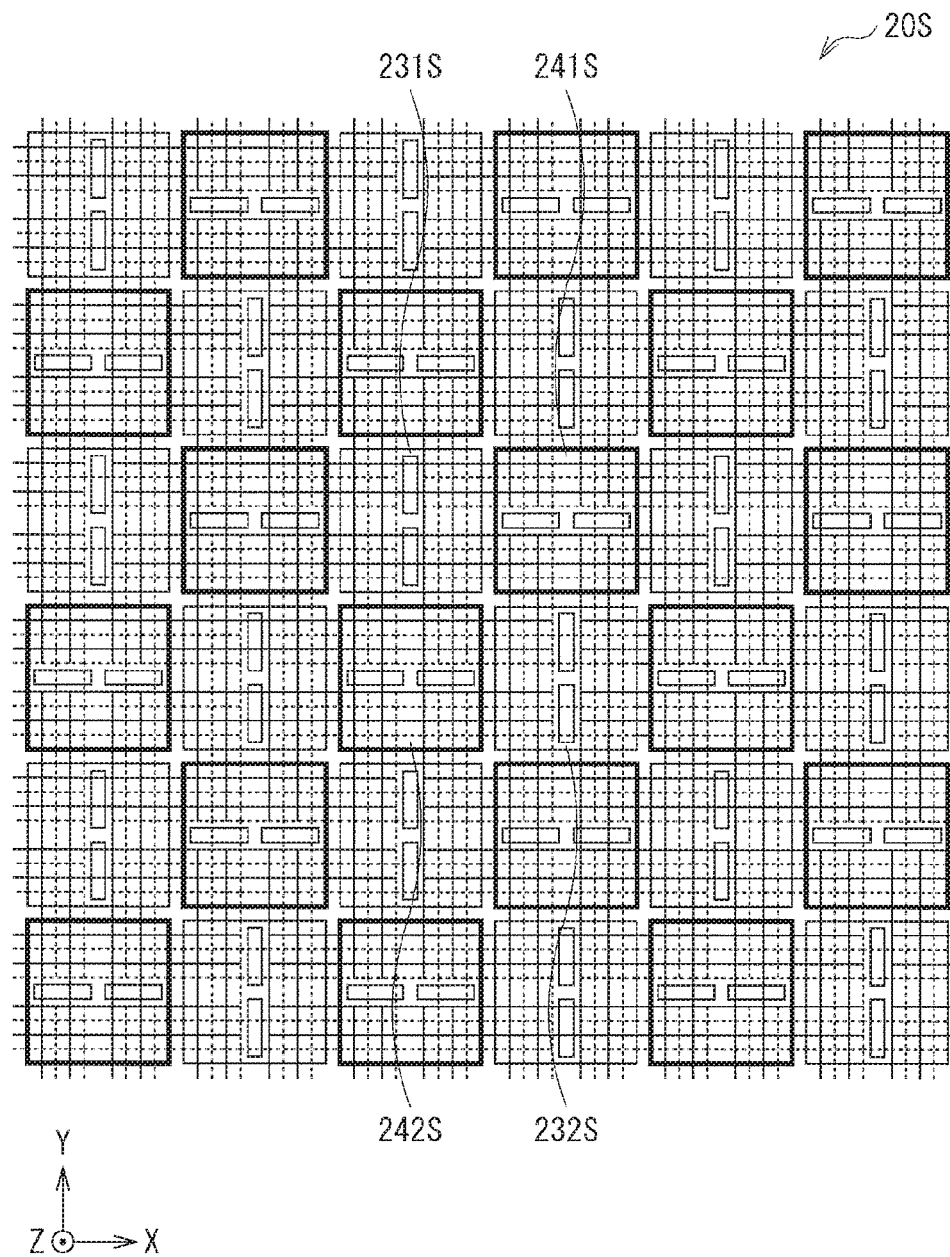

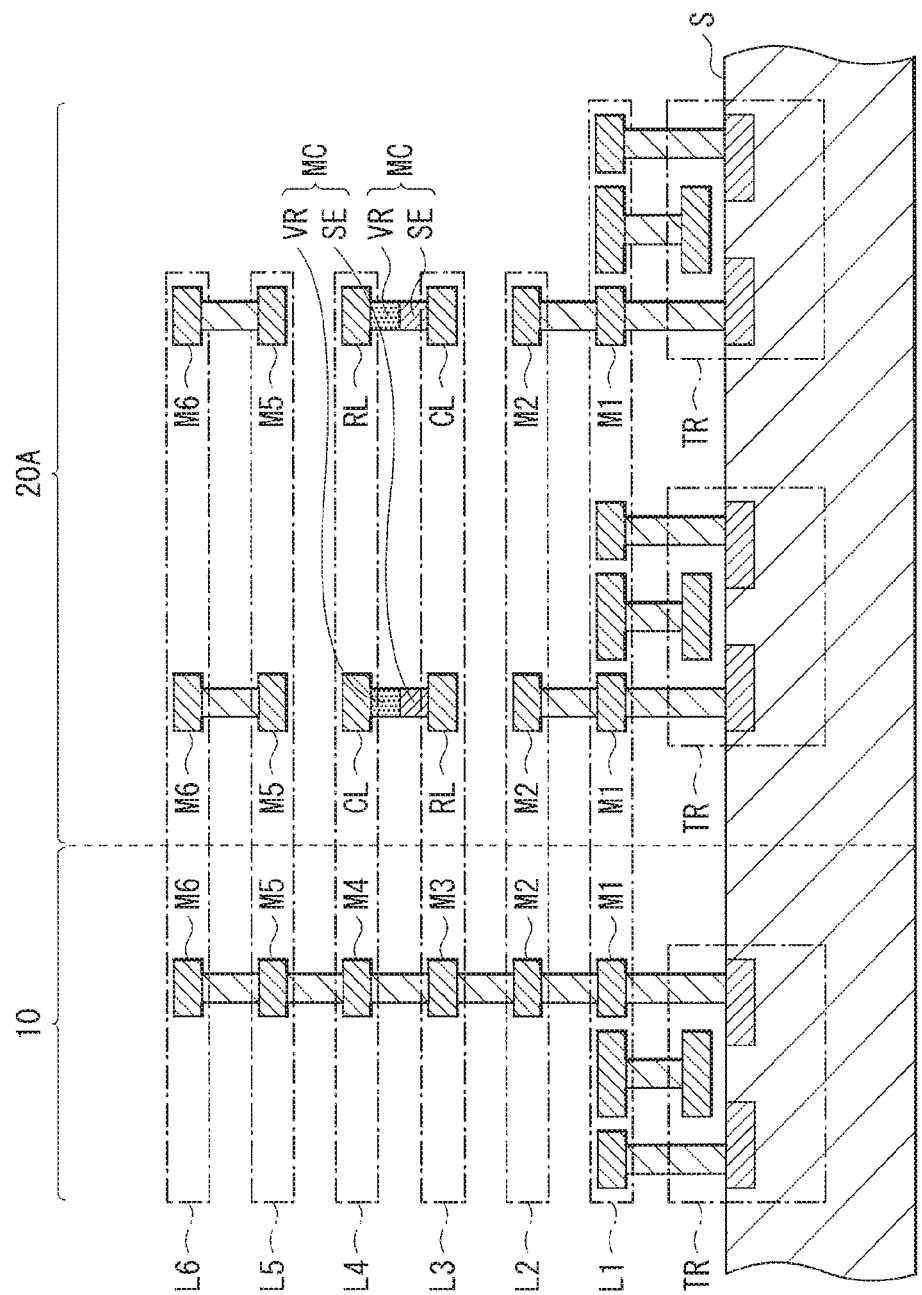
[FIG. 19]

[FIG. 20]
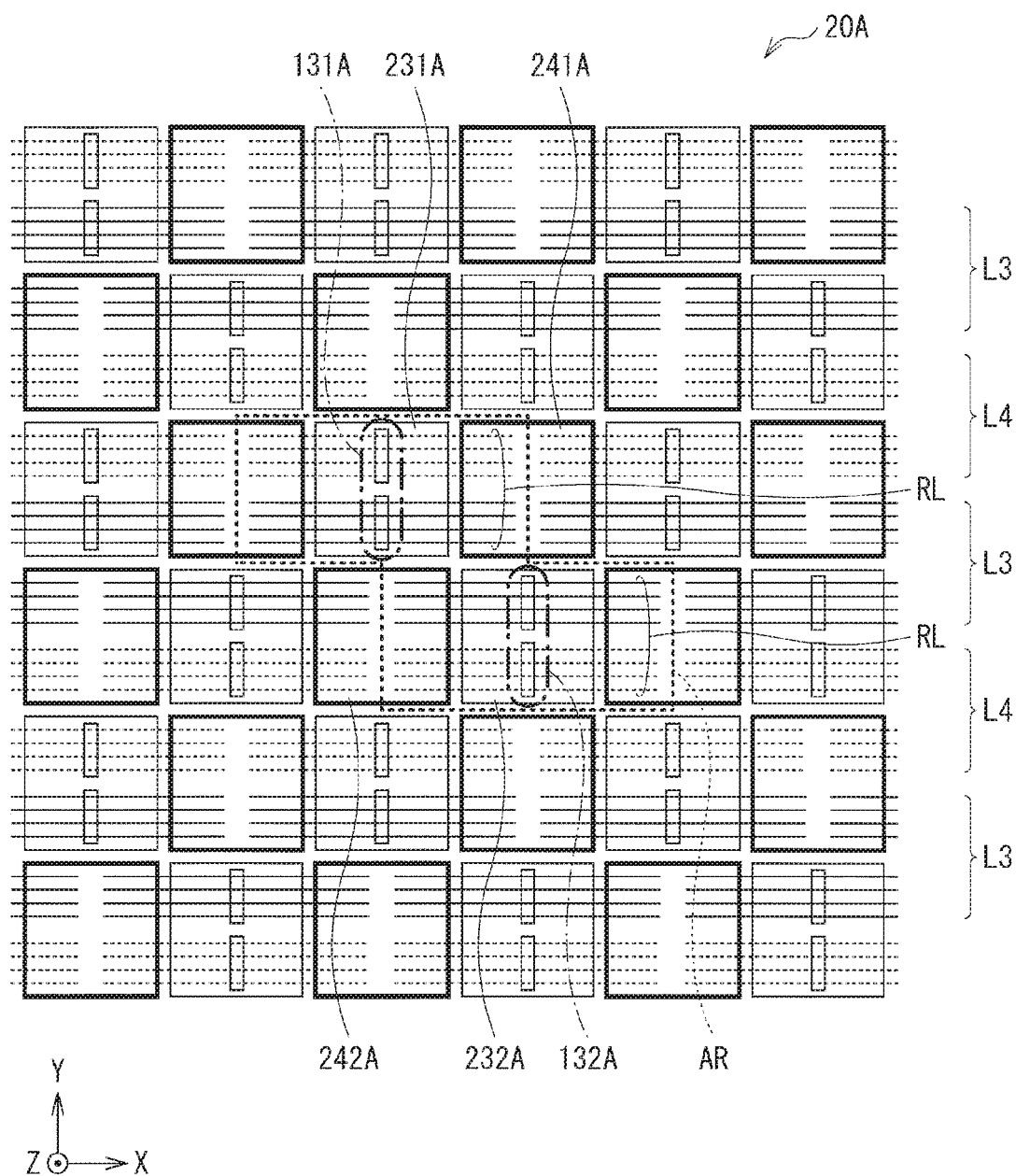

[FIG. 21]
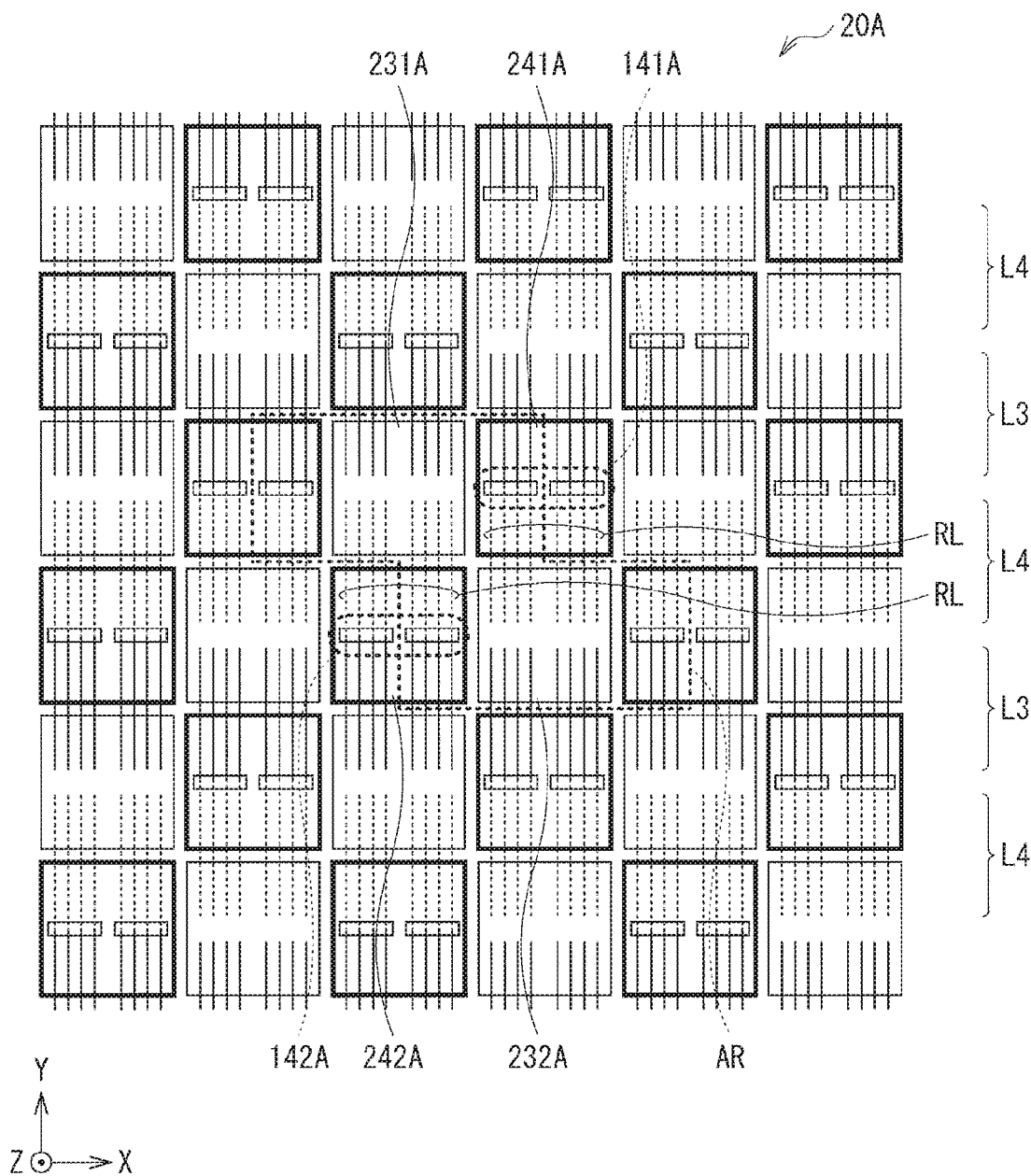

[ FIG. 22 ]
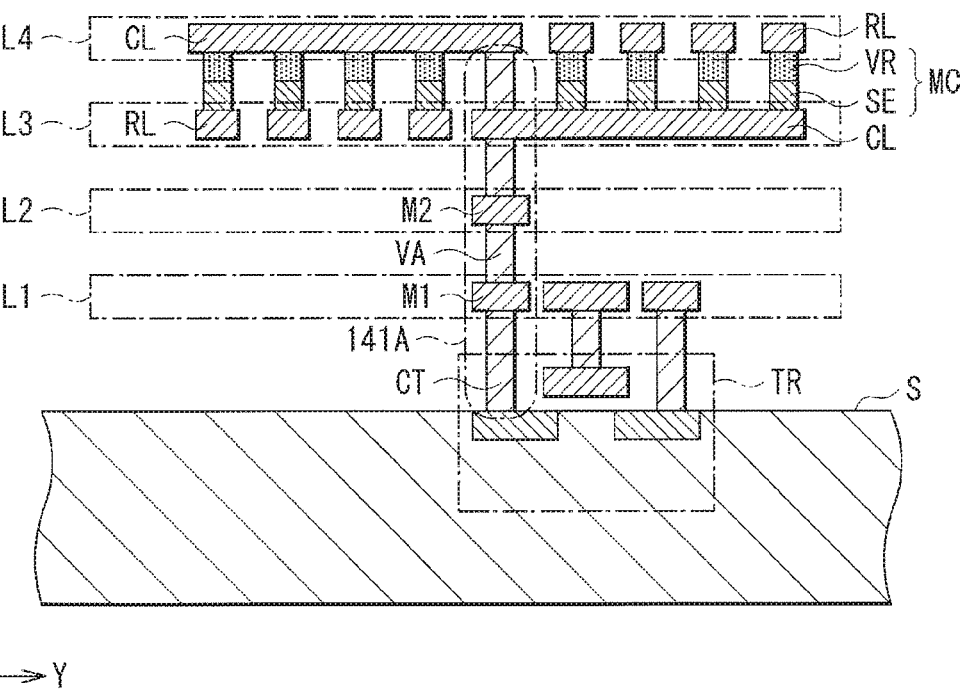
[ FIG. 23 ]
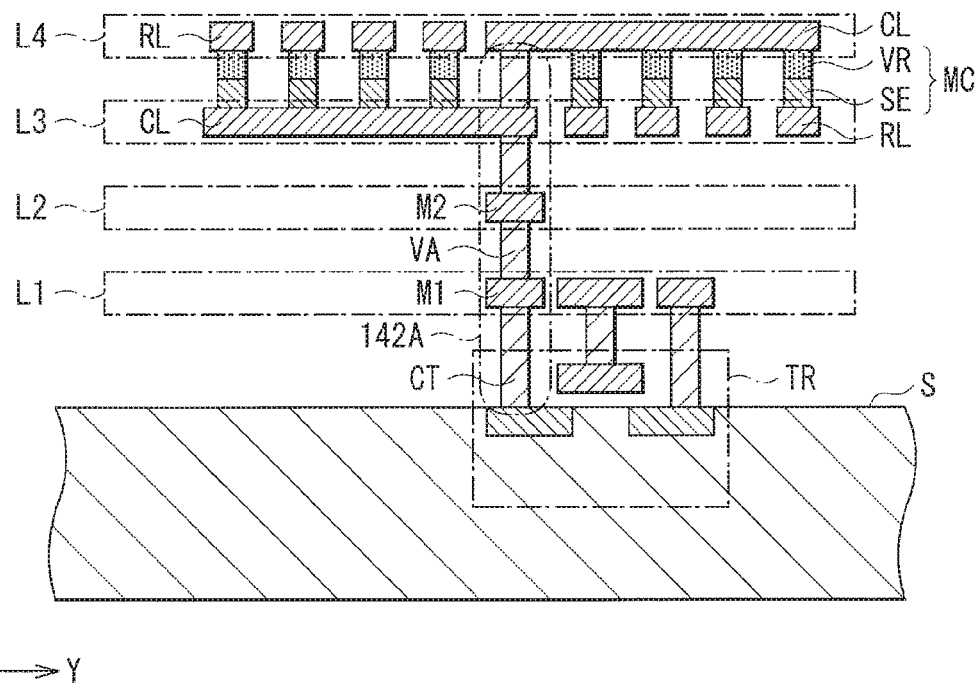

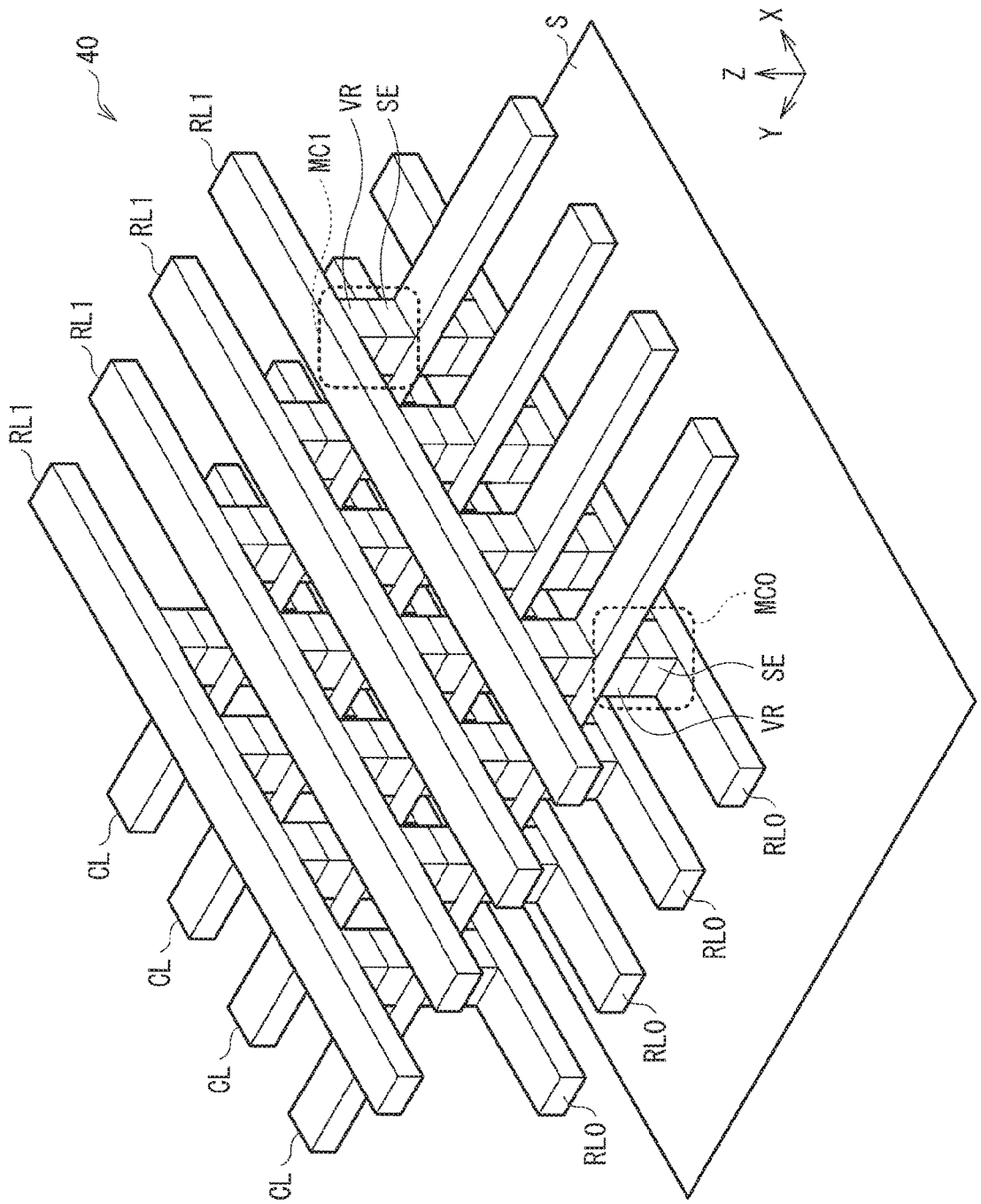
[ FIG. 24 ]

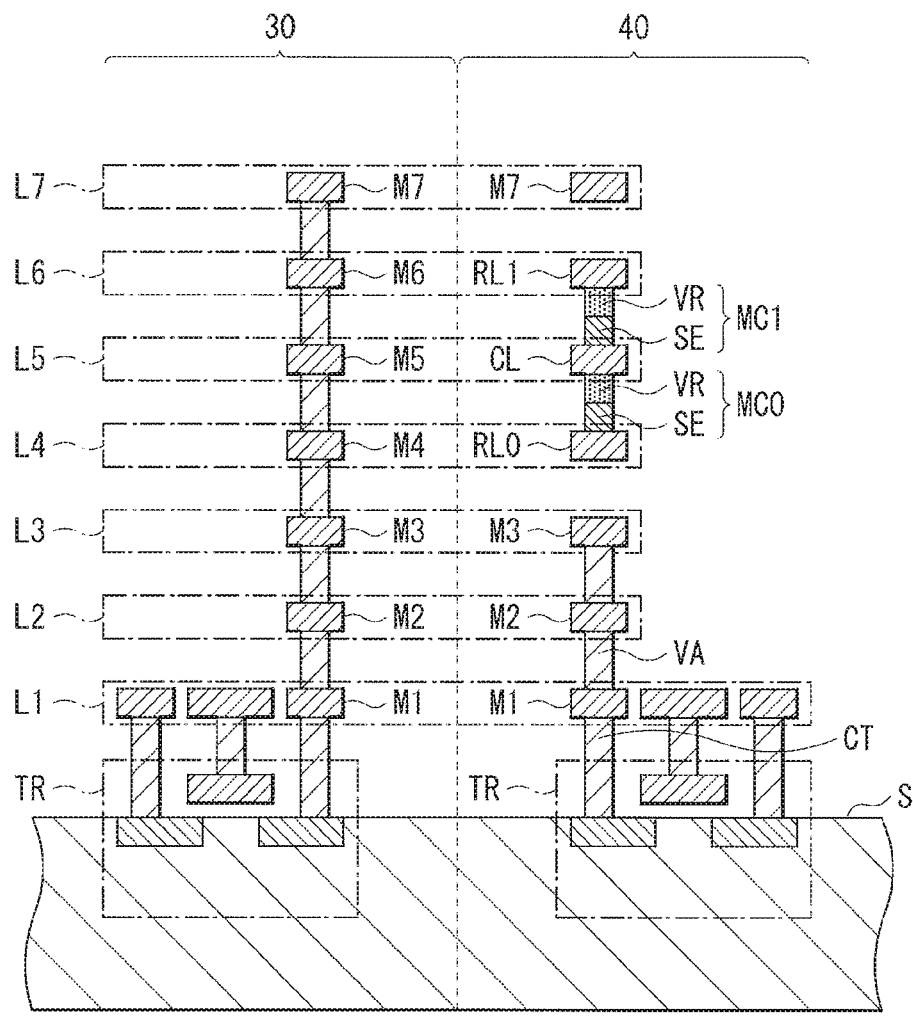
[FIG. 25]

[FIG. 26]
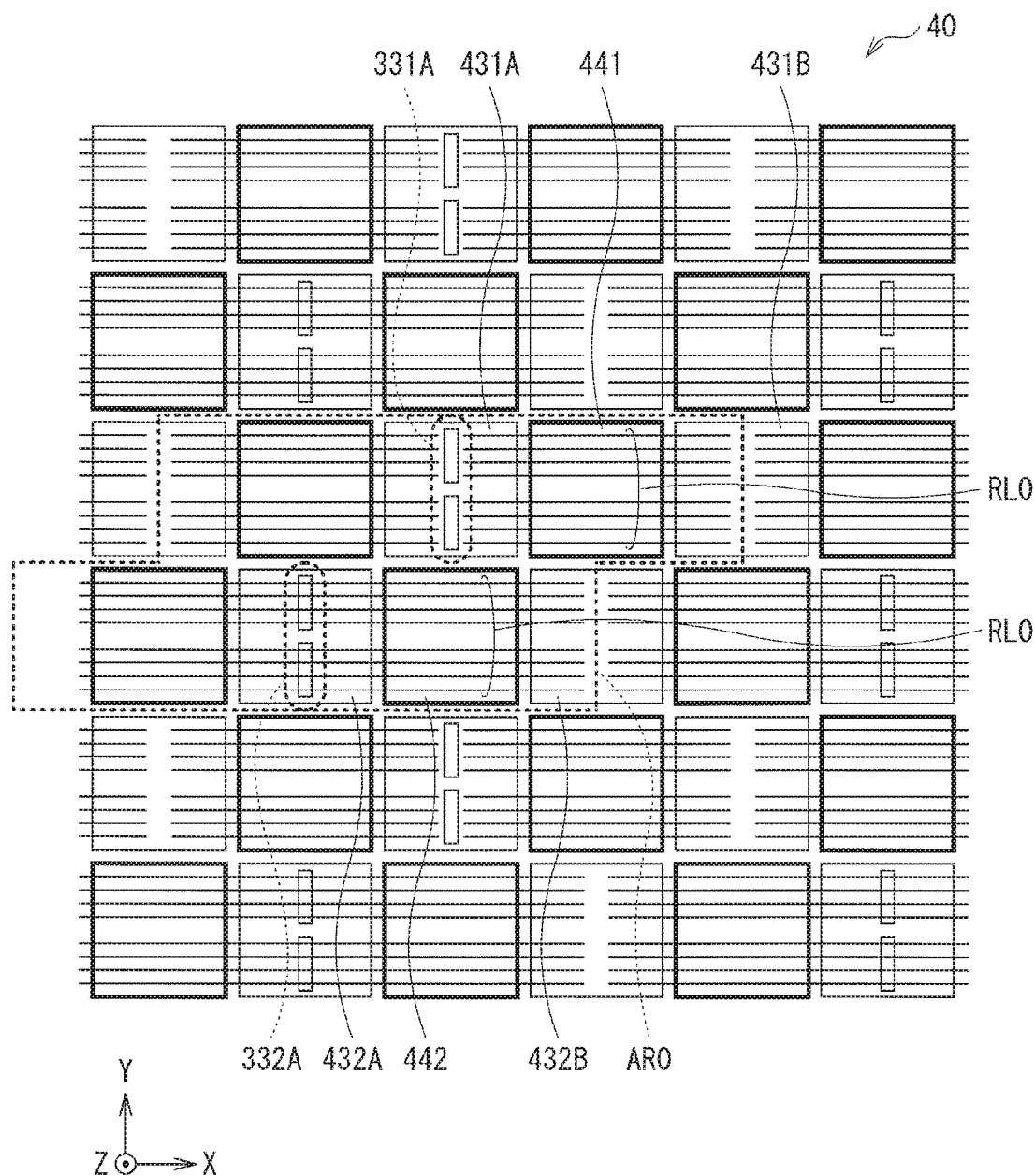

[FIG. 27]
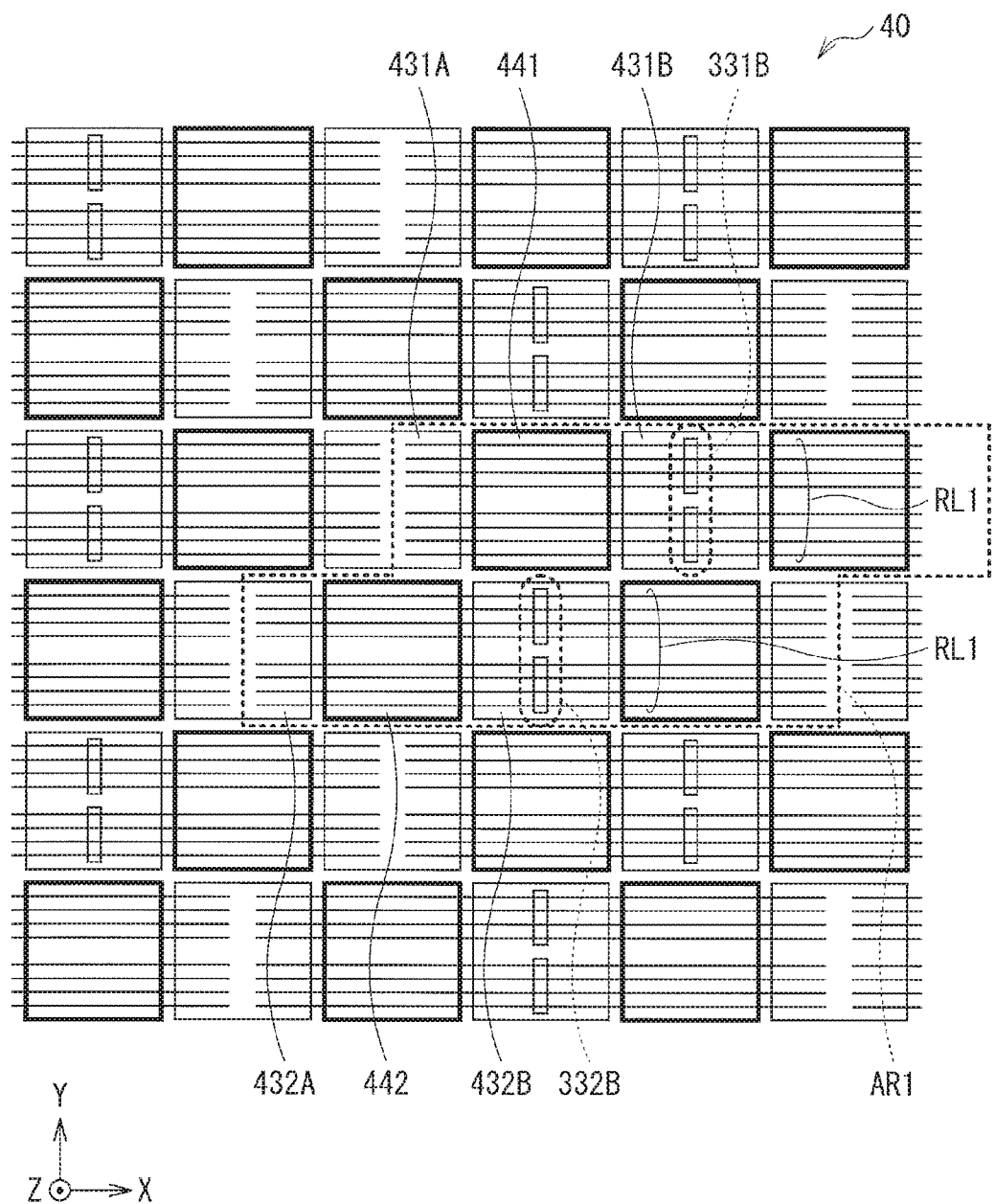

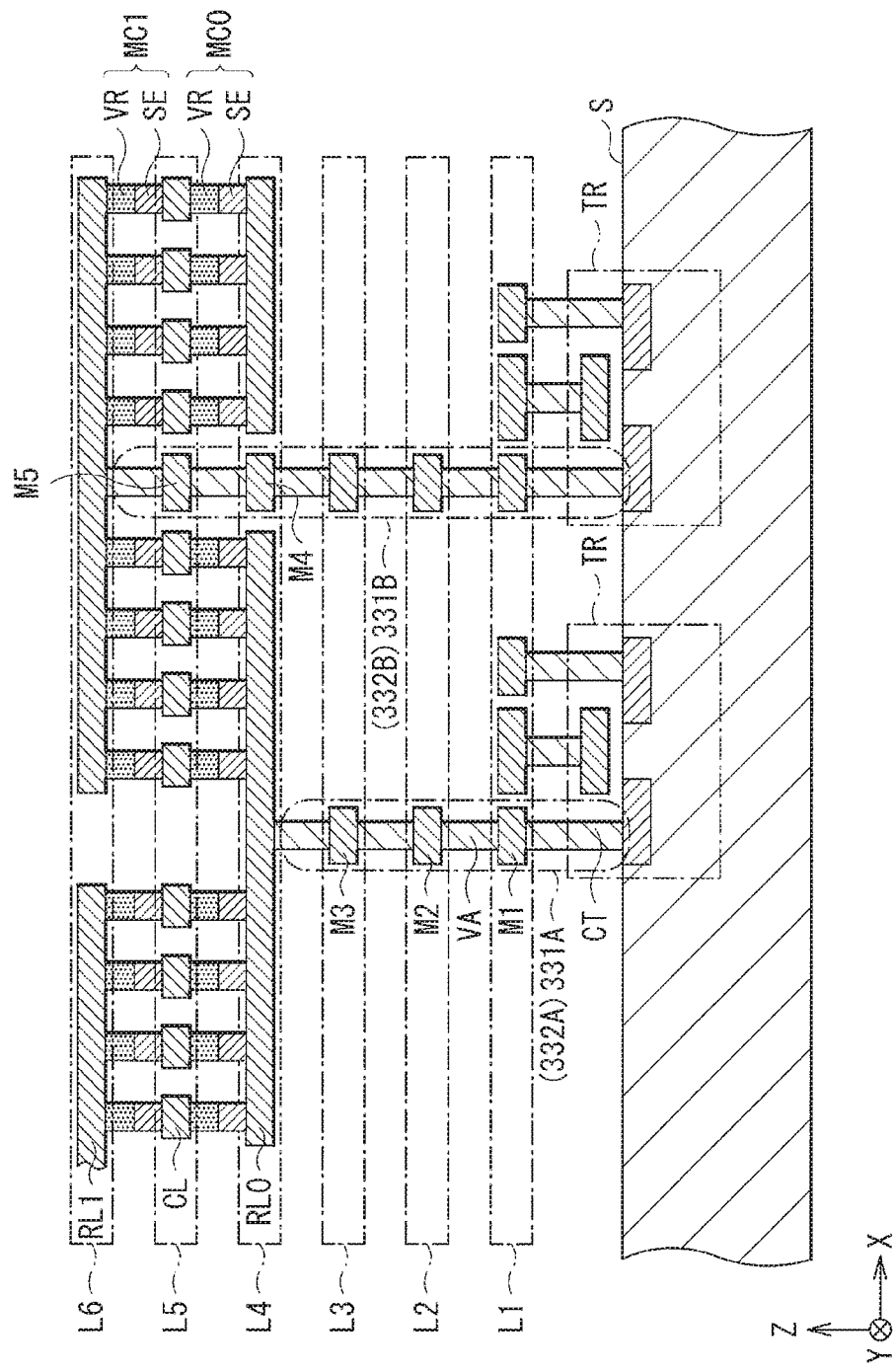
[ FIG. 28 ]

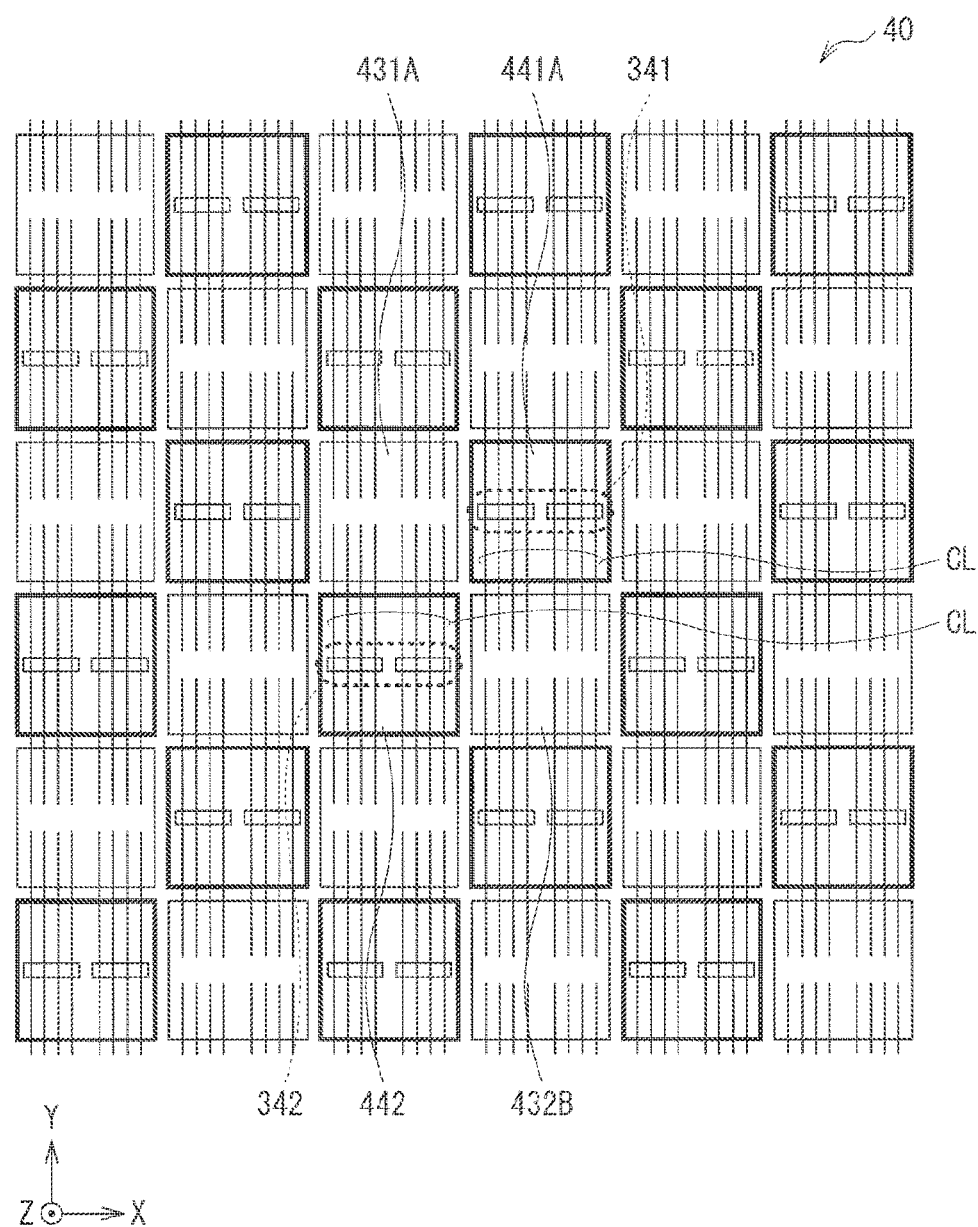
[FIG. 29]

[FIG. 30]
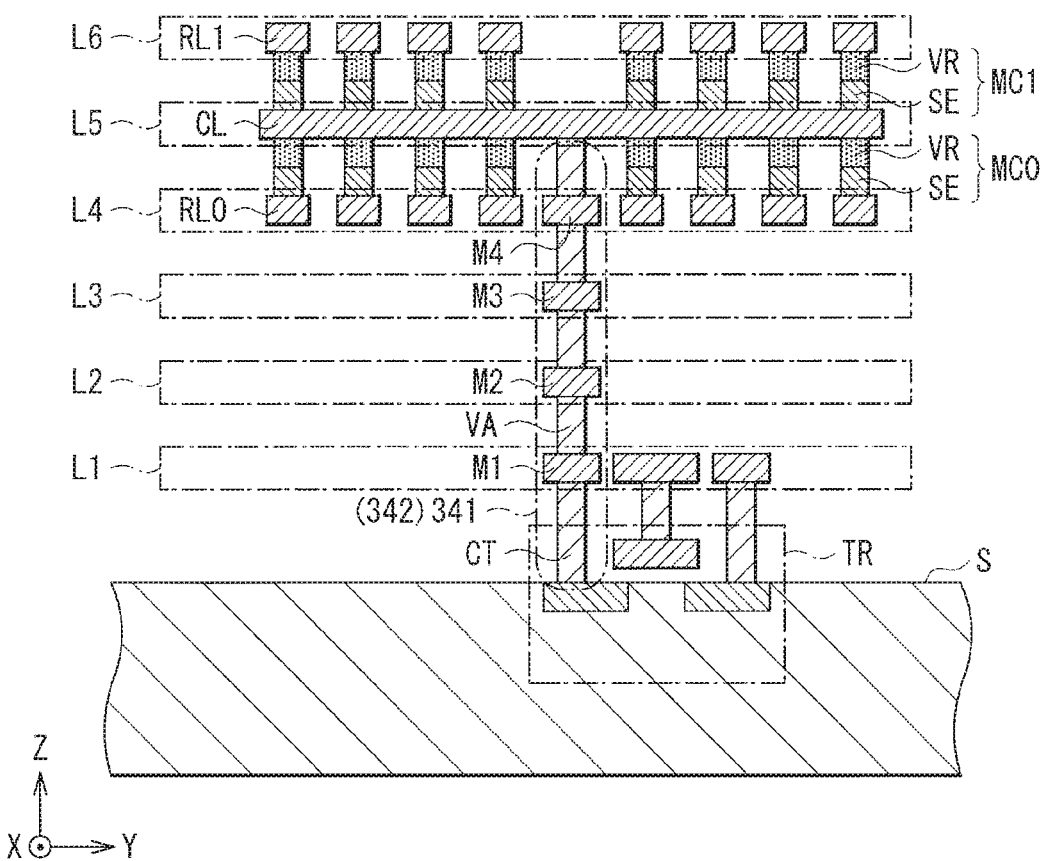

[FIG. 31]
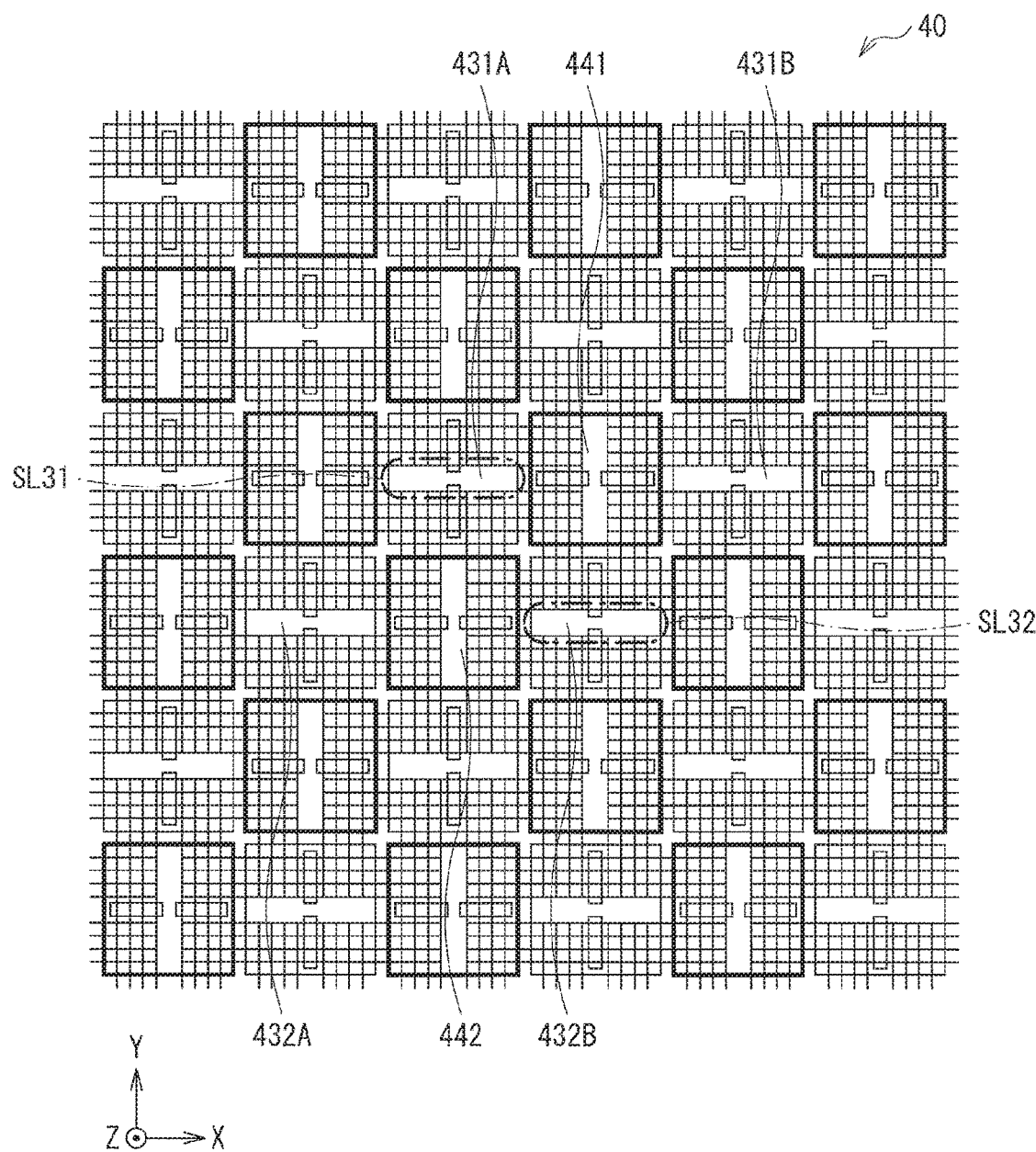

[FIG. 32]
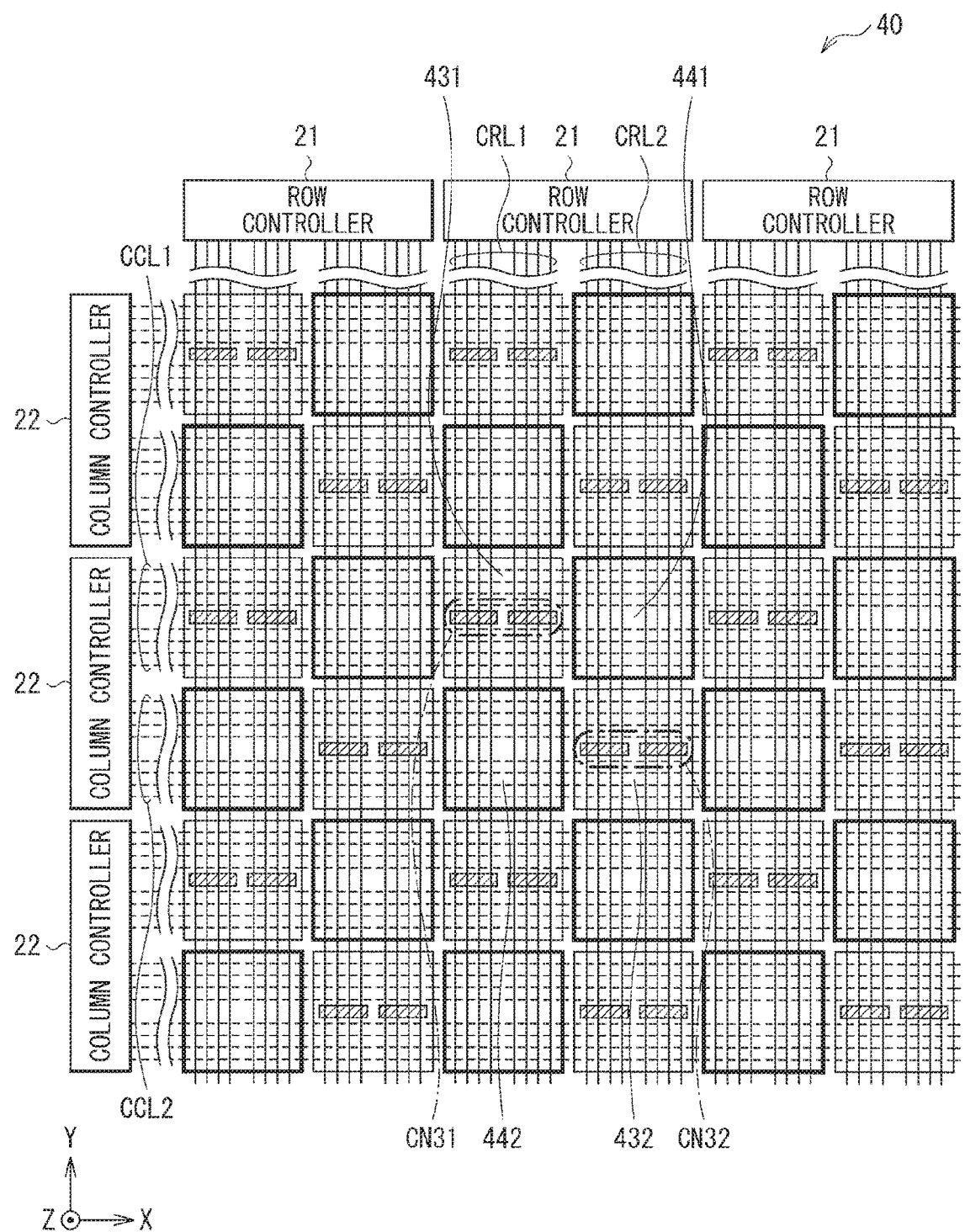

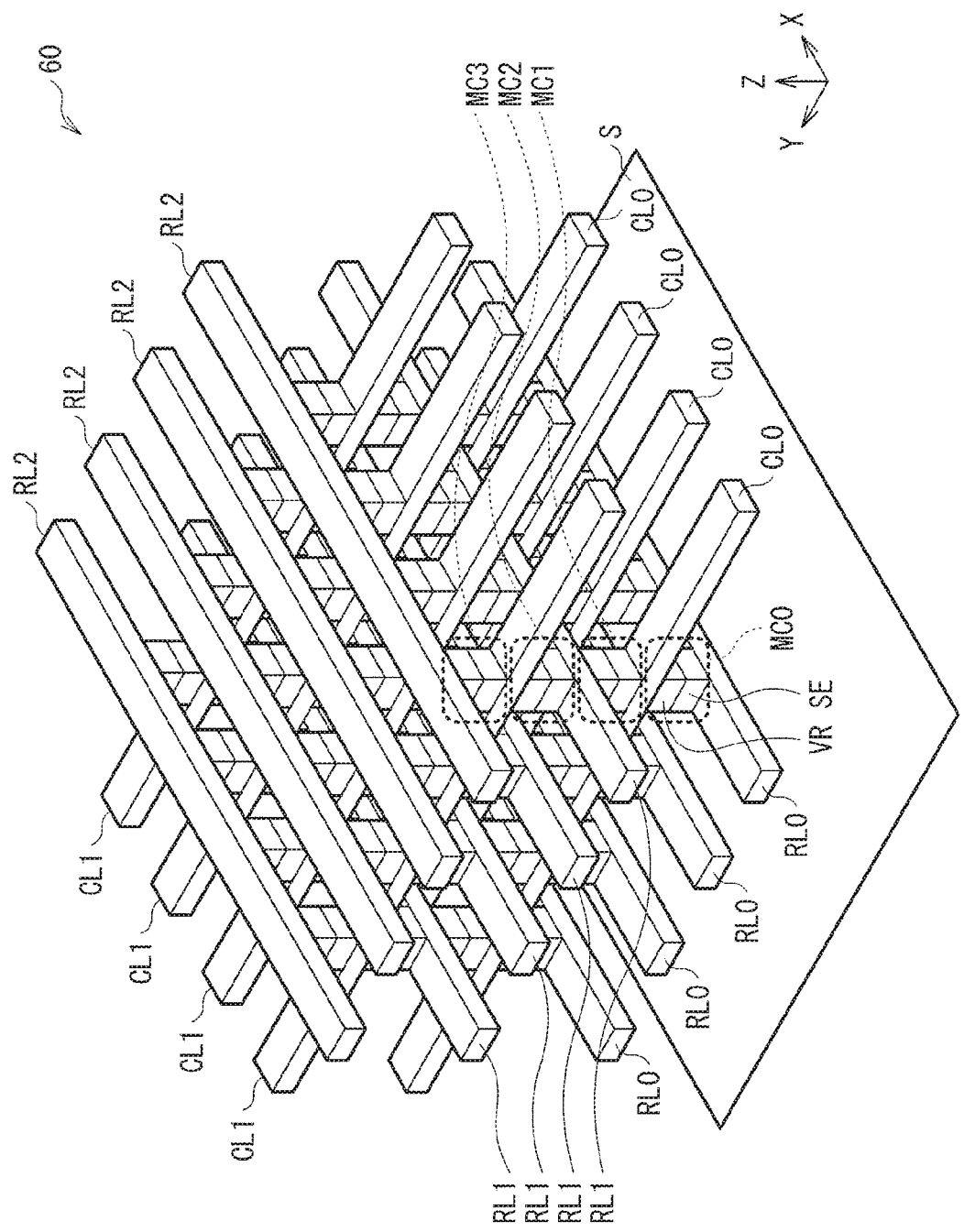
[FIG. 33]

[FIG. 34]
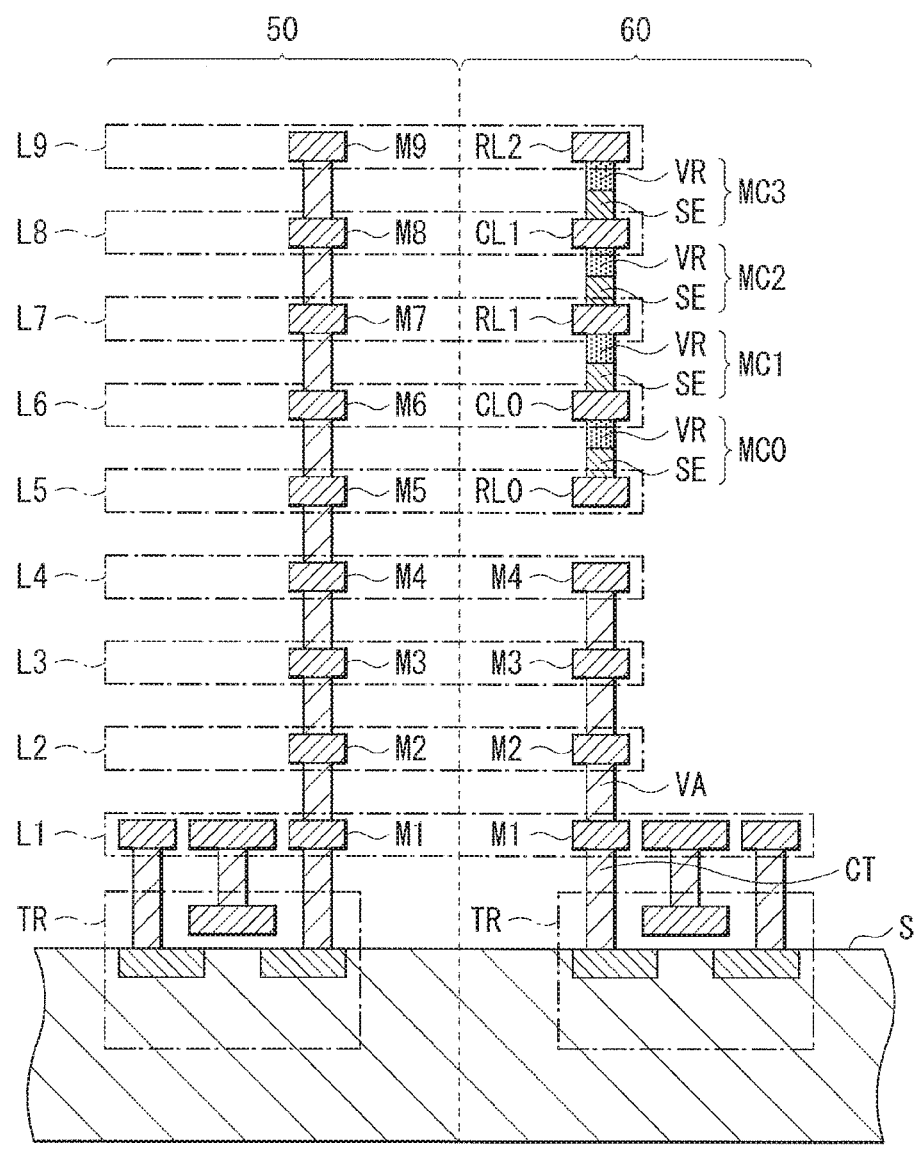

[FIG. 35]
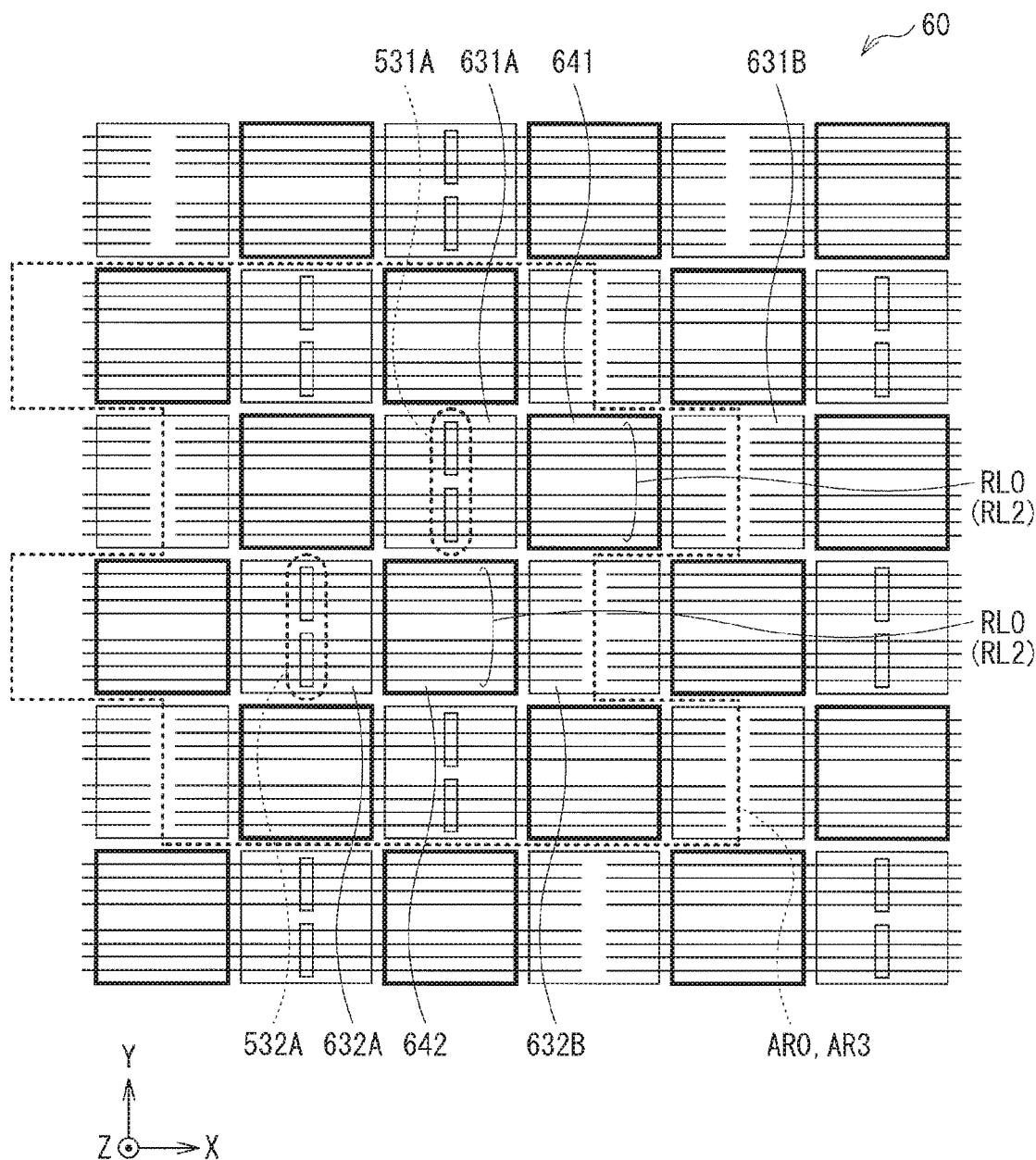

[ FIG. 36 ]
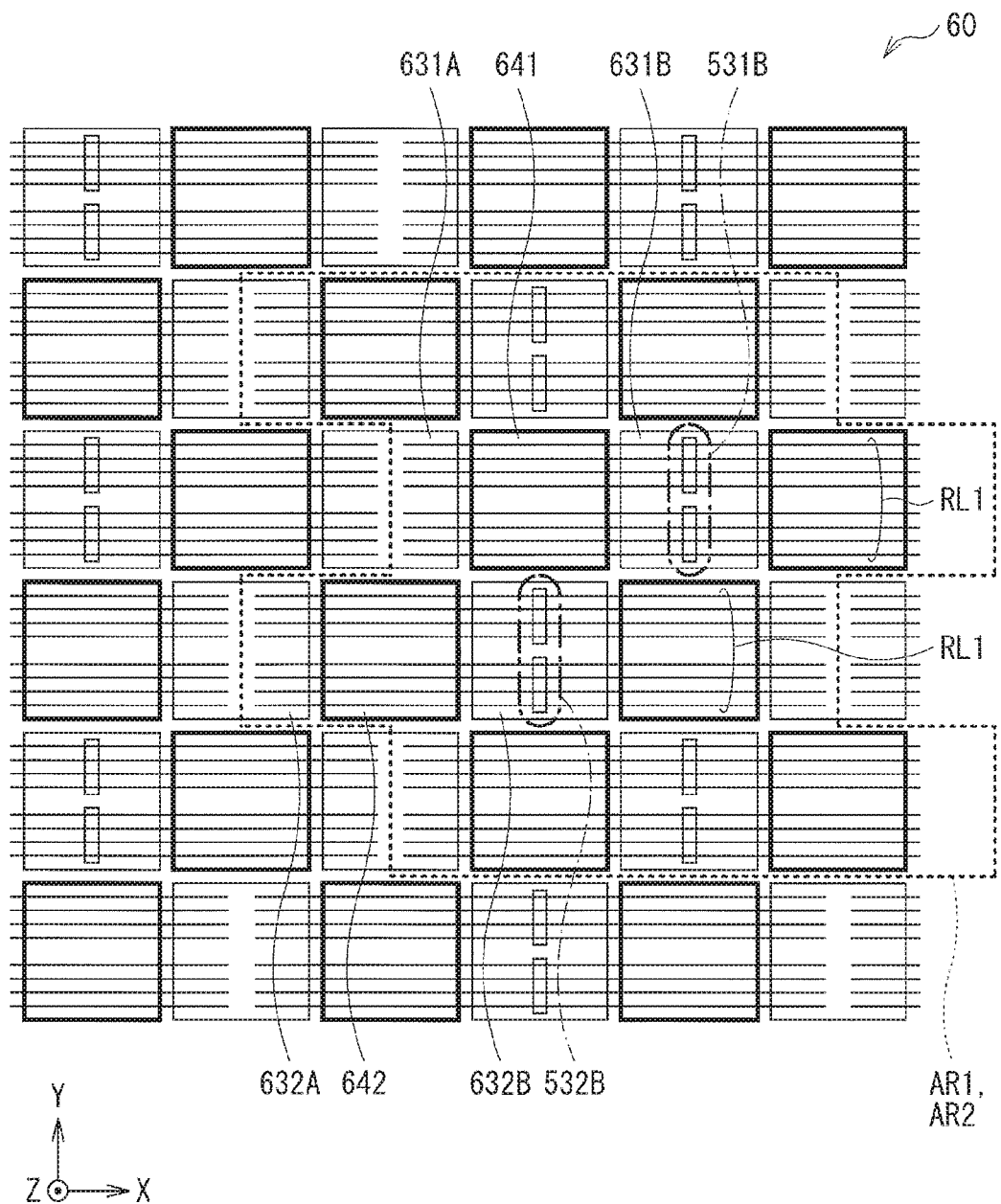

[ FIG. 37 ]
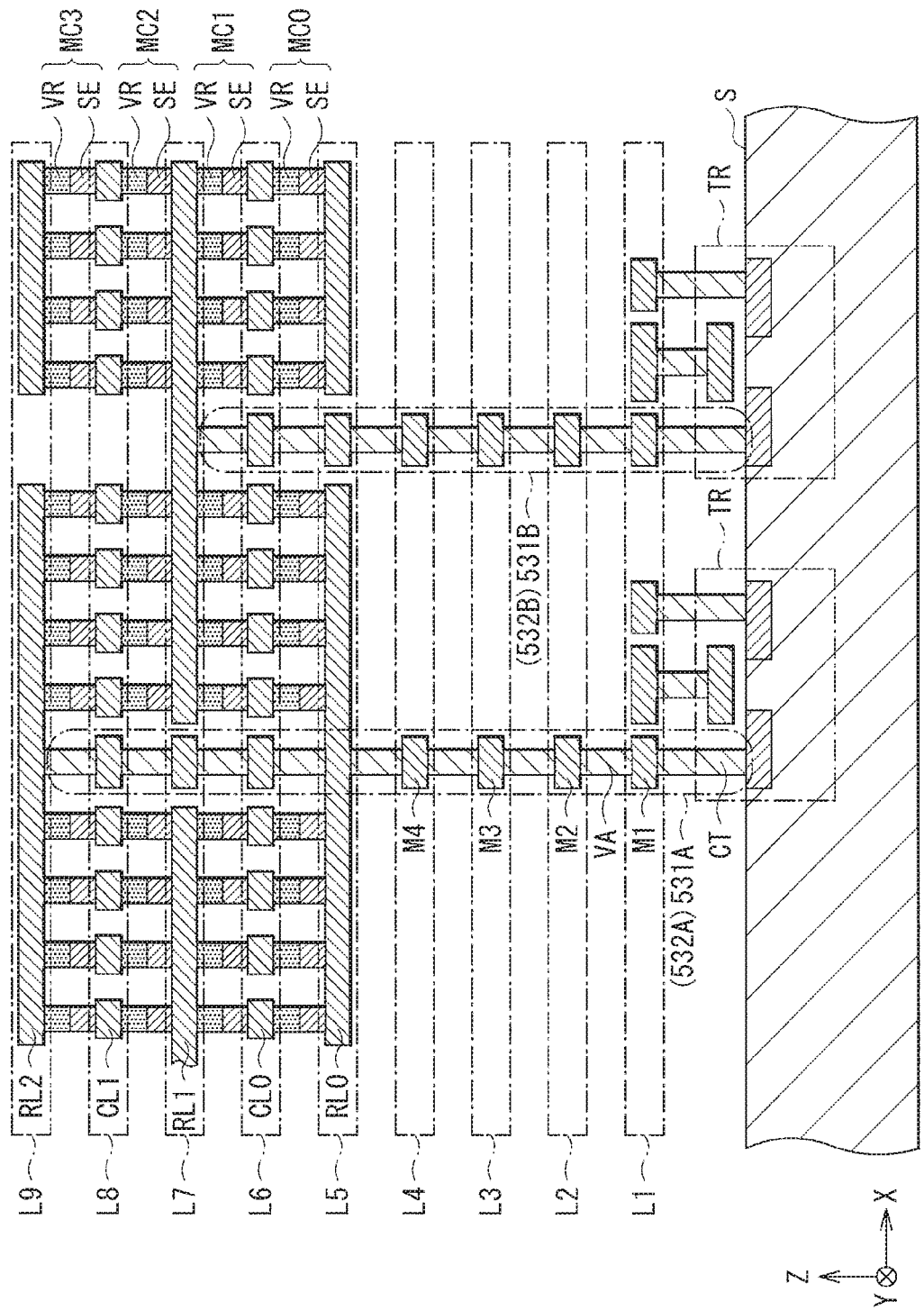

[FIG. 38]
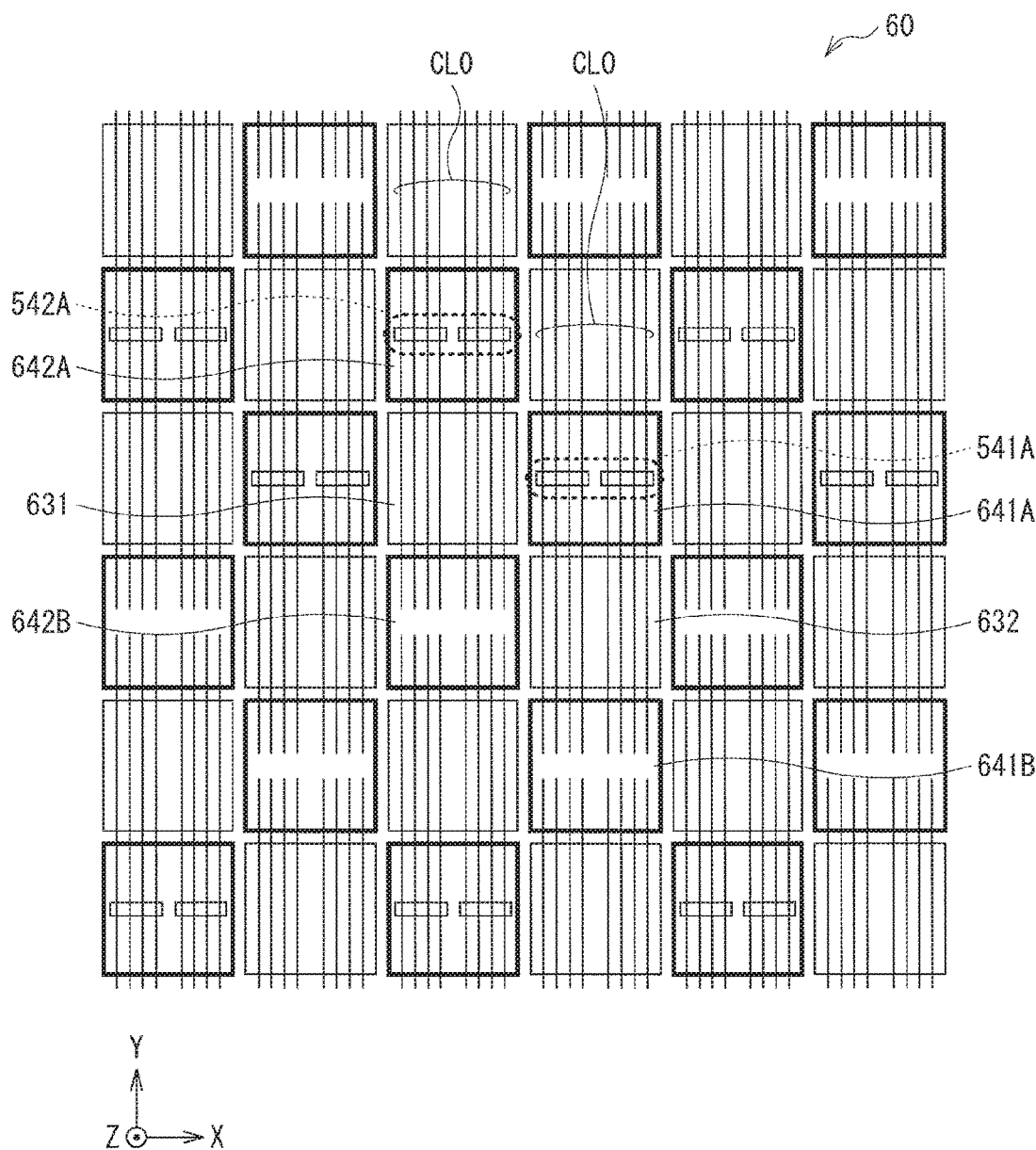

[FIG. 39]
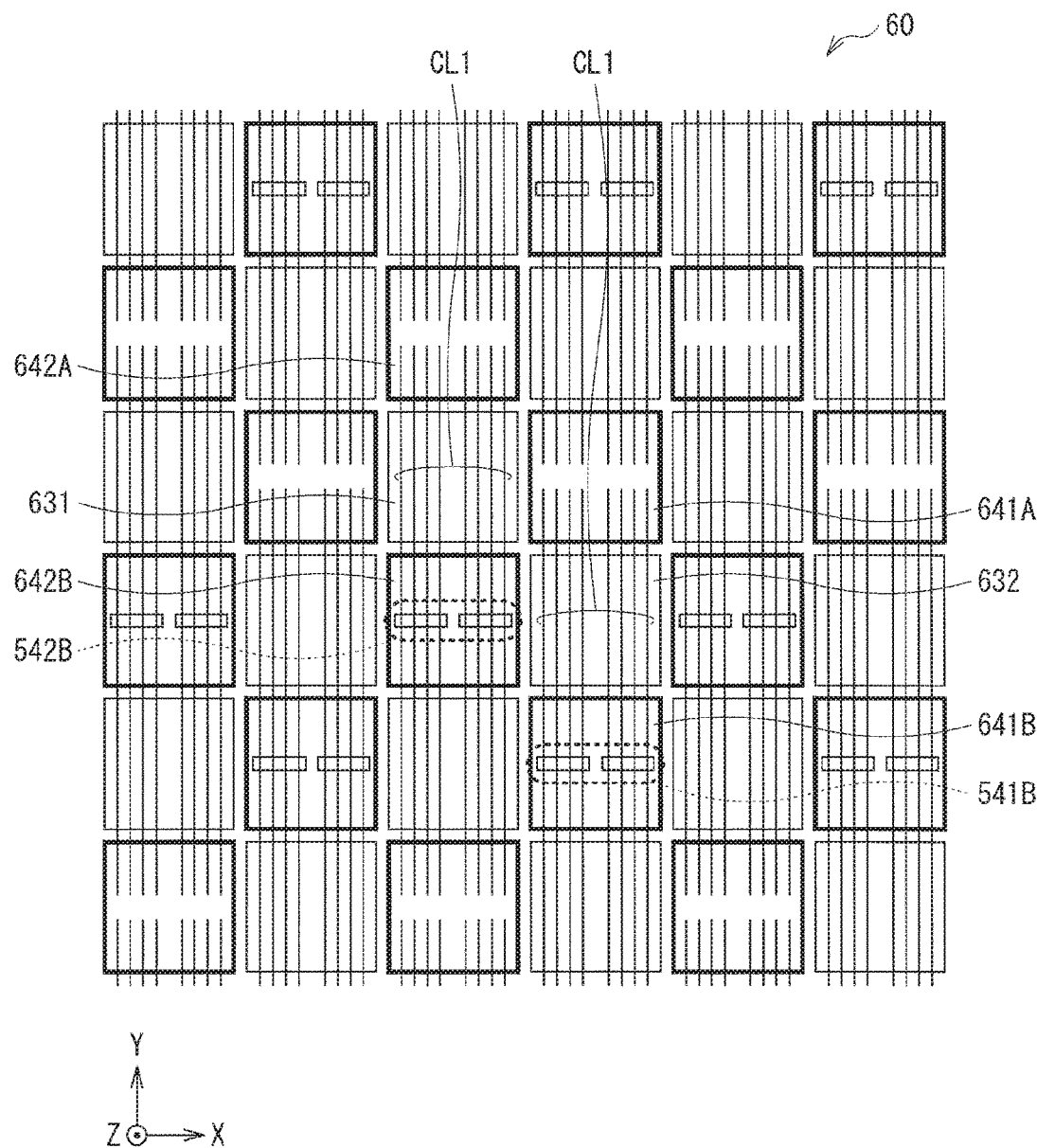

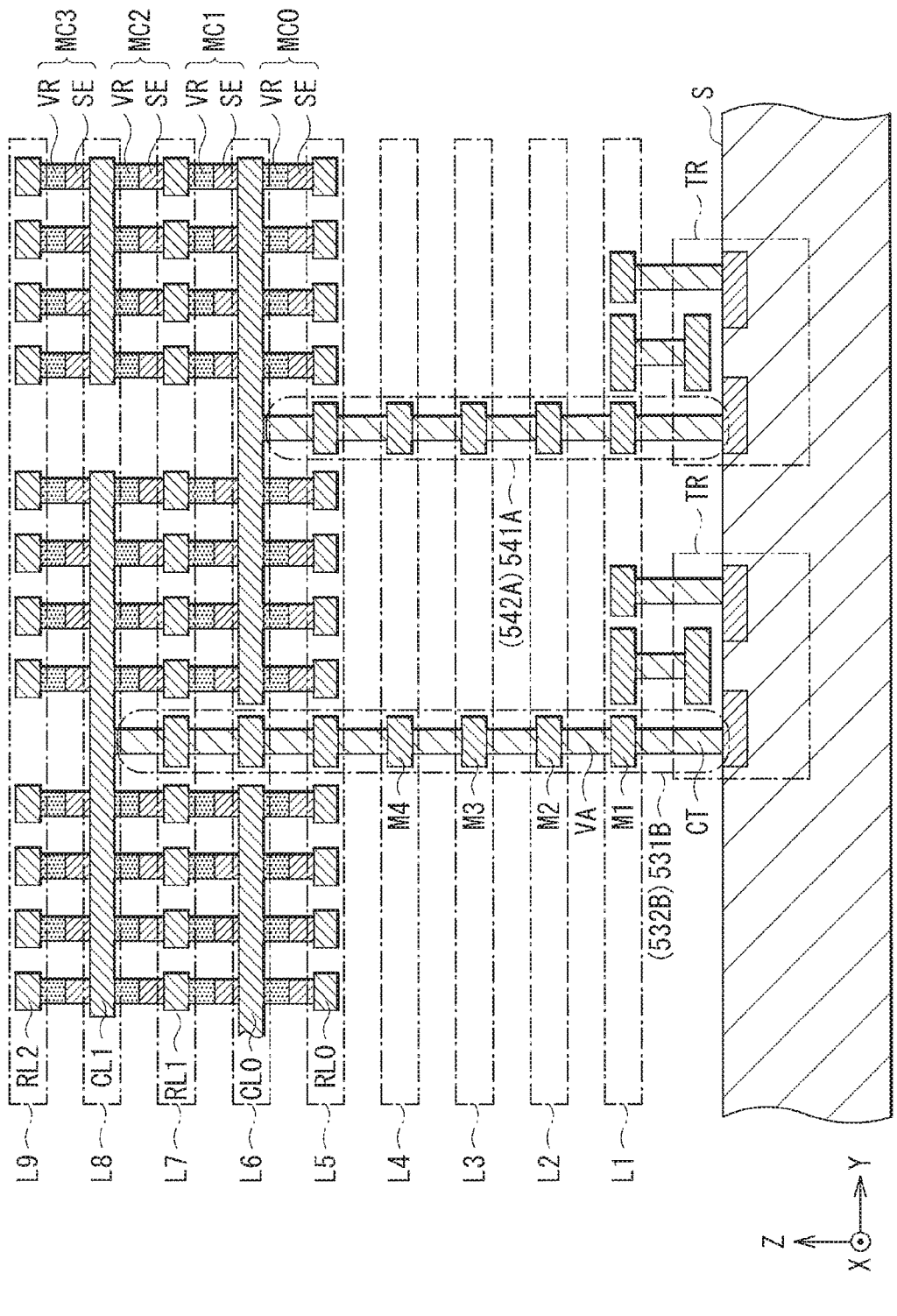
[FIG. 40]

[FIG. 41]
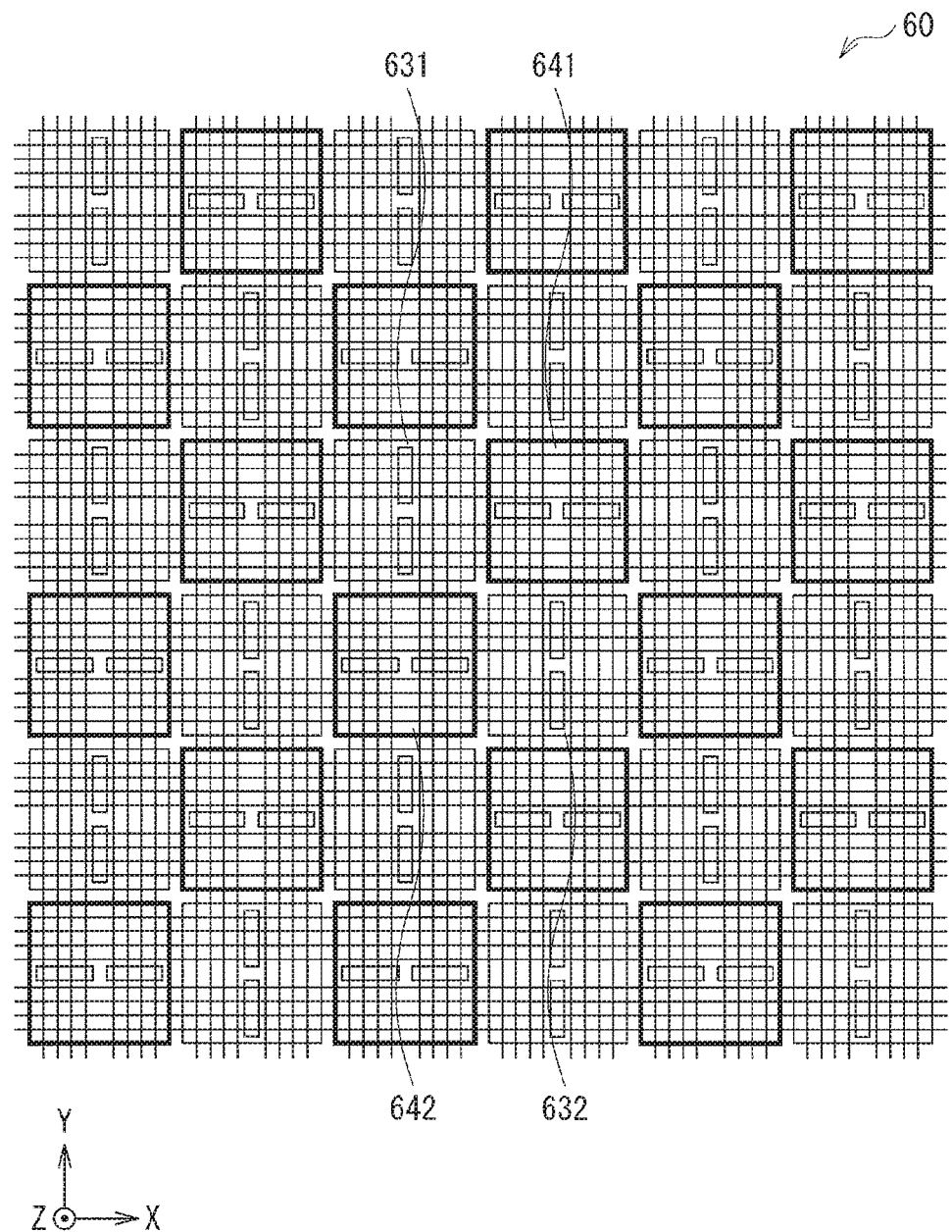

[FIG. 42]
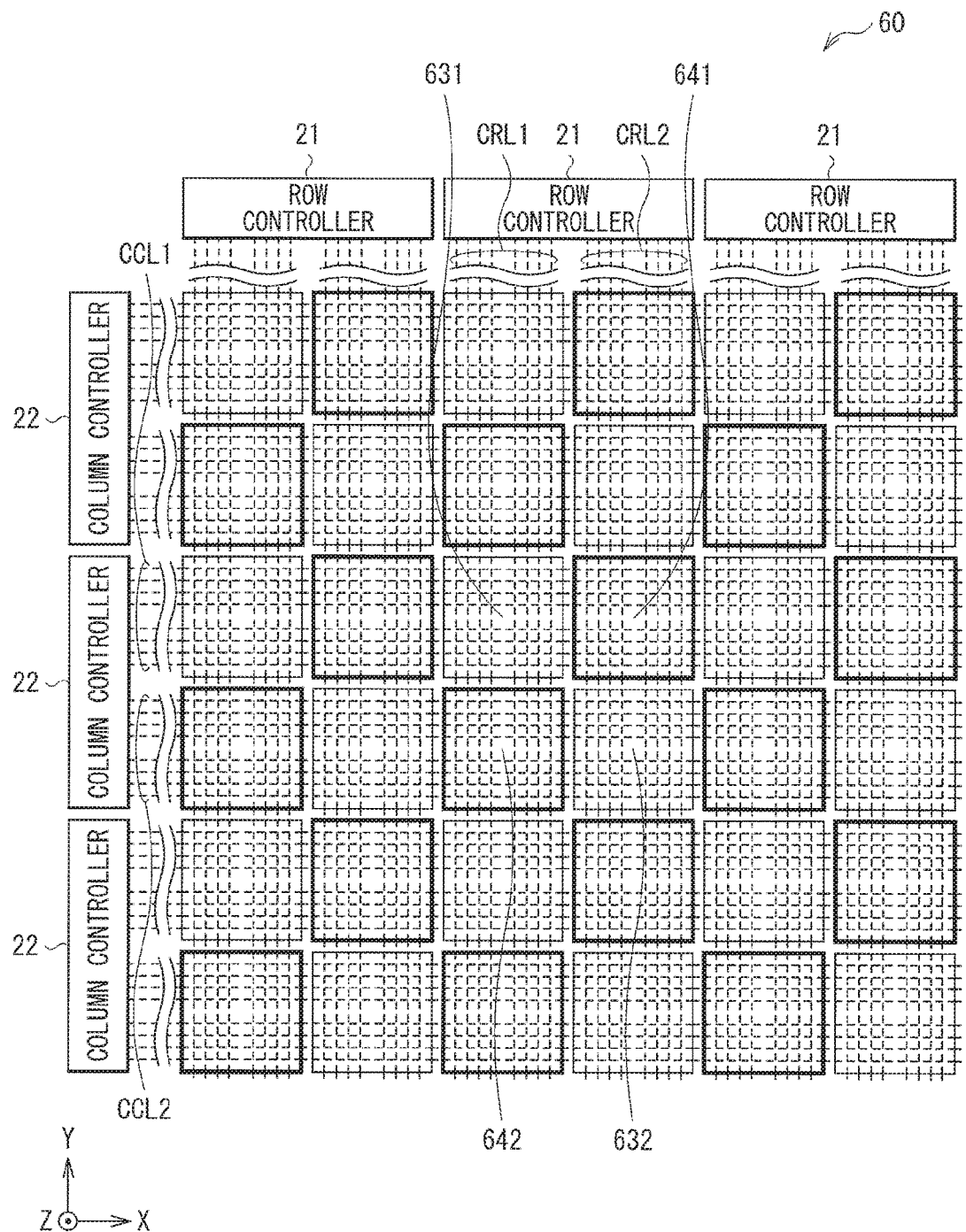

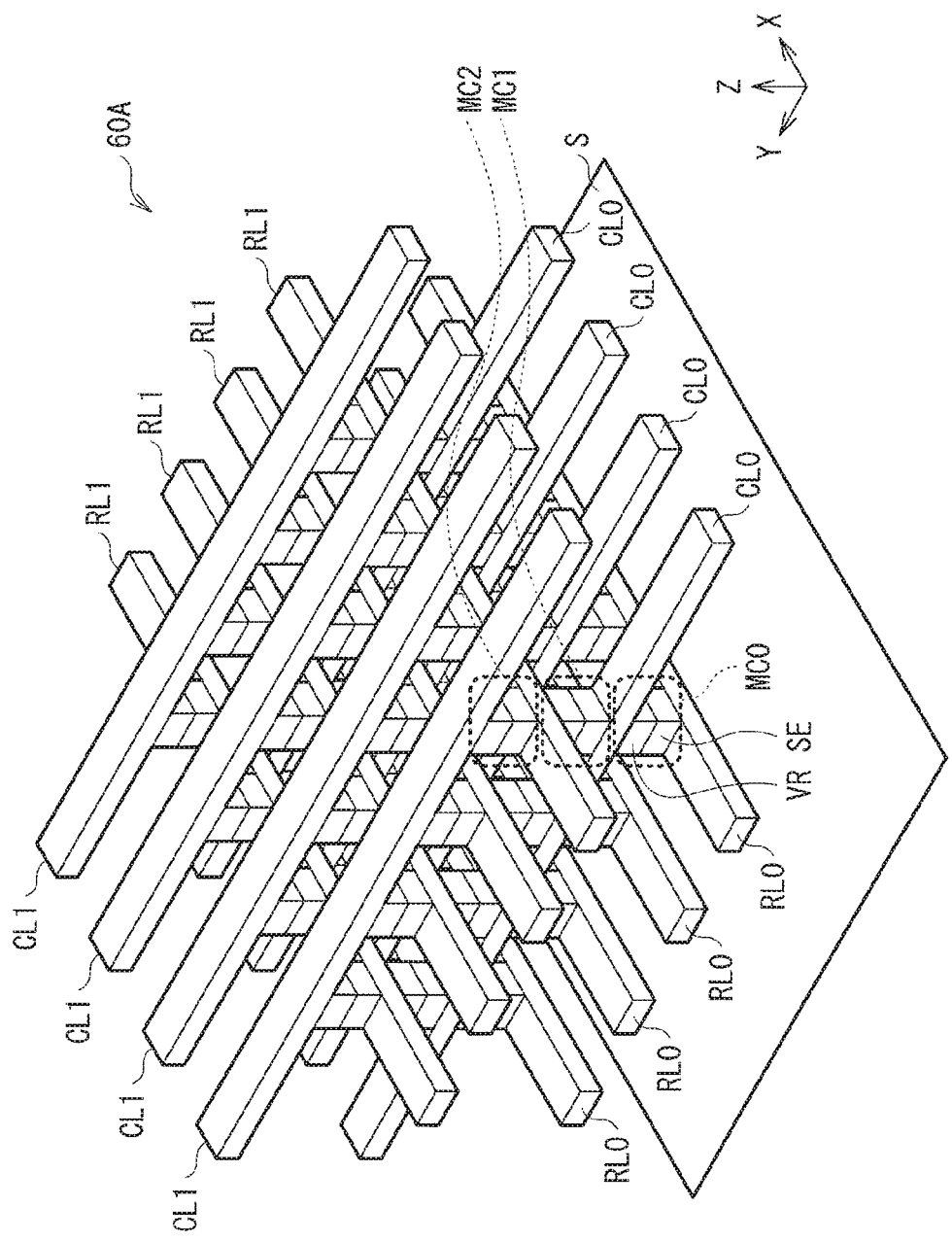
[ FIG. 43 ]

[FIG. 44]
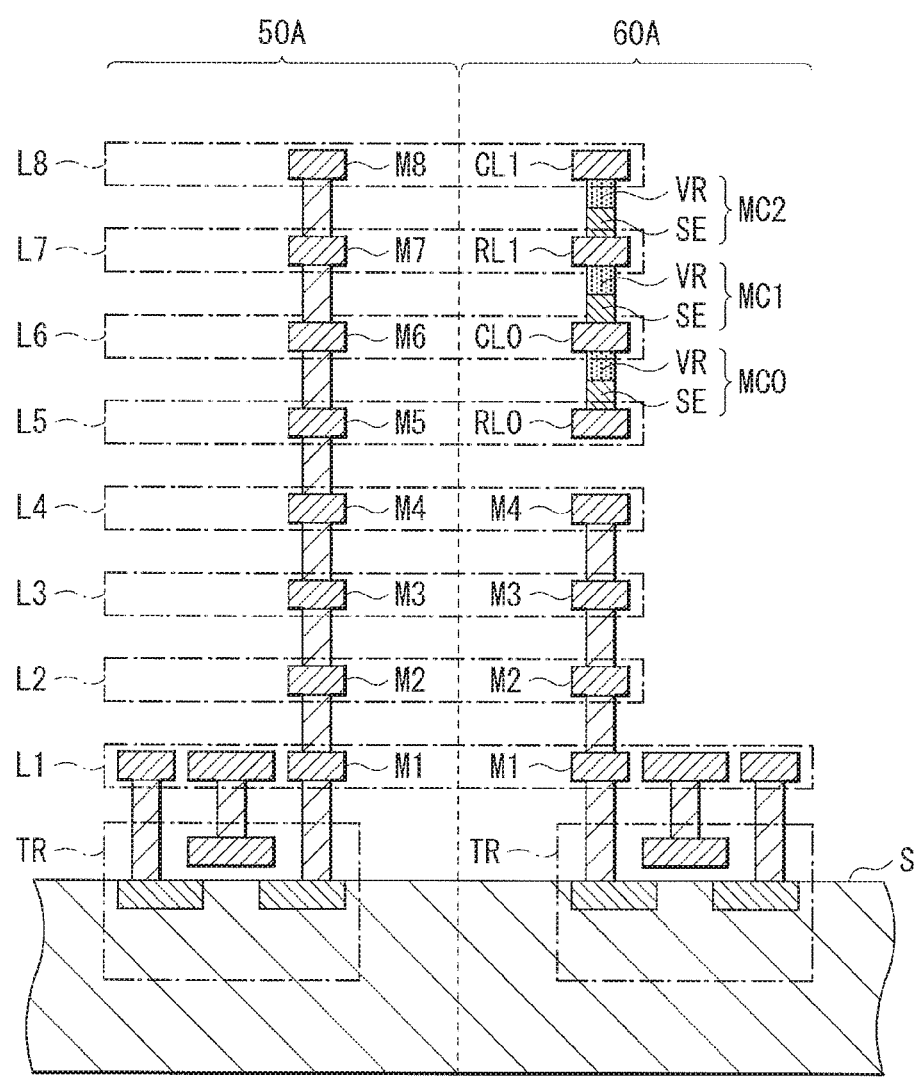

SEMICONDUCTOR DEVICE

CROSS REFERENCE TO RELATED APPLICATIONS

This application is a U.S. National Phase of International Patent Application No. PCT/JP2018/014585 filed on Apr. 5, 2018, which claims priority benefit of Japanese Patent Application No. JP 2017-104176 filed in the Japan Patent Office on May 26, 2017. Each of the above-referenced applications is hereby incorporated herein by reference in its entirety.

TECHNICAL FIELD

The present disclosure relates to a semiconductor device that is able to store information.

BACKGROUND ART

In recent years, attention has been paid to, for example, a nonvolatile memory device using a resistance change memory that is able to perform data access at a higher speed than a flash memory. For example, PTL 1 discloses a memory device in which a plurality of row electrodes coupled to row drivers different from one another are arranged side by side in one region, and a plurality of column electrodes coupled to column drivers different from one another are arranged side by side in one region.

CITATION LIST

Patent Literature

PTL 1: U.S. Patent Application Publication No. 2014/0104968

SUMMARY OF THE INVENTION

Incidentally, it is generally desired for a semiconductor device to have a simplified layout. By simplifying the layout in this manner, for example, the layout is expected to be facilitated, and, for example, a circuit operation is expected to be simplified.

It is desirable to provide a semiconductor device that makes it possible to simplify a layout.

A semiconductor device according to an embodiment of the present disclosure includes a plurality of first selection lines, a plurality of second selection lines, a plurality of third selection lines, a plurality of fourth selection lines, a first coupling part, a second coupling part, a third coupling part, a fourth coupling part, a driver, a first memory cell, a second memory cell, a third memory cell, and a fourth memory cell. The plurality of first selection lines is provided in the first region, extends in a first direction, and is aligned in a second direction that intersects the first direction. The plurality of second selection lines is provided in a second region having a portion that overlaps a portion of the first region, extends in the second direction, and is aligned in the first direction. The plurality of third selection lines is provided in a third region having a portion that overlaps a portion of the second region, extends in the first direction, and is aligned in the second direction. The plurality of fourth selection lines is provided in a fourth region having one portion that overlaps a portion of the first region and having another portion that overlaps a portion of the third region, extends in the second direction, and is aligned in the first direction. The first coupling part is coupled to the plurality of first selection lines at a portion, of the first region, other than ends in the first direction. The second coupling part is coupled to the plurality of second selection lines at a portion, of the second region, other than ends in the second direction. The third coupling part is coupled to the plurality of third selection lines at a portion, of the third region, other than ends in the first direction. The fourth coupling part is coupled to the plurality of fourth selection lines at a portion, of the fourth region, other than ends in the second direction. The driver drives the plurality of first selection lines, the plurality of second selection lines, the plurality of third selection lines, and the plurality of fourth selection lines, respectively, through the first coupling part, the second coupling part, the third coupling part, and the fourth coupling part. The first memory cell is interposed between one of the plurality of first selection lines and one of the plurality of fourth selection lines. The second memory cell is interposed between one of the plurality of second selection lines and one of the plurality of first selection lines. The third memory cell is interposed between one of the plurality of third selection lines and one of the plurality of second selection lines. The fourth memory cell is interposed between one of the plurality of fourth selection lines and one of the plurality of third selection lines.

In the semiconductor device according to an embodiment of the present disclosure, a plurality of first selection lines extends in a first direction and is aligned in a second direction that intersects the first direction, in a first region; a plurality of second selection lines extends in the second direction and is aligned in the first direction, in a second region having a portion that overlaps a portion of the first region; a plurality of third selection lines extends in the first direction and is aligned in the second direction, in a third region having a portion that overlaps a portion of the second region; and a plurality of fourth selection lines extends in the second direction and is aligned in the first direction, in a fourth region having one portion that overlaps a portion of the first region and having another portion that overlaps a portion of the third region. The plurality of first selection lines is coupled to the first coupling part at a portion, of the first region, other than ends in the first direction; the plurality of second selection lines is coupled to a second coupling part at a portion, of the second region, other than ends in the second direction; the plurality of third selection lines is coupled to a third coupling part at a portion, of the third region, other than ends in the first direction; and the plurality of fourth selection lines is coupled to a fourth coupling part at a portion, of the fourth region, other than ends in the second direction. The plurality of first selection lines, the plurality of second selection lines, the plurality of third selection lines, and the plurality of fourth selection lines are driven by a driver, respectively, through the first coupling part, the second coupling part, the third coupling part, and the fourth coupling part. A first memory cell is interposed between one of the plurality of first selection lines and one of the plurality of fourth selection lines; a second memory cell is interposed between one of the plurality of second selection lines and one of the plurality of first selection lines; a third memory cell is interposed between one of the plurality of third selection lines and one of the plurality of second selection lines; and a fourth memory cell is interposed between one of the plurality of fourth selection lines and one of the plurality of third selection lines.

According to the semiconductor device in an embodiment of the present disclosure, the plurality of first selection lines extending in the first direction and aligned in the second direction is provided in the first region, and the plurality of first selection lines is coupled to the first coupling part at a portion, of the first region, other than ends in the first direction; the plurality of second selection lines extending in the second direction and aligned in the first direction is provided in the second region, and the plurality of second selection lines is coupled to the second coupling part at a portion, of the second region, other than ends in the second direction; the plurality of third selection lines extending in the first direction and aligned in the second direction is provided in the third region, and the plurality of third selection lines is coupled to the third coupling part at a portion, of the third region, other than ends in the first direction; and the plurality of fourth selection lines extending in the second direction and aligned in the first direction is provided in the fourth region, and the plurality of fourth selection lines is coupled to the fourth coupling part at a portion, of the fourth region, other than ends in the second direction. This makes it possible to simplify the layout. It is to be noted that the effects described herein are not necessarily limitative, and any of the effects described in the present disclosure may be provided.

BRIEF DESCRIPTION OF DRAWINGS

FIG. 1 is a block diagram illustrating a configuration example of a semiconductor device according to an embodiment of the present disclosure.

FIG. 2 is a block diagram illustrating a configuration example of a memory section illustrated in FIG. 1.

FIG. 3 is a perspective view of a configuration example of row selection lines and column selection lines according to a first embodiment.

FIG. 4 is a circuit diagram illustrating a configuration example of a memory cell illustrated in FIG. 3.

FIG. 5 is a characteristic diagram illustrating an example of characteristics of a storage element illustrated in FIG. 3.

FIG. 6 is an explanatory diagram illustrating an example of a layer configuration of a semiconductor device according to the first embodiment.

FIG. 7 is an explanatory diagram illustrating a configuration example of the row selection lines according to the first embodiment.

FIG. 8 is another explanatory diagram illustrating a configuration example of the row selection lines according to the first embodiment.

FIG. 9 is an explanatory diagram illustrating a configuration example of the column selection lines according to the first embodiment.

FIG. 10 is another explanatory diagram illustrating a configuration example of the column selection lines according to the first embodiment.

FIG. 11 is an explanatory diagram illustrating a configuration example of the row selection lines and the column selection lines according to the first embodiment.

FIG. 12 is an explanatory diagram illustrating a configuration example of the row control lines and the column control lines in a memory section according to the first embodiment.

FIG. 13 is an explanatory diagram illustrating a configuration example of row selection lines according to a comparative example.

FIG. 14 is an explanatory diagram illustrating a configuration example of column selection lines according to the comparative example.

FIG. 15A is an explanatory diagram illustrating a configuration example of the memory section according to an embodiment.

FIG. 15B is another explanatory diagram illustrating a configuration example of the memory section according to an embodiment.

FIG. 15C is another explanatory diagram illustrating a configuration example of the memory section according to an embodiment.

FIG. 16 is an explanatory diagram illustrating a configuration example of row selection lines according to another comparative example.

FIG. 17 is an explanatory diagram illustrating a configuration example of column selection lines according to the other comparative example.

FIG. 18 is an explanatory diagram illustrating a configuration example of the row selection lines and the column selection lines according to the other comparative example.

FIG. 19 is an explanatory diagram illustrating an example of a layer configuration of a semiconductor device according to a modification example of the first embodiment.

FIG. 20 is an explanatory diagram illustrating a configuration example of row selection lines according to the modification example of the first embodiment.

FIG. 21 is an explanatory diagram illustrating a configuration example of column selection lines according to the modification example of the first embodiment.

FIG. 22 is another explanatory diagram illustrating a configuration example of the column selection lines according to the modification example of the first embodiment.

FIG. 23 is another explanatory diagram illustrating a configuration example of the column selection lines according to the modification example of the first embodiment.

FIG. 24 is a perspective view of a configuration example of row selection lines and column selection lines according to a second embodiment.

FIG. 25 is an explanatory diagram illustrating an example of a layer configuration of a semiconductor device according to the second embodiment.

FIG. 26 is an explanatory diagram illustrating a configuration example of the row selection lines according to the second embodiment.

FIG. 27 is another explanatory diagram illustrating a configuration example of the row selection lines according to the second embodiment.

FIG. 28 is another explanatory diagram illustrating a configuration example of the row selection lines according to the second embodiment.

FIG. 29 is an explanatory diagram illustrating a configuration example of the column selection lines according to the second embodiment.

FIG. 30 is another explanatory diagram illustrating a configuration example of the column selection lines according to the second embodiment.

FIG. 31 is an explanatory diagram illustrating a configuration example of the row selection lines and the column selection lines according to the second embodiment.

FIG. 32 is an explanatory diagram illustrating a configuration example of the row control lines and the column control lines in a memory section according to the second embodiment.

FIG. 33 is a perspective view of a configuration example of row selection lines and column selection lines according to a third embodiment.

FIG. 34 is an explanatory diagram illustrating an example of a layer configuration of a semiconductor device according to the third embodiment.

FIG. 35 is an explanatory diagram illustrating a configuration example of the row selection lines according to the third embodiment.

FIG. 36 is another explanatory diagram illustrating a configuration example of the row selection lines according to the third embodiment.

FIG. 37 is another explanatory diagram illustrating a configuration example of the row selection lines according to the third embodiment.

FIG. 38 is an explanatory diagram illustrating a configuration example of the column selection lines according to the third embodiment.

FIG. 39 is another explanatory diagram illustrating a configuration example of the column selection lines according to the third embodiment.

FIG. 40 is another explanatory diagram illustrating a configuration example of the column selection lines according to the third embodiment.

FIG. 41 is an explanatory diagram illustrating a configuration example of the row selection lines and the column selection lines according to the third embodiment.

FIG. 42 is an explanatory diagram illustrating a configuration example of the row control lines and the column control lines in a memory section according to the third embodiment.

FIG. 43 is a perspective view of a configuration example of row selection lines and column selection lines according to a modification example of the third embodiment.

FIG. 44 is an explanatory diagram illustrating an example of a layer configuration of a semiconductor device according to the modification example of the third embodiment.

MODES FOR CARRYING OUT THE INVENTION

Hereinafter, description is given in detail of embodiments of the present disclosure with reference to the drawings. It is to be note that the description is given in the following order.
1. First embodiment (An example in which one storage layer is included)
2. Second embodiment (An example in which two storage layers are included)
3. Third Embodiment (An example in which three or more storage layers are included)

1. First Embodiment

Configuration Example

FIG. 1 illustrates a configuration example of a semiconductor device (semiconductor device 1) according to a first embodiment. The semiconductor device 1 includes a logic circuit section 10, a memory section 20, and a peripheral circuit section 90. The logic circuit section 10 includes a logic circuit. It is to be noted that this is not limitative; the logic circuit section 10 may include, for example, a static random access memory (SRAM) circuit. The memory section 20 is a so-called cross-point memory, and is a nonvolatile memory. The memory section 20 stores, for example, information to be handled by the logic circuit section 10. The peripheral circuit section 90 includes various circuits related to an operation of the memory section 20. Specifically, the peripheral circuit section 90 includes, for example, a power supply circuit that generates a selection voltage Vsel and a non-selection voltage Vinh, which are described later, and a reference voltage generation circuit that generates a reference voltage Vref to be used when performing a reading operation. It is to be noted that this is not limitative; the peripheral circuit section 90 may further include, for example, an oscillation circuit and a delay circuit that define an operation speed and an operation timing of the memory section 20. In addition, the peripheral circuit section 90 may include, for example, a temperature sensor that measures a temperature in the memory section 20, and an AD converter that converts voltages (analog values) of various nodes in the memory section 20 into digital codes. In this case, the logic circuit section 10 may perform various types of processing on the basis of the temperature and the digital code. In the semiconductor device 1, a logic circuit and a nonvolatile memory are mounted together (embedded) in this manner.

(Memory Section 20)

FIG. 2 illustrates a configuration example of the memory section 20. The memory section 20 includes a plurality of row controllers 21, a plurality of column controllers 22, a plurality of row selection line drivers (RLD) 23 (row selection line drivers (RLD) 231 and 232), and a plurality of column selection line drivers (CLD) 24 (column selection line drivers (CLD) 241 and 242). In FIG. 2, a plurality of column selection line drivers (CLD) 24, out of a plurality of row selection line drivers (RLD) 23 and the plurality of column selection line drivers (CLD) 24, are drawn with thick lines.

In the memory section 20, the plurality of row selection line drivers (RLD) 23 and the plurality of column selection line drivers (CLD) 24 are arranged in a checkerboard shape. Specifically, in this example, the row selection line driver (RLD) 231 and the column selection line driver (CLD) 241 are arranged adjacent to each other in the X-direction, and the column selection line driver (CLD) 242 and the row selection line driver (RLD) 232 are arranged adjacent to each other in the X-direction. Further, the row selection line driver (RLD) 231 and the column selection line driver (CLD) 242 are arranged adjacent to each other in the Y-direction, and the column selection line driver (CLD) 241 and the row selection line driver (RLD) 232 are arranged adjacent to each other in the Y-direction.

Each of the row controllers 21 generates a selection control signal SELRL on the basis of a row address signal ADRRL and a mode signal MD. The row address signal ADRRL designates a row address of a memory cell MC (described later) to be subjected to a writing operation or a reading operation. The mode signal MD commands an operation such as a writing operation and a reading operation. The same row address signal ADRRL and the same mode signal MD are supplied to each of the plurality of row controllers 21. Further, each of the row controllers 21 supplies the generated selection control signal SELRL to the plurality of row selection line drivers (RLD) 23 through row control lines CRL (row control lines CRL1 and CRL2) extending in the Y-direction. Specifically, each of the row controllers 21 supplies a selection control signal SELRL1 included in the selection control signal SELRL to the plurality of row selection line drivers (RLD) 231 coupled to the row control line CRL1 through the row control line CRL1, and supplies a selection control signal SELRL2 included in the selection control signal SELRL to the plurality of row selection line drivers (RLD) 232 coupled to the row control line CRL2 through the row control line CRL2.

Each of the column controllers 22 generates a selection control signal SELCL on the basis of a column address signal ADRCL and the mode signal MD. The column address signal ADRCL designates a column address of the memory cell MC (described later) to be subjected to the writing operation or the reading operation. The same column address signal ADRCL and the same mode signal MD are supplied to each of the plurality of column controllers 22. Further, each of the column controllers 22 supplies the generated selection control signal SELCL to the plurality of column selection line drivers (CLD) 24 through column control lines CCL (column control lines CCL1 and CCL2) extending in the X-direction. Specifically, each of the column controllers 22 supplies a selection control signal SELCL1 included in the selection control signal SELCL to the plurality of column selection line drivers (CLD) 241 coupled to the column control line CCL1 through the column control line CCL1, and supplies a selection control signal SELCL2 included in the selection control signal SELCL to the plurality of column selection line drivers (CLD) 242 coupled to the column control line CCL2 through the column control line CCL2.

Each of the row selection line drivers (RLD) 23 drives a row selection line RL (described later) on the basis of the selection control signal SELRL. Specifically, the row selection line driver (RLD) 231 drives the row selection line RL (described later) on the basis of the selection control signal SELRL1 supplied through the row control line CRL1. Further, the row selection line driver (RLD) 232 drives the row selection line RL (described later) on the basis of the selection control signal SELRL2 supplied through the row control line CRL2. Further, the row selection line drivers (RLD) 231 and 232 are each coupled to an unillustrated sense amplifier. As described later, the sense amplifier performs a reading operation by comparing a voltage generated in the memory cell MC (described later) with a reference voltage Vref.

Each of the column selection line drivers (CLD) 24 drives a column selection line CL (described later) on the basis of the selection control signal SELCL. Specifically, the column selection line driver (CLD) 241 drives the column selection line CL (described later) on the basis of the selection control signal SELCL1 supplied through the column control line CCL1. Further, the column selection line driver (CLD) 242 drives the column selection line CL (described later) on the basis of the selection control signal SELCL2 supplied through the column control line CCL2.

FIG. 3 illustrates a configuration example of the memory section 20. The memory section 20 includes a plurality of row selection lines RL, a plurality of column selection lines CL, and a plurality of memory cells MC.

The plurality of row selection lines RL is so formed as to extend in the X-direction and to be aligned in the Y-direction in a X-Y plane parallel to a substrate surface S of a semiconductor substrate. The plurality of column selection lines CL is so formed as to extend in the Y-direction and to be aligned in the X-direction in the X-Y plane. The plurality of column selection lines CL is formed in a layer above a layer in which the plurality of row selection lines RL is formed. This configuration allows the plurality of row selection lines RL and the plurality of column selection lines CL to intersect each other. The plurality of memory cells MC is formed in a storage layer between the layer in which the plurality of row selection lines RL is formed and the layer in which the plurality of column selection lines CL is formed.

FIG. 4 illustrates a configuration example of the memory cell MC. The memory cell MC includes a storage element VR, a selection element SE, and terminals TU and TL.

The storage element VR is a resistance change storage element, and a resistance state RS reversibly changes in accordance with polarity of a voltage difference between voltages applied across both ends. In other words, the resistance state RS of the storage element VR reversibly changes in accordance with a direction of a current flowing between both ends. It is possible to use, as the storage element VR, a stack of an ion source layer and a resistance change layer, for example. One end of the storage element VR is coupled to the terminal TU of the memory cell MC, and another end thereof is coupled to one end of the selection element SE.

FIG. 5 schematically illustrates distribution of resistance values of the storage element VR. The storage element VR may have two distinguishable resistance states RS (a high resistance state HRS and a low resistance state LRS). In this example, the high resistance state HRS is associated with data "0", and the low resistance state LRS is associated with data "1", for example. That is, the storage element VR functions as a storage element that stores 1-bit data. For example, changing from the high resistance state HRS to the low resistance state LRS is referred to as "set", and changing from the low resistance state LRS to the high resistance state HRS is referred to as "reset".

The selection element SE (FIG. 4) has bidirectional diode characteristics. Specifically, the selection element SE is brought into an electrically conductive state (ON state) in a case where an absolute value of the voltage difference of the voltage applied between both ends is larger than a predetermined voltage difference; the selection element SE is brought into a non-electrically conductive state (OFF state) in a case where the absolute value of the voltage difference is smaller than the predetermined voltage difference. The one end of the selection element SE is coupled to the other end of the storage element VR, and another end thereof is coupled to the TL terminal of the memory cell MC.

The terminal TU is a terminal coupled to a selection line above the storage layer in which the memory cell MC is formed, and the terminal TL is a terminal coupled to a selection line under the storage layer in which the memory cell MC is formed. In this example, as illustrated in FIG. 3, the terminal TU of the memory cell MC is coupled to any one of the plurality of column selection lines CL, and the terminal TL is coupled to any one of the plurality of row selection lines RL.

In a case where the memory cell MC is set, the selection voltage Vsel of 6V, for example, is applied to the terminal TU, and the selection voltage Vsel of 0V, for example, is applied to the terminal TL. As a result, the selection element SE is brought into an ON state; as illustrated in FIG. 4, a set current Iset flows from the terminal TU toward the terminal TL, and the storage element VR is set. In a case where the memory cell MC is reset, the selection voltage Vsel of 6V, for example, is applied to the terminal TL, and the selection voltage Vsel of 0V, for example, is applied to the terminal TU. As a result, the selection element SE is brought into an ON state; a reset current Irst flows from the terminal TL toward the terminal TU, and the storage element VR is reset. In addition, in a case where a reading operation is performed on the memory cell MC, the selection voltage Vsel of 5V, for example, is applied to the terminal TU, and the selection voltage Vsel of 1V, for example, is applied to the terminal TL. As a result, a sense current Isns flows from the terminal TU toward the terminal TL. Further, an unillustrated sense amplifier coupled to the row selection driver (RLD) 23 compares a voltage generated in the memory cell MC and the reference voltage Vref with each other to thereby determine the resistance state RS of the storage element VR.

In the memory section 20, the selection voltage Vsel is applied to each of the row selection line RL and the column selection line CL, whereby the memory cell MC is selected, and a writing operation (set or reset) or a reading operation is performed. In the memory section 20, as illustrated in FIG. 2, the same row address signal ADRRL and the same mode signal MD are supplied to the plurality of row controllers 21, and the same column address signal ADRCL and the same mode signal MD are supplied to the plurality of column controllers 22. Accordingly, for example, the selection voltage Vsel is applied to the corresponding plurality of row selection lines RL, and the selection voltage Vsel is applied to the corresponding plurality of column selection lines CL. It is to be noted that the non-selection voltage Vinh is applied to other row selection lines RL and other column selection lines CL. As a result, the plurality of memory cells MC is selected in the memory section 20, and a writing operation and a reading operation are simultaneously performed in each of the memory cells MC.

FIG. 6 illustrates an example of a layer configuration in the semiconductor device 1. In this example, the semiconductor device 1 includes six wiring layers L1 to L6. The six wiring layers L1 to L6 are formed on the substrate surface S in this order, with respective insulating layers interposed therebetween.

In the logic circuit section 10, metal wiring lines M1 to M6 are formed in the wiring layers L1 to L6, respectively. Of the six metal wiring lines M1 to M6, wiring lines adjacent to each other are coupled to each other through a via VA. In addition, the metal wiring line M1 of the wiring layer L1 is coupled to an element (such as a transistor TR) formed on the semiconductor substrate through a contact CT.

In the memory section 20, the metal wiring lines M1, M2, M5, and M6 are formed in the wiring layers L1, L2, L5, and L6, respectively. The metal wiring lines M1 and M2 are used for local wiring lines in the row selection line driver (RLD) 23 and the column selection line driver (CLD) 24, for example. The metal wiring line M5 is used, for example, for the column control line CCL (column control lines CCL1 and CCL2), and the metal wiring line M6 is used, for example, for the row control line CRL (row control lines CRL1 and CRL2). In addition, in the memory section 20, the row selection line RL is formed in the wiring layer L3, and the column selection line CL is formed in the wiring layer L4. The line width of the row selection line RL is, for example, the same as the line width of the metal wiring line M3, and the line width of the column selection line CL is, for example, the same as the line width of the metal wiring line M4. It is to be noted that this is not limitative; for example, the line width of the row selection line RL may be narrower than the line width of the metal wiring line M3, for example, or the line width of the column selection line CL may be narrower than the line width of the metal wiring line M4, for example.

(Row Selection Line RL)

FIGS. 7 and 8 each illustrate an example of the row selection lines RL. As illustrated in FIG. 7, each of the plurality of row selection lines RL is coupled to a coupling part 13 (coupling parts 131 and 132) near the middle in an extending direction (X-direction) of the row selection line RL. In addition, each of the row selection line drivers (RLD) 231 is coupled to the coupling part 131 near the middle of the row selection line driver (RLD) 231 in the X-direction, and each of the row selection line drivers (RLD) 232 is coupled to the coupling part 132 near the middle of the row selection line driver (RLD) 232 in the X-direction. As a result, the row selection line driver (RLD) 231 is coupled to the plurality of row selection lines RL through the coupling part 131, and the row selection line driver (RLD) 232 is coupled to the plurality of row selection lines RL through the coupling part 132. It is to be noted that, in this example, each of the coupling parts 131 and 132 includes two coupling parts adjacent to each other in the Y-direction, as illustrated in FIG. 7. As illustrated in FIG. 8, the coupling part 131 includes the contact CT, the metal wiring line M1, the via VA between the wiring layers L1 and L2, the metal wiring line M2, and the via VA between the wiring layers L2 and L3. The same holds true also for the coupling part 132.

One row selection line driver (RLD) 231 is coupled to a plurality of (512 in this example) row selection lines RL, for example. In FIG. 7, the right ends of the row selection lines RL coupled to the row selection line driver (RLD) 231 are located near the middle in the X-direction of the column selection line driver (CLD) 241 on right side of the row selection line driver (RLD) 231. In addition, the left ends of the row selection lines RL coupled to the row selection line driver (RLD) 231 are located near the middle in the X-direction of the column selection line driver (CLD) 241 on left side of the row selection line driver (RLD) 231.

Likewise, one row selection line driver (RLD) 232 is coupled to a plurality of (512 in this example) row selection lines RL. In FIG. 7, the right ends of the row selection lines RL coupled to the row selection line driver (RLD) 232 are located near the middle in the X-direction of the column selection line driver (CLD) 242 on right side of the row selection line driver (RLD) 232. In addition, the left ends of the row selection lines RL coupled to the row selection line driver (RLD) 232 are located near the middle in the X-direction of the column selection line driver (CLD) 242 on left side of the row selection line driver (RLD) 232.

The plurality of row selection line drivers (RLD) 23 and the plurality of column selection line drivers (CLD) 24 are arranged in a checkerboard shape, and thus the plurality of row selection lines RL coupled to the row selection line driver (RLD) 231 and the plurality of row selection lines RL coupled to the row selection line driver (RLD) 232 are staggered from each other in the X-direction.

(Column Selection Line CL)

FIGS. 9 and 10 each illustrate an example of the column selection lines CL. As illustrated in FIG. 9, each of the plurality of column selection lines CL is coupled to a coupling part 14 (coupling parts 141 and 142) near the middle of an extending direction (Y-direction) of the column selection line CL. In addition, each of the column selection line drivers (CLD) 241 is coupled to the coupling part 141 near the middle of the column selection line driver (CLD) 241 in the Y-direction, and each of the column selection line drivers (CLD) 242 is coupled to the coupling part 142 near the middle of the column selection line driver (CLD) 242 in the Y-direction. As a result, the column selection line driver (CLD) 241 is coupled to the plurality of column selection lines CL through the coupling part 141, and the column selection line driver (CLD) 242 is coupled to the plurality of column selection lines CL through the coupling part 142. It is to be noted that, in this example, each of the coupling parts 141 and 142 includes two coupling parts adjacent to each other in the X-direction, as illustrated in FIG. 9. As illustrated in FIG. 10, the coupling part 141 includes the contact CT, the metal wiring line M1, the via VA between the wiring layers L1 and L2, the metal wiring line M2, the via VA between the wiring layers L2 and L3, the metal wiring line M3, and the via VA between the wiring layers L3 and L4. The same holds true also for the coupling part 142.

One column selection line driver (CLD) 241 is coupled to a plurality of (512 in this example) column selection lines CL. In FIG. 9, the upper ends of the column selection lines CL coupled to the column selection line driver (CLD) 241 are located near the middle in the Y-direction of the row selection line driver (RLD) 232 on upper side of the column selection line driver (CLD) 241. In addition, the lower ends of the column selection lines CL coupled to the column selection line driver (CLD) 241 are located near the middle in the Y-direction of the row selection line driver (RLD) 232 on lower side of the column selection line driver (CLD) 241.

Likewise, one column selection line driver (CLD) 242 is coupled to a plurality of (512 in this example) column selection lines CL. In FIG. 9, the upper ends of the column selection lines CL coupled to the column selection line driver (CLD) 242 are located near the middle in the Y-direction of the row selection line driver (RLD) 231 on upper side of the column selection line driver (CLD) 242. In addition, the lower ends of the column selection lines CL coupled to the column selection line driver (CLD) 242 are located near the middle in the Y-direction of the row selection line driver (RLD) 231 on lower side of the column selection line driver (CLD) 242.

The plurality of row selection line drivers (RLD) 23 and the plurality of column selection line drivers (CLD) 24 are arranged in a checkerboard shape, and thus the plurality of column selection lines CL coupled to the column selection line driver (CLD) 241 and the plurality of column selection lines CL coupled to the column selection line driver (CLD) 242 are staggered from each other in the Y-direction.

FIG. 11 illustrates an example of the plurality of row selection lines RL and the plurality of column selection lines CL. FIG. 11 depicts the plurality of row selection lines RL illustrated in FIG. 7 and the plurality of column selection lines CL illustrated in FIG. 9 in a superimposed manner.

The row selection line RL extends in the X-direction in the wiring layer L3, and the column selection line CL extends in the Y-direction in the wiring layer L4, and thus the row selection line RL and the column selection line CL intersect each other. Each of the plurality of row selection lines RL intersects 1024 (=512×2) column selection lines CL in this example, and each of the plurality of column selection lines CL intersects 1024 (=512×2) row selection lines RL in this example. The memory cell MC is formed in a layer between the wiring layer L3 and the wiring layer L4 at the intersection. In the memory section 20, as illustrated in FIG. 11, a memory array AR including 1M (=1024×1024) memory cells MC is defined. As illustrated in FIG. 7, the memory array AR includes 512 row selection lines RL coupled to the row selection line driver (RLD) 231 and 512 row selection lines RL coupled to the row selection line driver (RLD) 232. That is, in this example, in consideration of the row selection line drivers (RLD) 231 and 232 each coupled to an unillustrated sense amplifier, the memory array AR is defined from the viewpoint of a reading operation. As illustrated in FIG. 9, the column selection lines CL are so formed as to extend across adjacent memory arrays AR.

As illustrated in FIG. 11, a region corresponding to the row selection line driver (RLD) 231 includes a region (slot region SL31) where the row selection line RL and the column selection line CL are not formed. The slot region SL31 is located near the middle in the Y-direction of the region corresponding to the row selection line driver (RLD) 231. Likewise, a region corresponding to the row selection line driver (RLD) 232 includes a region (slot region SL32) where the row selection line RL and the column selection line CL are not formed. The slot region SL32 is located near the middle in the Y-direction of the region corresponding to the row selection line driver 232. The slot regions SL31 and SL32 are each a rectangular region that is long in the X-direction and short in the Y-direction. In the memory section 20, as described below, a coupling part CN31 (described later) that couples the row selection line driver (RLD) 231 and the row control line CRL1 to each other is formed in the slot region SL31, and a coupling part CN32 (described later) that couples the row selection line driver (RLD) 232 and the row control line CRL2 to each other is formed in the slot region SL32.

Likewise, a region corresponding to the column selection line driver (CLD) 241 includes a region (slot region SL41) where the row selection line RL and the column selection line CL are not formed. The slot region SL41 is located near the middle in the X-direction of the region corresponding to the column selection line driver (CLD) 241. Likewise, a region corresponding to the column selection line driver (CLD) 242 includes a region (slot region SL42) where the row selection line RL and the column selection line CL are not formed. The slot region SL42 is located near the middle in the X-direction of the region corresponding to the column selection line driver (CLD) 242. The slot regions SL41 and SL42 are each a rectangular region that is long in the Y-direction and short in the X-direction. In the memory section 20, as described below, a coupling part CN41 (described later) that couples the column selection line driver (CLD) 241 and the column control line CCL1 to each other is formed in the slot region SL41, and a coupling part CN42 (described later) that couples the column selection line driver (CLD) 242 and the column control line CCL2 to each other is formed in the slot region SL42.

(Row Control Line CRL and Column Control Line CCL)

FIG. 12 illustrates a configuration example of the row control line CRL (row control lines CRL1 and CRL2) and the column control line CCL (column control lines CCL1 and CCL2).

The coupling part CN31 is formed in the slot region SL31 corresponding to the row selection line driver (RLD) 231, and the coupling part CN32 is formed in the slot region SL32 corresponding to the row selection line driver (RLD) 232. That is, the coupling part CN31 is formed near the middle of the row selection line driver (RLD) 231 in the Y-direction, and the coupling part CN32 is formed near the middle of the row selection line driver (RLD) 232 in the Y-direction.

Likewise, the coupling part CN41 is formed in the slot region SL41 corresponding to the column selection line driver (CLD) 241, and the coupling part CN42 is formed in the slot region SL42 corresponding to the column selection line driver (CLD) 242. That is, the coupling part CN41 is formed near the middle of the column selection line driver (CLD) 241 in the X-direction, and the coupling part CN42 is formed near the middle of the column selection line driver (CLD) 242 in the X-direction.

The row control lines CRL1 and CRL2 are each formed using, for example, the metal wiring line M6 of the wiring layer L6. The row control line CRL1 is coupled to the row selection line driver (RLD) 231 through the coupling part CN31, and the row control line CRL2 is coupled to the row selection line driver (RLD) 232 through the coupling part CN32. As a result, the row controller 21 supplies the selection control signal SELRL1 to the plurality of row selection line drivers (RLD) 231 coupled to the row control line CRL1 through the row control line CRL1, and supplies the selection control signal SELRL2 to the plurality of row selection line drivers (RLD) 232 coupled to the row control line CRL2 through the row control line CRL2.

It is to be noted that, in this example, the selection control signal SELRL1 is supplied to the row selection line driver (RLD) 231 using the slot region SL31, and the selection control signal SELRL2 is supplied to the row selection line driver (RLD) 232 using the slot region SL32; however, this is not limitative. For example, the slot regions SL31 and SL32 may be used to supply power.

The column control lines CCL1 and CCL2 are each formed using, for example, the metal wiring line M5 of the wiring layer L5. The column control line CCL1 is coupled to the column selection line driver (CLD) 241 through the coupling part CN41, and the column control line CCL2 is coupled to the column selection line driver (CLD) 242 through the coupling part CN42. As a result, the column controller 22 supplies the selection control signal SELCL1 to the plurality of column selection line drivers (CLD) 241 coupled to the column control line CCL1 through the column control line CCL1, and supplies the selection control signal SELCL2 to the plurality of column selection line drivers (CLD) 242 coupled to the column control line CCL2 through the column control line CCL2.

It is to be noted that, in this example, the selection control signal SELCL1 is supplied to the column selection line driver (CLD) 241 using the slot region SL41, and the selection control signal SELCL2 is supplied to the column selection line driver (CLD) 242 using the slot region SL42; however, this is not limitative. For example, the slot regions SL41 and SL42 may be used to supply power.

Here, the plurality of row selection lines RL coupled to the row selection line driver 231 corresponds to a specific example of "a plurality of first selection lines" in the present disclosure. The plurality of column selection lines CL coupled to the column selection line driver 241 corresponds to a specific example of "a plurality of second selection lines" in the present disclosure. The plurality of row selection lines RL coupled to the row selection line driver 232 corresponds to a specific example of "a plurality of third selection lines" in the present disclosure. The plurality of column selection lines CL coupled to the column selection line driver 242 corresponds to a specific example of "a plurality of fourth selection lines" in the present disclosure. The coupling part 131 corresponds to a specific example of a "first coupling part" in the present disclosure. The coupling part 141 corresponds to a specific example of a "second coupling part" in the present disclosure. The coupling part 132 corresponds to a specific example of a "third coupling part" in the present disclosure. The coupling part 142 corresponds to a specific example of a "fourth coupling part" in the present disclosure. The row selection line driver 231 corresponds to a specific example of a "first circuit" in the present disclosure. The column selection line driver 241 corresponds to a specific example of a "second circuit" in the present disclosure. The row selection line driver 232 corresponds to a specific example of a "third circuit" in the present disclosure. The column selection line driver 242 corresponds to a specific example of a "fourth circuit" in the present disclosure. The row controller 21 and the column controller 22 each correspond to a specific example of a "controller" in the present disclosure. The row control line CRL and the column control line CCL each correspond to a specific example of a "control signal line" in the present disclosure. The coupling parts CN31 and CN32 each correspond to a specific example of a "control signal coupling part" in the present disclosure.

[Operations and Workings]

Next, description is given of the operations and workings of the semiconductor device 1 of the present embodiment.

(Overview of Overall Operation)

First, description is given of an overview of overall operations of the memory section 20 with reference to FIG. 2. Each of the row controllers 21 of the memory section 20 generates the selection control signal SELRL (selection control signals SELRL1 and SELRL2) on the basis of the row address signal ADRRL and the mode signal MD. Each of the column controllers 22 generates the selection control signal SELCL (selection control signals SELCL1 and SELCL2) on the basis of the column address signal ADRCL and the mode signal MD.

Each of the row selection line drivers (RLD) 231 drives the plurality of (512 in this example) row selection lines RL coupled to the row selection line driver (RLD) 231 on the basis of the selection control signal SELRL1. Each of the row selection line drivers (RLD) 232 drives the plurality of (512 in this example) row selection lines RL coupled to the row selection line driver (RLD) 232 on the basis of the selection control signal SELRL2.

Each of the column selection line drivers (CLD) 241 drives the plurality of (512 in this example) column selection lines CL coupled to the column selection line driver (CLD) 241 on the basis of the selection control signal SELCL1. Each of the column selection line drivers (CLD) 242 drives the plurality of (512 in this example) column selection lines CL coupled to the column selection line driver (CLD) 242 on the basis of the selection control signal SELCL2.

(Workings)

In the semiconductor device 1, as illustrated in FIG. 7, the row selection line RL is coupled to the row selection line driver (RLD) 23 (row selection line drivers (RLD) 231 and 232) through the coupling part 13 (coupling parts 131 and 132) near the middle of the extending direction (X-direction) of the row selection line RL. Likewise, in the semiconductor device 1, as illustrated in FIG. 9, the column selection line CL is coupled to the column selection line driver (CLD) 24 (column selection line drivers (CLD) 241 and 242) through the coupling part 14 (coupling parts 141 and 142) near the middle of the extending direction (Y-direction) of the column selection line CL. This makes it possible, in the semiconductor device 1, to suppress voltage drop in the row selection line RL and the column selection line CL, thus making it possible to reduce a possibility that a write error or a read error may occur in the memory cell MC.

That is, referring, for example to a memory section 20R illustrated in FIGS. 13 and 14, the row selection line RL is coupled to a row selection line driver (RLD) 23R (row selection line drivers (RLD) 231R and 232R) through a coupling part 13R (coupling parts 131R and 132R) near the end of the extending direction (X-direction) of the row selection line RL, and the column selection line CL is coupled to a column selection line driver (CLD) 24R (column selection line drivers (CLD) 241R and 242R) through a coupling part 14R (coupling parts 141R and 142R) near the end of the extending direction (Y-direction) of the column selection line CL. In such a case, there is a possibility that the voltage drop in the row selection line RL and the column selection line CL may increase. In this case, when the writing operation is performed on the memory cell MC, it is not possible for the storage element VR to be sufficiently set or reset, thus leading to a possibility that a write error may occur. In addition, when a reading operation is performed on the memory cell MC, there is a possibility that a read error may occur.

Meanwhile, in the memory section 20 according to the present embodiment, the row selection line RL is coupled to the row selection line driver (RLD) 23 through the coupling part 13 near the middle of the extending direction of the row selection line RL, and the column selection line CL is coupled to the column selection line driver (CLD) 24 through the coupling part 14 near the middle of the extending direction of the column selection line CL. This makes it possible to suppress the voltage drop in the row selection line RL and the column selection line CL. As a result, in the semiconductor device 1, it is possible to reduce the possibility that a write error or a read error may occur.

In addition, in the semiconductor device 1, as illustrated in FIG. 7, the row selection line driver (RLD) 231 is coupled to the plurality of row selection lines RL through the coupling part 131 near the middle of the row selection line driver (RLD) 231 in the X-direction, and the row selection line driver (RLD) 232 is coupled to the plurality of row selection lines RL through the coupling part 132 near the middle of the row selection line driver (RLD) 232 in the X-direction. Likewise, in the semiconductor device 1, as illustrated in FIG. 9, the column selection line driver (CLD) 241 is coupled to the plurality of column selection lines CL through the coupling part 141 near the middle of the column selection line driver (CLD) 241 in the Y-direction, and the column selection line driver (CLD) 242 is coupled to the plurality of column selection lines CL through the coupling part 142 near the middle of the column selection line driver (CLD) 242 in the Y-direction. This makes it easier, in the semiconductor device 1, to lay out the row selection line driver (RLD) 23 and the column selection line driver (CLD) 24.

That is, referring, for example, to the memory section 20R illustrated in FIGS. 13 and 14, the row selection line driver (RLD) 23R (row selection line drivers (RLD) 231R and 232R) is coupled to the row selection line RL through the coupling part 13R (coupling parts 131R and 132R) near the end of the row selection line driver (RLD) 23R in the X-direction, and the column selection line driver (CLD) 24R (column selection line drivers (CLD) 241R and 242R) is coupled to the column selection line CL through the coupling part 14R (coupling parts 141R and 142R) near the end of the column selection line driver (CLD) 24R in the Y-direction. In such a case, there is a possibility that it may be difficult to lay out the row selection line driver (RLD) 23 and the column selection line driver (CLD) 24. Specifically, for example, in FIG. 13, in the row selection line driver (RLD) 231R, 512 wiring lines are coupled to the coupling part 131R from right side of the coupling part 131R, thus causing the wiring lines to be dense near the coupling part 131R. The same holds true also for the row selection line driver (RLD) 232R and the column selection line drivers (CLD) 241R and 242R.

Meanwhile, in the memory section 20 according to the present embodiment, the row selection line driver (RLD) 23 is coupled to the row selection line RL through the coupling part 13 near the middle of the row selection line driver (RLD) 23 in the X-direction, and the column selection line driver (CLD) 24 is coupled to the column selection line CL through the coupling part 14 near the middle of the column selection line driver (CLD) 24 in the Y-direction. This enables, for example, in the row selection line driver (RLD) 231 in FIG. 7, 256 wiring lines to be coupled to the coupling part 131 from left side of the coupling part 131 and 256 wiring lines to be coupled to the coupling part 131 from right side of the coupling part 131. This makes it possible, in the row selection line driver (RLD) 231, to lower density of wiring lines near the coupling part 131. The same holds true also for the row selection line driver (RLD) 232 and the column selection line drivers (CLD) 241 and 242. As a result, it becomes easier, in the semiconductor device 1, to lay out the row selection line driver (RLD) 23 and the column selection line driver (CLD) 24.

FIGS. 15A, 15B, and 15C illustrate variations of each of the row selection line drivers (RLD) 231 and 232, the column selection line drivers (CLD) 241 and 242, and the coupling parts 131, 132, 141 and 142.

In an example of FIG. 15A, similarly to the examples illustrated in FIGS. 7 and 9, the shape of each of the regions of the row selection line drivers (RLD) 231 and 232 and the column selection line drivers (CLD) 241 and 242 is substantially square. In an example of FIG. 15B, the shape of each of the regions of the row selection line drivers (RLD) 231 and 232 and the column selection line drivers (CLD) 241 and 242 is rectangular.

In addition, in an example of FIG. 15C, the shape of the coupling part 13 (coupling parts 131 and 132) and the shape of the coupling part 14 (coupling parts 141 and 142) are each asymmetric. In this example, for example, a length in the Y-direction of an upper coupling part of the coupling part 131 coupled to the row selection line driver (RLD) 231 is made shorter than a length in the Y-direction of a lower coupling part of the coupling part 131. The same holds true also for the coupling part 132. In addition, for example, a length in the X-direction of a right coupling part of the coupling part 141 coupled to the column selection line driver (CLD) 241 is made longer than a length in the X-direction of a left coupling part of the coupling part 141. The same holds true also for the coupling part 142. Accordingly, the coupling part 131 is disposed slightly to the left of the middle in the X-direction in the row selection line driver (RLD) 231, and the coupling part 132 is disposed slightly to the left of the middle in the X-direction in the row selection line driver (RLD) 232. In addition, the coupling part 141 is disposed slightly above the middle in the Y-direction in the column selection line driver (CLD) 241, and the coupling part 142 is disposed slightly above the middle in the Y-direction in the column selection line driver (CLD) 242.

In any case of FIGS. 15A, 15B, and 15C, for example, in the Y-direction, the coupling part 131 is so disposed as not to overlap the coupling part 132, and in the X-direction, the coupling part 141 is so disposed as not to overlap the coupling part 142. In addition, for example, in the X-direction, the coupling part 131 is so disposed as not to overlap the coupling part 142, and the coupling part 132 is so disposed as not to overlap the coupling part 141. Likewise, for example, in the Y-direction, the coupling part 131 is so disposed as not to overlap the coupling part 141, and the coupling part 132 is so disposed as not to overlap the coupling part 142.

In addition, in the semiconductor device 1, the row control line CRL (row control lines CRL1 and CRL2) and the column control line CCL (column control lines CCL1 and CCL2) are formed in respective layers above the layers (the wiring layers L3 and L4 in this example) in which the row selection line RL and the column selection line CL are formed, respectively. This enables the row selection line RL and the column selection line CL to be disposed at positions closer to the semiconductor substrate than a case where the row control line CRL and the column control line CCL are formed in respective layers under the layers in which the row selection line RL and the column selection line CL are formed, respectively. This makes it possible to suppress the voltage drop in the coupling part 13 (coupling parts 131 and 132) and the coupling part 14 (coupling parts 141 and 142). As a result, it is possible, in the semiconductor device 1, to reduce the possibility that a write error or a read error may occur.

Further, in the semiconductor device 1, as illustrated in FIG. 7, the plurality of (512 in this example) row selection lines RL coupled to the row selection line driver (RLD) 231 are arranged side by side in one region, and the plurality of (512 in this example) row selection lines RL coupled to the row selection line driver (RLD) 232 are arranged side by side in one region. Likewise, in the semiconductor device 1, as illustrated in FIG. 9, the plurality of (512 in this example) column selection lines CL coupled to the column selection line driver (CLD) 241 are arranged side by side in one region, and the plurality of (512 in this example) column selection lines CL coupled to the column selection line driver (CLD) 242 are arranged side by side in one region. This makes it easier, in the semiconductor device 1, to lay out the memory section 20, and makes it possible to simplify the operation of the memory section 20.

That is, referring, for example, to a memory section 20S illustrated in FIGS. 16 and 17, a plurality of (256 in this example) row selection lines RL coupled to a row selection line driver (RLD) 231S and a plurality of (256 in this example) row selection lines RL coupled to a row selection line driver (RLD) 233S are alternately arranged side by side in one region, and a plurality of (256 in this example) column selection lines CL coupled to a column selection line driver (CLD) 241S and a plurality of (256 in this example) column selection lines CL coupled to a column selection line driver (CLD) 243S are alternately arranged side by side in one region. In such a case, there is a possibility that it may be difficult to lay out the memory section 20S. Specifically, for example, as illustrated in FIG. 18 in which the plurality of row selection lines RL illustrated in FIG. 16 and the plurality of column selection lines CL illustrated in FIG. 17 are depicted in a superimposed manner, the memory section 20S has no region (slot region) where the row selection line RL and the column selection line CL are not formed. Thus, unlike the memory section 20 according to the present embodiment, it is not possible, in the memory section 20S, to form the row control line CRL and the column control line CCL in the wiring layers L5 and L6. In this case, the row control line CRL and the column control line CCL are formed in wiring layers under the wiring layers in which the row selection line RL and the column selection line CL are formed, respectively, thus leading to a possibility that it may be difficult to lay out the memory section 20S. Further, for example, as illustrated in FIG. 16, the plurality of row selection lines RL coupled to the row selection line driver (RLD) 231S and the plurality of row selection lines RL coupled to the row selection line driver (RLD) 233S are alternately arranged side by side. Accordingly, unlike the case of the present embodiment (FIG. 7), the definition of the memory array AR becomes complicated, thus leading to a possibility that the operation of the memory section 20S may be complicated.

Meanwhile, in the memory section 20 according to the present embodiment, for example, the plurality of (512 in this example) row selection lines RL coupled to the row selection line driver (RLD) 231 are arranged side by side in one region, and the plurality of (512 in this example) column selection lines CL coupled to the column selection line driver (CLD) 241 are arranged side by side in one region. This allows for generation, in the memory section 20, of regions (slot regions SL31, SL32, SL41, and SL42) in which the row selection line RL and the column selection line CL are not formed, as illustrated in FIG. 11. Accordingly, in the memory section 20, the coupling parts CN31 and CN32 are formed, respectively, in the slot regions SL31 and SL32, thus enabling the row control lines CRL1 and CRL2 formed, for example, in the wiring layer L5 to be coupled to the row selection line drivers 231 and 232, respectively, through the coupling parts CN31 and CN32. Likewise, in the memory section 20, the coupling parts CN41 and CN42 are formed, respectively, in the slot regions SL41 and SL42, thus enabling the column control lines CCL1 and CCL2 formed, for example, in the wiring layer L6 to be coupled to the column selection line drivers (CLD) 241 and 242, respectively, through the coupling parts CN41 and CN42. As a result, it becomes easier, in the semiconductor device 1, to lay out the memory section 20. In addition, as illustrated in FIG. 7, it is possible, in the semiconductor device 1, to simplify the definition of the memory array AR, thus making it possible to simplify the operation of the memory section 20.

[Effects]

As described above, in the present embodiment, the row selection line is coupled to the row selection line driver through the coupling part near the middle of the extending direction of the row selection line, and the column selection line is coupled to the column selection line driver through the coupling part near the middle of the extending direction of the column selection line. This makes it possible to reduce the possibility that a write error or a read error may occur.

In the present embodiment, the row selection line driver is coupled to a plurality of row selection lines through the coupling part near the middle of the row selection line driver in the X-direction, and the column selection line driver is coupled to a plurality of column selection lines through the coupling part near the middle of the column selection line driver in the Y-direction. This makes it easier to lay out the row selection line driver and the column selection line driver.

In the present embodiment, the row control line and the column control line are formed in respective layers above the layers in which the row selection line and the column selection line are formed. This makes it possible to reduce the possibility that a write error or a read error may occur.

In the present embodiment, a plurality of row selection lines coupled to the row selection line driver are arranged side by side in one region; a plurality of row selection lines coupled to the row selection line driver are arranged side by side in one region; a plurality of column selection lines coupled to the column selection line driver are arranged side by side in one region; and a plurality of column selection lines coupled to the column selection line driver are arranged side by side in one region. This makes it easier to lay out the memory section, and makes it possible to simplify the operation of the memory section.

Modification Example 1-1

In the foregoing embodiment, the row selection line RL is formed in the wiring layer L3, and the column selection line CL is formed in the wiring layer L4; however, this is not limitative. In the following, description is given in detail of a semiconductor device 1A according to the present modification example. The semiconductor device 1A includes the logic circuit section 10 and a memory section 20A.

FIG. 19 illustrates an example of a layer configuration in the semiconductor device 1A. In the memory section 20A of the semiconductor device 1A, the metal wiring lines M1, M2, M5, and M6 are formed in the wiring layers L1, L2, L5, and L6, respectively. In addition, in the memory section 20A, the row selection line RL is formed in the wiring layer L3 and the column selection line CL is formed in the wiring layer L4 in a certain region, and the column selection line CL is formed in the wiring layer L3 and the row selection line RL is formed in the wiring layer L4 in another certain region.

FIG. 20 illustrates an example of the row selection lines RL. In FIG. 20, the row selection lines RL formed in the wiring layer L3 are each indicated by a solid line, and the row selection lines RL formed in the wiring layer L4 are each indicated by a broken line.

The memory section 20A includes a row selection line driver (RLD) 23A (row selection line drivers (RLD) 231A and 232A) and a column selection line driver (CLD) 24A (column selection line drivers (CLD) 241A and 242A).

One row selection line driver (RLD) 231A is coupled to the plurality of (512 in this example) row selection lines RL through a coupling part 131A. In FIG. 20, the upper half of the row selection lines RL of the plurality of row selection lines RL coupled to the row selection line driver (RLD) 231A is formed in the wiring layer L4, and the lower half of the row selection lines RL is formed in the wiring layer L3.

Likewise, one row selection line driver (RLD) 232A is coupled to the plurality of (512 in this example) row selection lines RL through a coupling part 132A. In FIG. 20, the upper half of the row selection lines RL of the plurality of row selection lines RL coupled to the row selection line driver 232A is formed in the wiring layer L3, and the lower half of the row selection lines RL is formed in the wiring layer L4.

FIGS. 21 to 23 each illustrate an example of the column selection lines CL. In FIG. 21, the column selection lines CL formed in the wiring layer L3 are each indicated by a solid line, and the column selection lines CL formed in the wiring layer L4 are each indicated by a broken line.

One column selection line driver (CLD) 241A is coupled to the plurality of (512 in this example) column selection lines CL through a coupling part 141A. In FIG. 21, a portion, of the plurality of column selection lines CL coupled to the column selection line driver (CLD) 241A, extending to upper side of the coupling part 141A is formed in the wiring layer L3, and a portion extending to lower side of the coupling part 141A is formed in the wiring layer L4. As illustrated in FIG. 22, the coupling part 141A includes the contact CT, the metal wiring line M1, the via VA between the wiring layers L1 and L2, the metal wiring line M2, the via VA between the wiring layers L2 and L3, the column selection line CL, and the via VA between the wiring layers L3 and L4.

One column selection line driver (CLD) 242A is coupled to the plurality of (512 in this example) column selection lines CL through a coupling part 142A. In FIG. 21, a portion, of the plurality of column selection lines CL coupled to the column selection line driver (CLD) 242A, extending to upper side of the coupling part 142A is formed in the wiring layer L4, and a portion extending to lower side of the coupling part 142A is formed in the wiring layer L3. As illustrated in FIG. 23, the coupling part 142A includes the contact CT, the metal wiring line M1, the via VA between the wiring layers L1 and L2, the metal wiring line M2, the via VA between the wiring layers L2 and L3, the column selection line CL, and the via VA between the wiring layers L3 and L4.

2. Second Embodiment

Next, description is given of a semiconductor device 2 according to a second embodiment. In the present embodiment, two storage layers are provided. It is to be noted that components substantially the same as those of the semiconductor device 1 according to the first embodiment are denoted by the same reference numerals, and description thereof is omitted as appropriate.

As illustrated in FIG. 1, the semiconductor device 2 includes a logic circuit section 30 and a memory section 40. Similar to the semiconductor device 1 (FIG. 2) according to the foregoing embodiment, the memory section 40 includes a plurality of row selection line drivers (RLD) 43 (row selection line drivers (RLD) 431 and 432) and a plurality of column selection line drivers (CLD) 44 (column selection line drivers (CLD) 441 and 442). The plurality of row selection line drivers (RLD) 43 and the plurality of column selection line drivers (CLD) 44 are arranged in a checkerboard shape.

FIG. 24 illustrates a configuration example of the memory section 40. The memory section 40 includes a plurality of row selection lines RL (row selection lines RL0 and RL1), the plurality of column selection lines CL, and a plurality of memory cells MC (memory cells MC0 and MC1).

The plurality of row selection lines RL0 is so formed as to extend in the X-direction and to be aligned in the Y-direction in the X-Y plane parallel to the substrate surface S of the semiconductor substrate. The plurality of column selection lines CL is so formed as to extend in the Y-direction and to be aligned in the X-direction in the X-Y plane. The plurality of row selection lines RL1 is so formed as to extend in the X-direction and to be aligned in the Y-direction in the X-Y plane. The plurality of column selection lines CL is formed in a layer above the layer in which the plurality of row selection lines RL0 is formed, and the plurality of row selection lines RL1 is formed in a layer above the layer in which the plurality of column selection lines CL is formed.

A plurality of memory cells MC (memory cells MC0) is formed in a storage layer between the layer in which the plurality of row selection lines RL0 is formed and the layer in which the plurality of column selection lines CL is formed. Likewise, a plurality of memory cells MC (memory cells MC1) is formed in a layer between the layer in which the plurality of column selection lines CL is formed and the storage layer in which the plurality of row selection lines RL1 is formed.

As illustrated in FIG. 4, the memory cells MC0 and MC1 each include the storage element VR and the selection element SE. In the memory cell MC0, the terminal TU is coupled to any one of the plurality of column selection lines CL, and the terminal TL is coupled to any one of the plurality of row selection lines RL0. Likewise, in the memory cell MC1, the terminal TU is coupled to any one of the plurality of row selection lines RL1, and the terminal TL is coupled to any one of the plurality of column selection lines CL. As illustrated in FIG. 24, this allows for formation of the storage element VR in the upper layer of the selection element SE in the memory cell MC, regardless of which storage layer is formed.

FIG. 25 illustrates an example of a layer configuration in the semiconductor device 2. In this example, the semiconductor device 2 includes seven wiring layers L1 to L7. In the logic circuit section 30, metal wiring lines M1 to M7 are formed in wiring layers L1 to L7, respectively.

In the memory section 40, the metal wiring lines M1 to M3 and M7 are formed in the wiring layers L1 to L3 and L7, respectively. The metal wiring lines M1 to M3 are used, for example, for local wiring lines in the row selection line driver (RLD) 43 and the column selection line driver (CLD) 44, and for the column control line CCL (column control lines CCL1 and CCL2). The metal wiring line M7 is used, for example, for the row control line CRL (row control lines CRL1 and CRL2). In addition, in the memory section 40, the row selection line RL0 is formed in the wiring layer L4, the column selection line CL is formed in the wiring layer L5, and the row selection line RL1 is formed in the wiring layer L6.

(Row Selection Lines RL0 and RL1)

FIG. 26 illustrates an example of the row selection lines RL0. FIG. 27 illustrates an example of the row selection lines RL1. FIG. 28 illustrates an example of the row selection lines RL0 and RL1. The length of each of the row selection lines RL0 and RL1 is about twice that of the row selection line RL according to the foregoing first embodiment.

The plurality of row selection line drivers (RLD) 431 includes a row selection line driver (RLD) 431A that drives the plurality of row selection lines RL0 and a row selection line driver (RLD) 431B that drives the plurality of row selection lines RL1. The row selection line drivers (RLD) 431A and 431B are alternately arranged with the column selection line driver (CLD) 441 interposed therebetween in the X-direction. Likewise, the plurality of row selection line drivers (RLD) 432 includes a row selection line driver (RLD) 432A that drives the plurality of row selection lines RL0 and a row selection line driver (RLD) 432B that drives the plurality of row selection lines RL1. The row selection line drivers (RLD) 432A and 432B are alternately arranged with the column selection line driver (CLD) 442 interposed therebetween in the X-direction.

As illustrated in FIG. 26, each of the plurality of row selection lines RL0 is coupled to a coupling part 33A (coupling parts 331A and 332A) near the middle of the extending direction (X-direction) of the row selection line RL0. In addition, each row selection line driver (RLD) 431A is coupled to the coupling part 331A near the middle of the row selection line driver (RLD) 431A in the X-direction, and each row selection line driver (RLD) 432A is coupled to the coupling part 332A near the middle of the row selection line driver (RLD) 432A in the X-direction. As a result, the row selection line driver (RLD) 431A is coupled to the plurality of row selection lines RL0 through the coupling part 331A, and the row selection line driver (RLD) 432A is coupled to the plurality of row selection lines RL0 through the coupling part 332A. As illustrated in FIG. 28, the coupling part 331A includes the contact CT, the metal wiring line M1, the via VA between the wiring layers L1 and L2, the metal wiring line M2, the via VA between the wiring layers L2 and L3, the metal wiring line M3, and the via VA between the wiring layers L3 and L4. The same holds true also for the coupling part 332A.

One row selection line driver (RLD) 431A is coupled to the plurality of (512 in this example) row selection lines RL0, for example. In FIG. 26, the right ends of the row selection lines RL0 coupled to the row selection line driver (RLD) 431A are located near the middle in the X-direction of the row selection line driver (RLD) 431B on right side of the row selection line driver (RLD) 431A. In addition, the left ends of the row selection lines RL0 coupled to the row selection line driver (RLD) 431A are located near the middle in the X-direction of the row selection line driver (RLD) 431B on left side of the row selection line driver (RLD) 431A.

Likewise, one row selection line driver (RLD) 432A is coupled to the plurality of (512 in this example) row selection lines RL0, for example. In FIG. 26, the right ends of the row selection lines RL0 coupled to the row selection line driver (RLD) 432A are located near the middle in the X-direction of the row selection line driver (RLD) 432B on right side of the row selection line driver (RLD) 432A. In addition, the left ends of the row selection lines RL0 coupled to the row selection line driver (RLD) 432A are located near the middle in the X-direction of the row selection line driver (RLD) 432B on left side of the row selection line driver (RLD) 432A.

As illustrated in FIG. 27, each of the plurality of row selection lines RL1 is coupled to a coupling part 33B (coupling parts 331B and 332B) near the middle of the extending direction (X-direction) of the row selection line RL1. In addition, each row selection line driver (RLD) 431B is coupled to the coupling part 331B near the middle of the row selection line driver (RLD) 431B in the X-direction, and each row selection line driver (RLD) 432B is coupled to the coupling part 332B near the middle of the row selection line driver (RLD) 432B in the X-direction. As a result, the row selection line driver (RLD) 431B is coupled to the plurality of row selection lines RL1 through the coupling part 331B, and the row selection line driver (RLD) 432B is coupled to the plurality of row selection lines RL1 through the coupling part 332B. As illustrated in FIG. 28, the coupling part 331B includes the contact CT, the metal wiring line M1, the via VA between the wiring layers L1 and L2, the metal wiring line M2, the via VA between the wiring layers L2 and L3, the metal wiring line M3, the via VA between the wiring layers L3 and L4, the metal wiring line M4, the via VA between the wiring layers L4 and L5, the metal wiring line M5, and the via VA between the wiring layers L5 and L6. The same holds true also for the coupling part 332B.

One row selection line driver (RLD) 431B is coupled to the plurality of (512 in this example) row selection lines RL1, for example. In FIG. 27, the right ends of the row selection lines RL1 coupled to the row selection line driver (RLD) 431B are located near the middle in the X-direction of the row selection line driver (RLD) 431A on right side of the row selection line driver (RLD) 431B. In addition, the left ends of the row selection lines RL1 coupled to the row selection line driver (RLD) 431B are located near the middle in the X-direction of the row selection line driver (RLD) 431A on left side of the row selection line driver (RLD) 431B.

Likewise, one row selection line driver (RLD) 432B is coupled to the plurality of (512 in this example) row selection lines RL1, for example. In FIG. 27, the right ends of the row selection lines RL1 coupled to the row selection line driver (RLD) 432B are located near the middle in the X-direction of the row selection line driver (RLD) 432A on right side of the row selection line driver (RLD) 432B. In addition, the left ends of the row selection lines RL1 coupled to the row selection line driver (RLD) 432B are located near the middle in the X-direction of the row selection line driver (RLD) 432A on left side of the row selection line driver (RLD) 432B.

(Column Selection Line CL)

FIGS. 29 and 30 each illustrate an example of the column selection lines CL. The configuration of the column selection line CL is the same as that of the column selection line CL (FIG. 9) according to the foregoing first embodiment. The column selection line driver (CLD) 441 is coupled to the plurality of column selection lines CL through a coupling part 341, and the column selection line driver (CLD) 442 is coupled to the plurality of column selection lines CL through a coupling part 342. As illustrated in FIG. 30, the coupling part 341 includes the contact CT, the metal wiring line M1, the via VA between the wiring layers L1 and L2, the metal wiring line M2, the via VA between the wiring layers L2 and L3, the metal wiring line M3, the via VA between the wiring layers L3 and L4, the metal wiring line M4, and the via VA between the wiring layers L4 and L5. The same holds true also for the coupling part 342.

FIG. 31 illustrates an example of the plurality of row selection lines RL0 and RL1 and the plurality of column selection lines CL. FIG. 31 depicts the plurality of row selection lines RL0 and RL1 illustrated in FIGS. 26 and 27 and the plurality of column selection lines CL illustrated in FIG. 29 in a superimposed manner.

Each of the plurality of row selection lines RL0 intersects 2048 (=512×4) column selection lines CL in this example, and each of the plurality of column selection lines CL intersects 1024 (=512×2) row selection lines RL0 in this example. Likewise, each of the plurality of row selection lines RL1 intersects 2048 (=512×4) column selection lines CL in this example, and each of the plurality of column selection lines CL intersects 1024 (=512×2) row selection lines RL1 in this example.

In the memory section 40, a memory array AR0 including 2M (=2048×1024) memory cells MC0 and a memory array AR1 including 2M (=2048×1024) memory cells MC1 are defined. As illustrated in FIG. 26, the memory array AR0 includes 512 row selection lines RL0 coupled to the row selection line driver (RLD) 431A and 512 row selection lines RL0 coupled to the row selection line driver (RLD) 432A. As illustrated in FIG. 27, the memory array AR1 includes 512 row selection lines RL1 coupled to the row selection line driver (RLD) 431B and 512 row selection lines RL1 coupled to the row selection line driver (RLD) 432B.

As illustrated in FIG. 31, a region corresponding to the row selection line driver (RLD) 431 (row selection line drivers (RLD) 431A and 431B) includes a region (slot region SL31) where the row selection lines RL0 and RL1 and the column selection line CL are not formed. The slot region SL31 is located near the middle in the Y-direction of the region corresponding to the row selection line driver (RLD) 431. Likewise, a region corresponding to the row selection line driver (RLD) 432 (row selection line drivers (RLD) 432A and 432B) includes a region (slot region SL32) where the row selection lines RL0 and RL1 and the column selection line CL are not formed. The slot region SL32 is located near the middle in the Y-direction of the region corresponding to the row selection line driver (RLD) 432. The slot regions SL31 and SL32 are each a rectangular region that is long in the X-direction and short in the Y-direction. In the memory section 40, as described below, the coupling part CN31 that couples the row selection line driver (RLD) 431 and the row control line CRL1 to each other is formed in the slot region SL31, and the coupling part CN32 that couples the row selection line driver (RLD) 432 and the row control line CRL2 to each other is formed in the slot region SL32.

(Row Control Line CRL and Column Control Line CCL)

FIG. 32 illustrates a configuration example of the row control line CRL (row control lines CRL1 and CRL2) and the column control line CCL (column control lines CCL1 and CCL2).

In the row selection line driver (RLD) 431 (row selection line drivers (RLD) 431A and 431B), the coupling part CN31 is formed in the slot region SL31, and in the row selection line driver (RLD) 432 (row selection line drivers (RLD) 432A and 432B), the coupling part CN32 is formed in the slot region SL32.

The row control lines CRL1 and CRL2 are each formed using, for example, the metal wiring line M7 of the wiring layer L7. The row control line CRL1 is coupled to the row selection line driver (RLD) 431 through the coupling part CN31, and the row control line CRL2 is coupled to the row selection line driver (RLD) 432 through the coupling part CN32. As a result, the row controller 21 supplies the selection control signal SELRL1 to the plurality of row selection line drivers (RLD) 431 coupled to the row control line CRL1 through the row control line CRL1, and supplies the selection control signal SELRL2 to the plurality of row selection line drivers (RLD) 432 coupled to the row control line CRL2 through the row control line CRL2.

The column control lines CCL1 and CCL2 are each formed using, for example, the metal wiring line M2 of the wiring layer L2. The column control line CCL1 is coupled to the column selection line driver (CLD) 441 through an unillustrated coupling part, and the column control line CCL2 is coupled to the column selection line driver (CLD) 442 through an unillustrated coupling part. As a result, the column controller 22 supplies the selection control signal SELCL1 to the plurality of column selection line drivers (CLD) 441 coupled to the column control line CCL1 through the column control line CCL1, and supplies the selection control signal SELCL2 to the plurality of column selection line drivers (CLD) 442 coupled to the column control line CCL2 through the column control line CCL2.

The semiconductor device 2 is provided with the plurality of row selection lines RL0 and RL1 as well as the row selection line drivers (RLD) 431A and 432A that each drive the plurality of row selection lines RL0 and the row selection line drivers (RLD) 431B and 432B that each drive the plurality of row selection lines RL1, allowing two storage layers to be provided, thus making it possible to increase a storage capacity.

As described above, in the present embodiment, the plurality of row selection lines RL0 and RL1 is provided, and the row selection line driver that drives the plurality of row selection lines RL0 and the row selection line driver that drives the plurality of row selection lines RL1 are provided, thus making it possible to increase a storage capacity. Other effects are similar to those in the case of the foregoing first embodiment.

3. Third Embodiment

Next, description is given of a semiconductor device 3 according to a third embodiment. In the present embodiment, the number of storage layers is further increased. It is to be noted that components substantially the same as those of the semiconductor device 2 according to the foregoing second embodiment are denoted by the same reference numerals, and description thereof is omitted as appropriate.

As illustrated in FIG. 1, the semiconductor device 3 includes a logic circuit section 50 and a memory section 60. Similarly to the semiconductor device 3 (FIG. 2) according to the foregoing embodiment, the memory section 60 includes a plurality row selection line drivers (RLD) 63 (row selection line drivers (RLD) 631 and 632) and a plurality of column selection line drivers (CLD) 64 (column selection line drivers (CLD) 641 and 642). The plurality of row selection line drivers (RLD) 63 and the plurality of column selection line drivers (CLD) 64 are arranged in a checkerboard shape.

FIG. 33 illustrates a configuration example of the memory section 60. The memory section 60 includes a plurality of row selection lines RL (row selection lines RL0, RL1, and RL2), a plurality of column selection lines CL (column selection lines CL1 and CL2), and a plurality of memory cells MC (memory cells MC0, MC1, MC2, and MC3).

The plurality of row selection lines RL0 is so formed as to extend in the X-direction and to be aligned in the Y-direction in the X-Y plane parallel to the substrate surface S of the semiconductor substrate. The plurality of column selection lines CL0 is so formed as to extend in the Y-direction and to be aligned in the X-direction in the X-Y plane. The plurality of row selection lines RL1 is so formed as to extend in the X-direction and to be aligned in the Y-direction in the X-Y plane parallel to the substrate surface S of the semiconductor substrate. The plurality of column selection lines CL1 is so formed as to extend in the Y-direction and to be aligned in the X-direction in the X-Y plane. The plurality of row selection lines RL2 is so formed as to extend in the X-direction and to be aligned in the Y-direction in the X-Y plane parallel to the substrate surface S of the semiconductor substrate. The plurality of column selection lines CL0 is formed in a layer above the layer in which the plurality of row selection lines RL0 is formed; the plurality of row selection lines RL1 is formed in a layer above the layer in which the plurality of column selection lines CL0 is formed; the plurality of column selection lines CL1 is formed in a layer above the layer in which the plurality of row selection lines RL1 is formed; and the plurality of row selection lines RL2 is formed in a layer above the layer in which the plurality of column selection lines CL1 is formed. As described later, each of the plurality of row selection lines RL2 is coupled to a corresponding row selection line RL0 of the plurality of row selection lines RL0.

The plurality of memory cells MC (memory cells MC0) is formed in a storage layer between the layer in which the plurality of row selection lines RL0 is formed and the layer in which the plurality of column selection lines CL0 is formed. Likewise, the plurality of memory cells MC (memory cells MC1) is formed in a layer between the layer in which the plurality of column selection lines CL0 is formed and the storage layer in which the plurality of row selection lines RL1 is formed; the plurality of memory cells MC (memory cells MC2) is formed in a storage layer between the layer in which the plurality of row selection lines RL1 is formed and the layer in which the plurality of column selection lines CL1 is formed; and the plurality of memory cells MC (MC3) is formed in a layer between the layer in which the plurality of column selection lines CL1 is formed and the storage layer in which the plurality of row selection lines RL2 is formed.

As illustrated in FIG. 4, the memory cells MC0 to MC3 each include the storage element VR and the selection element SE. In the memory cell MC0, the terminal TU is coupled to any one of the plurality of column selection lines CL0, and the terminal TL is coupled to any one of the plurality of row selection lines RL0. Likewise, in the memory cell MC1, the terminal TU is coupled to any one of the plurality of row selection lines RL1, and the terminal TL is coupled to any one of the plurality of column selection lines CL0. In the memory cell MC2, the terminal TU is coupled to any one of the plurality of column selection lines CL1, and the terminal TL is coupled to any one of the plurality of row selection lines RL1. In the memory cell MC3, the terminal TU is coupled to any one of the plurality of row selection lines RL2, and the terminal TL is coupled to any one of the plurality of column selection lines CL1. As illustrated in FIG. 33, this allows for formation of the storage element VR in the upper layer of the selection element SE in the memory cell MC, regardless of which storage layer is formed.

FIG. 34 illustrates an example of a layer configuration in the semiconductor device 3. In this example, the semiconductor device 3 includes nine wiring layers L1 to L9. In the logic circuit section 50, metal wiring lines M1 to M9 are formed in wiring layers L1 to L9, respectively.

In the memory section 60, the metal wiring lines M1 to M4 are formed in the wiring layers L1 to L4, respectively. The metal wiring lines M1 to M4 are used, for example, for local wiring lines in the row selection line driver (RLD) 63 and the column selection line driver (CLD) 64, and for the row control line CRL (row control lines CRL1 and CRL2) and the column control line CCL (column control lines CCL1 and CCL2). Further, in the memory section 60, the row selection line RL0 is formed in the wiring layer L5, the column selection line CL0 is formed in the wiring layer L6, the row selection line RL1 is formed in the wiring layer L7, the column selection line CL1 is formed in the wiring layer L8, and the row selection line RL2 is formed in the wiring layer L9.

(Row Selection Lines RL0 to RL2)

FIG. 35 illustrates an example of the row selection lines RL0 and RL2. FIG. 36 illustrates an example of the row selection line RL1. FIG. 37 illustrates an example of the row selection lines RL0 to RL2.

The plurality of row selection line drivers (RLD) 631 includes a row selection line driver (RLD) 631A that drives the plurality of row selection lines RL0 and RL2 and a row selection line driver (RLD) 631B that drives the plurality of row selection lines RL1. The row selection line drivers (RLD) 631A and 631B are alternately arranged with the column selection line driver (CLD) 641 interposed therebetween in the X-direction. Likewise, the plurality of row selection line drivers (RLD) 632 includes a row selection line driver (RLD) 632A that drives the plurality of row selection lines RL0 and RL2 and a row selection line driver (RLD) 632B that drives the plurality of row selection lines RL1. The row selection line drivers (RLD) 632A and 632B are alternately arranged with the column selection line driver (CLD) 642 interposed therebetween in the X-direction.

The configuration of the row selection line RL0 is the same as that of the row selection line RL1 (FIG. 26) according to the foregoing second embodiment, and the configuration of the row selection line RL1 is the same as that of the row selection line RL2 (FIG. 27) according to the foregoing second embodiment.

As illustrated in FIG. 35, the row selection line driver (RLD) 631A is coupled to the plurality of row selection lines RL0 and RL2 through a coupling part 531A, and the row selection line driver (RLD) 632A is coupled to the plurality of row selection lines RL0 and RL2 through a coupling part 532A. As illustrated in FIG. 37, the coupling part 531A includes the contact CT, the metal wiring line M1, the via VA between the wiring layers L1 and L2, the metal wiring line M2, the via VA between the wiring layers L2 and L3, the metal wiring line M3, the via VA between the wiring layers L3 and L4, the metal wiring line M4, the via VA between the wiring layers L4 and L5, the row selection line RL0, the via VA between the wiring layers L5 and L6, the metal wiring line M6, the via VA between the wiring layers L6 and L7, the metal wiring line M7, the via VA between the wiring layers L7 and L8, the metal wiring line M8, and the via VA between the wiring layers L8 and L9. That is, the row selection line RL2 is coupled to the row selection line RL0 using the coupling part 531A. The same holds true also for the coupling part 532A.

In addition, as illustrated in FIG. 36, the row selection line driver (RLD) 631B is coupled to the plurality of row selection lines RL1 through a coupling part 531B, and the row selection line driver (RLD) 632B is coupled to the plurality of row selection lines RL1 through a coupling part 532B. As illustrated in FIG. 37, the coupling part 531B includes the contact CT, the metal wiring line M1, the via VA between the wiring layers L1 and L2, the metal wiring line M2, the via VA between the wiring layers L2 and L3, the metal wiring line M3, the via VA between the wiring layers L3 and L4, the metal wiring line M4, the via VA between the wiring layers L4 and L5, the metal wiring line M5, the via VA between the wiring layers L5 and L6, the metal wiring line M6, and the via VA between the wiring layers L6 and L7. The same holds true also for the coupling part 532B.

(Column Selection Lines CL0 and CL1)

FIG. 38 illustrates an example of the column selection lines CL0. FIG. 39 illustrates an example of the column selection lines CL1. FIG. 40 illustrates an example of the column selection lines CL0 and CL1. The length of each of the column selection lines CL0 and CL1 is about twice that of the column selection line CL according to the foregoing second embodiment.

The plurality of column selection line drivers (CLD) 641 includes a column selection line driver (CLD) 641A that drives the plurality of column selection lines CL0 and a column selection line driver (CLD) 641B that drives the plurality of column selection lines CL1. The column selection line drivers (CLD) 641A and 641B are alternately arranged with the row selection line driver (RLD) 631 interposed therebetween in the Y-direction. Likewise, the plurality of column selection line drivers (CLD) 642 includes a column selection line driver (CLD) 642A that drives the plurality of column selection lines CL0 and a column selection line driver (CLD) 642B that drives the plurality of column selection lines CL1. The column selection line drivers (CLD) 642A and 642B are alternately arranged with the row selection line driver (RLD) 632 interposed therebetween in the Y-direction.

As illustrated in FIG. 38, each of the plurality of column selection lines CL0 is coupled to a coupling part 54A (coupling parts 541A and 542A) near the middle of the extending direction (Y-direction) of the column selection line CL0. In addition, each column selection line driver (CLD) 641A is coupled to the coupling part 541A near the middle of the column selection line driver (CLD) 641A in the Y-direction, and each column selection line driver (CLD) 642A is coupled to the coupling part 542A near the middle of the column selection line driver (CLD) 642A in the Y-direction. As a result, the column selection line driver (CLD) 641A is coupled to the plurality of column selection lines CL0 through the coupling part 541A, and the column selection line driver (CLD) 642A is coupled to the plurality of column selection lines CL0 through the coupling part 542A. As illustrated in FIG. 40, the coupling part 541A includes the contact CT, the metal wiring line M1, the via VA between the wiring layers L1 and L2, the metal wiring line M2, the via VA between the wiring layers L2 and L3, the metal wiring line M3, the via VA between the wiring layers L3 and L4, the metal wiring line M4, the via VA between the wiring layers L4 and L5, the metal wiring line M5, and the via VA between the wiring layers L5 and L6. The same holds true also for the coupling part 542A.

One column selection line driver (CLD) 641A is coupled to the plurality of (512 in this example) column selection lines CL0, for example. In FIG. 38, the upper ends of the column selection lines CL0 coupled to the column selection line driver (CLD) 641A are located near the middle in the Y-direction of the column selection line driver (CLD) 641B on upper side of the column selection line driver (CLD) 641A. In addition, the lower ends of the column selection lines CL0 coupled to the column selection line driver (CLD) 641A are located near the middle in the Y-direction of the column selection line driver (CLD) 641B on lower side of the column selection line driver (CLD) 641A.

Likewise, one column selection line driver (CLD) 642A is coupled to the plurality of (512 in this example) column selection lines CL0, for example. In FIG. 38, the upper ends of the column selection lines CL0 coupled to the column selection line driver (CLD) 642A are located near the middle in the Y-direction of the column selection line driver (CLD) 642B on upper side of the column selection line driver (CLD) 642A. In addition, the lower ends of the column selection lines CL0 coupled to the column selection line driver (CLD) 642A are located near the middle in the Y-direction of the column selection line driver (CLD) 642B on lower side of the column selection line driver (CLD) 642A.

As illustrated in FIG. 39, each of the plurality of column selection lines CL1 is coupled to a coupling part 54B (coupling parts 541B and 542B) near the middle of the extending direction (Y-direction) of the column selection line CL1. In addition, each column selection line driver (CLD) 641B is coupled to the coupling part 541B near the middle of the column selection line driver (CLD) 641B in the Y-direction, and each column selection line driver (CLD) 642B is coupled to the coupling part 542B near the middle of the column selection line driver (CLD) 642B in the Y-direction. As a result, the column selection line driver (CLD) 641B is coupled to the plurality of column selection lines CL1 through the coupling part 541B, and the column selection line driver (CLD) 642B is coupled to the plurality of column selection lines CL1 through the coupling part 542B. As illustrated in FIG. 40, the coupling part 541B includes the contact CT, the metal wiring line M1, the via VA between the wiring layers L1 and L2, the metal wiring line M2, the via VA between the wiring layers L2 and L3, the metal wiring line M3, the via VA between the wiring layers L3 and L4, the metal wiring line M4, the via VA between the wiring layers L4 and L5, the metal wiring line M5, the via VA between the wiring layers L5 and L6, the metal wiring line M6, the via VA between the wiring layers L6 and L7, the metal wiring line M7, and the via VA between the wiring layers L7 and L8. The same holds true also for the coupling part 542B.

One column selection line driver (CLD) 641B is coupled to the plurality of (512 in this example) column selection lines CL1, for example. In FIG. 39, the upper ends of the column selection lines CL1 coupled to the column selection line driver (CLD) 641B are located near the middle in the Y-direction of the column selection line driver (CLD) 641A on upper side of the column selection line driver (CLD) 641B. In addition, the lower ends of the column selection lines CL1 coupled to the column selection line driver (CLD) 641B are located near the middle in the Y-direction of the column selection line driver (CLD) 641A on lower side of the column selection line driver (CLD) 641B.

Likewise, one column selection line driver (CLD) 642B is coupled to the plurality of (512 in this example) column selection lines CL1, for example. In FIG. 39, the upper ends of the column selection lines CL1 coupled to the column selection line driver (CLD) 642B are located near the middle in the Y-direction of the column selection line driver (CLD) 642A on upper side of the column selection line driver (CLD) 642B. In addition, the lower ends of the column selection lines CL1 coupled to the column selection line driver (CLD) 642B are located near the middle in the Y-direction of the column selection line driver (CLD) 642A on lower side of the column selection line driver (CLD) 642B.

FIG. 41 illustrates an example of the plurality of row selection lines RL0 to RL2 and the plurality of column selection lines CL0 and CL1. FIG. 41 depicts the plurality of row selection lines RL0 to RL2 illustrated in FIGS. 35 and 36 and the plurality of column selection lines CL0 and CL1 illustrated in FIGS. 38 and 39 in a superimposed manner.

Each of the plurality of row selection lines RL0 intersects 2048 (=512×4) column selection lines CL0 in this example, and each of the plurality of column selection lines CL0 intersects 2048 (=512×4) row selection lines RL0 in this example. Likewise, each of the plurality of row selection lines RL1 intersects 2048 (=512×4) column selection lines CL0 in this example, and each of the plurality of column selection lines CL0 intersects 2048 (=512×4) row selection lines RL1 in this example. Each of the plurality of row selection lines RL1 intersects 2048 (=512×4) column selection lines CL1 in this example, and each of the plurality of column selection lines CL1 intersects 2048 (=512×4) row selection lines RL1 in this example. Each of the plurality of row selection lines RL2 intersects 2048 (=512×4) column selection lines CL1 in this example, and each of the plurality of column selection lines CL1 intersects 2048 (=512×4) row selection lines RL2 in this example.

In the memory section 40, a memory array AR0 (FIG. 35) including 4M (=2048×2048) memory cells MC0, a memory array AR1 (FIG. 36) including 4M (=2048×2048) memory cells MC1, a memory array AR2 (FIG. 36) including 4M (=2048×2048) memory cells MC2, and a memory array AR3 (FIG. 35) including 4M (=2048×2048) memory cells MC3 are defined.

As illustrated in FIG. 41, in the memory section 60, unlike the memory section 40 (FIG. 31), for example, in the region corresponding to the row selection line driver (RLD) 63 (row selection line drivers (RLD) 631 and 632), there is no region where the row selection lines RL0 to RL2 as well as the column selection lines CL0 and CL1 are not formed; in the region corresponding to the column selection line driver (CLD) 64 (column selection line drivers (CLD) 641 and 642), there is no region where the row selection lines RL0 to RL2 as well as the column selection lines CL0 and CL1 are not formed.

(Row Control Line CRL and Column Control Line CCL)

FIG. 42 illustrates a configuration example of the row control line CRL (row control lines CRL1 and CRL2) and the column control line CCL (column control lines CCL1 and CCL2).

The row control lines CRL1 and CRL2 are each formed using, for example, the metal wiring line M4 of the wiring layer L4. The row control line CRL1 is coupled to the row selection line driver (RLD) 631 through an unillustrated coupling part, and the row control line CRL2 is coupled to the row selection line driver (RLD) 632 through an unillus- trated coupling part. As a result, the row controller 21 supplies the selection control signal SELRL1 to the plurality of row selection line drivers (RLD) 631 coupled to the row control line CRL1 through the row control line CRL1, and supplies the selection control signal SELRL2 to the plurality of row selection line drivers (RLD) 632 coupled to the row control line CRL2 through the row control line CRL2.

The column control lines CCL1 and CCL2 are each formed using, for example, the metal wiring line M3 of the wiring layer L3. The column control line CCL1 is coupled to the column selection line driver (CLD) 641 through an unillustrated coupling part, and the column control line CCL2 is coupled to the column selection line driver (CLD) 642 through an unillustrated coupling part. As a result, the column controller 22 supplies the selection control signal SELCL1 to the plurality of column selection line drivers (CLD) 641 coupled to the column control line CCL1 through the column control line CCL1, and supplies the selection control signal SELCL2 to the plurality of column selection line drivers (CLD) 642 coupled to the column control line CCL2 through the column control line CCL2.

The semiconductor device 3 is provided with the plurality of row selection lines RL0 to RL2 and the plurality of column selection lines CL0 and CL1 as well as with the row selection line drivers (RLD) 631A and 632A that each drive the plurality of row selection lines RL0 and RL2; the row selection line drivers (RLD) 631B and 632B that each drive the plurality of row selection lines RL1; the column selection line drivers (CLD) 641A and 642A that each drive the plurality of column selection lines CL0; and the column selection line drivers (CLD) 641B and 642B that each drive the plurality of column selection lines CL1, allowing four storage layers to be provided, thus making it possible to increase a storage capacity.

As described above, in the present embodiment, there are provided the plurality of row selection lines RL0 to RL2 and the plurality of column selection lines CL0 and CL1, and there are provided the row selection line driver that drives the plurality of row selection lines RL0 and RL2; the row selection line driver that drives the plurality of row selection lines RL1; the column selection line driver that drives the plurality of column selection lines CL0; and the column selection line driver that drives the plurality of column selection lines CL1, thus making it possible to increase a storage capacity. Other effects are similar to those in the case of the foregoing second embodiment.

Modification Example 3-1

In the foregoing embodiment, four storage layers are provided; however, this is not limitative. Three storage layers may be provided, or five or more storage layers may be provided. In the following, description is given in detail of a semiconductor device 3A provided with three storage layers. The semiconductor device 3A includes a logic circuit section 50A and a memory section 60A.

FIG. 43 illustrates a configuration example of the memory section 60A. The memory section 60A includes the plurality of row selection lines RL (row selection lines RL0 and RL1), the plurality of column selection lines CL (column selection lines CL0 and CL1), and the plurality of memory cells MC (memory cells MC0, MC1, and MC2).

The plurality of row selection lines RL0 is so formed as to extend in the X-direction and to be aligned in the Y-direction in the X-Y plane parallel to the substrate surface S of the semiconductor substrate. The plurality of column selection lines CL0 is so formed as to extend in the Y-direction and to be aligned in the X-direction in the X-Y plane. The plurality of row selection lines RL1 is so formed as to extend in the X-direction and to be aligned in the Y-direction in the X-Y plane. The plurality of column selection lines CL1 is so formed as to extend in the Y-direction and to be aligned in the X-direction in the X-Y plane. The plurality of column selection lines CL0 is formed in a layer above the layer in which the plurality of row selection lines RL0 is formed; the plurality of row selection lines RL1 is formed in a layer above the layer in which the plurality of column selection lines CL0 is formed; and the plurality of column selection lines CL1 is formed in a layer above the layer in which the plurality of row selection lines RL1 is formed.

The plurality of memory cells MC (memory cells MC0) is formed in a storage layer between the layer in which the plurality of row selection lines RL0 is formed and the layer in which the plurality of column selection lines CL0 is formed. Likewise, the plurality of memory cells MC (memory cells MC1) is formed in a layer between the layer in which the plurality of column selection lines CL0 is formed and the storage layer in which the plurality of row selection lines RL1 is formed, and the plurality of memory cells MC (memory cells MC2) is formed in a layer between the layer in which the plurality of row selection lines RL1 is formed and the storage layer in which the plurality of column selection lines CL1 is formed.

As illustrated in FIG. 4, the memory cells MC0 to MC2 each include the storage element VR and the selection element SE. In the memory cell MC0, the terminal TU is coupled to any one of the plurality of column selection lines CL0, and the terminal TL is coupled to any one of the plurality of row selection lines RL0. Likewise, in the memory cell MC1, the terminal TU is coupled to any one of the plurality of row selection lines RL1, and the terminal TL is coupled to any one of the plurality of column selection lines CL0. In the memory cell MC2, the terminal TU is coupled to any one of the plurality of column selection lines CL1, and the terminal TL is coupled to any one of the plurality of row selection lines RL1. As illustrated in FIG. 43, this allows for formation of the storage element VR in the upper layer of the selection element SE in the memory cell MC, regardless of which storage layer is formed.

FIG. 44 illustrates an example of a layer configuration in the semiconductor device 3A. In this example, the semiconductor device 3A includes eight wiring layers L1 to L8. In the logic circuit section 50A, the metal wiring lines M1 to M8 are formed in the wiring layers L1 to L8, respectively.

In the memory section 60A, the metal wiring lines M1 to M4 are formed in the wiring layers L1 to L4, respectively. The metal wiring lines M1 to M4 are used, for example, for local wiring lines in the row selection line driver (RLD) 63 and the column selection line driver (CLD) 64, and for the row control line CRL (row control lines CRL1 and CRL2) and the column control line CCL (column control lines CCL1 and CCL2). In addition, in the memory section 60A, the row selection line RL0 is formed in the wiring layer L5, the column selection line CL0 is formed in the wiring layer L6, the row selection line RL1 is formed in the wiring layer L7, and the column selection line CL1 is formed in the wiring layer L8.

The configurations of the row selection lines RL0 and RL1 in the memory section 60A are similar to those of the row selection lines RL0 and RL1 (FIGS. 35 and 36) of the memory section 60 according to the foregoing embodiment. In addition, the configurations of the column selection lines CL0 and CL1 in the memory section 60A are similar to those of the column selection lines CL0 and CL1 (FIGS. 38 and 39) of the memory section 60 according to the foregoing embodiment.

Although the present technology has been described with reference to several embodiments and modification examples, the present technology is not limited to these embodiments, etc., and may be modified in a variety of ways.

For example, the layer configurations, the number of the row selection lines RL, the number of the column selection lines CL, and the like in each of the foregoing embodiments, etc. are merely exemplary, and may be modified as appropriate.

Further, for example, in each of the foregoing embodiments, etc., the logic circuit and the nonvolatile memory are mounted together (embedded); however, this is not limitative. The logic circuit and the nonvolatile memory may not be mounted together. In this case, it is possible to manufacture the memory section using a manufacturing process optimized for the non-volatile memory.

It is to be noted that the effects described herein are merely illustrative and non-limiting, and other effects may be included.

It is to be noted that the present technology may have the following configurations.

(1)

A semiconductor device including:

a plurality of first selection lines provided in a first region, the plurality of first selection lines extending in a first direction and being aligned in a second direction that intersects the first direction;

a plurality of second selection lines provided in a second region having a portion that overlaps a portion of the first region, the plurality of second selection lines extending in the second direction and being aligned in the first direction;

a plurality of third selection lines provided in a third region having a portion that overlaps a portion of the second region, the plurality of third selection lines extending in the first direction and being aligned in the second direction;

a plurality of fourth selection lines provided in a fourth region having one portion that overlaps a portion of the first region and having another portion that overlaps a portion of the third region, the plurality of fourth selection lines extending in the second direction and being aligned in the first direction;

a first coupling part coupled to the plurality of first selection lines at a portion, of the first region, other than ends in the first direction;

a second coupling part coupled to the plurality of second selection lines at a portion, of the second region, other than ends in the second direction;

a third coupling part coupled to the plurality of third selection lines at a portion, of the third region, other than ends in the first direction;

a fourth coupling part coupled to the plurality of fourth selection lines at a portion, of the fourth region, other than ends in the second direction;

a driver that drives the plurality of first selection lines, the plurality of second selection lines, the plurality of third selection lines, and the plurality of fourth selection lines, respectively, through the first coupling part, the second coupling part, the third coupling part, and the fourth coupling part;

a first memory cell interposed between one of the plurality of first selection lines and one of the plurality of fourth selection lines;

a second memory cell interposed between one of the plurality of second selection lines and one of the plurality of first selection lines;

a third memory cell interposed between one of the plurality of third selection lines and one of the plurality of second selection lines; and a fourth memory cell interposed between one of the plurality of fourth selection lines and one of the plurality of third selection lines.

(2)

The semiconductor device according to (1), in which the driver includes a first circuit provided in a first circuit region, the first circuit being coupled to the first coupling part in a region of the first circuit region and driving the plurality of first selection lines, a second circuit provided in a second circuit region adjacent to the first circuit region in the first direction, the second circuit being coupled to the second coupling part in a region of the second circuit region and driving the plurality of second selection lines, a third circuit provided in a third circuit region adjacent to the second circuit region in the second direction, the third circuit being coupled to the third coupling part in a region of the third circuit region and driving the plurality of third selection lines, and a fourth circuit provided in a fourth circuit region that is adjacent to the first circuit region in the second direction and is adjacent to the third circuit region in the second direction, the fourth circuit being coupled to the fourth coupling part in a region of the fourth circuit region and driving the plurality of fourth selection lines.

(3)

The semiconductor device according to (2), in which the first circuit is coupled to the first coupling part at a portion, of the first circuit region, other than ends in the first direction, the second circuit is coupled to the second coupling part at a portion, of the second circuit region, other than ends in the second direction, the third circuit is coupled to the third coupling part at a portion, of the third circuit region, other than ends in the first direction, and the fourth circuit is coupled to the fourth coupling part at a portion, of the fourth circuit region, other than ends in the second direction.

(4)

The semiconductor device according to (2) or (3), in which the plurality of first selection lines and the plurality of third selection lines are formed in a first layer, the plurality of second selection lines and the plurality of fourth selection lines are formed in a second layer, and a first end, which is one of ends of the first region in the first direction, is located within the region of the second circuit region.

(5)

The semiconductor device according to (4), in which the first end is located in a region other than ends within the region of the second circuit region in the first direction.

(6)

The semiconductor device according to (4) or (5), further including:

a plurality of fifth selection lines provided in a fifth region, the plurality of fifth selection lines extending in the first direction and being aligned in the second direction, the fifth region being adjacent to and apart from the first region in the first direction and having a portion that overlaps a portion of the second region; and a fifth coupling part coupled to the plurality of fifth selection lines at a portion, of the fifth region, other than ends in the first direction, in which the driver further includes a fifth circuit provided in a fifth circuit region adjacent to the second circuit region in the first direction, the fifth circuit being coupled to the fifth coupling part in a region of the fifth circuit region and driving the plurality of fifth selection lines, and a second end, which is one of ends of the fifth region in the first direction, is located within the region of the second circuit region.

(7)

The semiconductor device according to (6), further including:

a controller that generates a control signal;

a control signal line formed in an upper layer of the first layer and the second layer, the control signal line extending in the first direction and transmitting the control signal; and a control signal coupling part coupled to the control signal line, in which the second circuit is coupled to the control signal coupling part at a portion, in the second circuit region, sandwiched between the first end of the first region and the second end of the fifth region.

(8)

The semiconductor device according to any one of (4) to (7), in which one of ends of the fourth region in the second direction is located within the region of the first circuit region.

(9)

The semiconductor device according to (2) or (3), in which the first coupling part includes a first partial coupling part and a second partial coupling part arranged in the second direction, and a layer in which selection lines, of the plurality of first selection lines, coupled to the first partial coupling part are formed is different from a layer in which selection lines, of the plurality of first selection lines, coupled to the second partial coupling part are formed.

(10)

The semiconductor device according to (2) or (3), in which a layer in which line portions, of the plurality of second selection lines, on one side as viewed from the second coupling part in the second direction are formed is different from a layer in which line portions, of the plurality of second selection lines, on the other side as viewed from the second coupling part in the second direction are formed.

(11)

The semiconductor device according to (2), further including:

a plurality of sixth selection lines provided in a sixth region having a portion that overlaps a portion of the first region and a portion of the second region, the plurality of sixth selection lines extending in the first direction and being aligned in the second direction; and a sixth coupling part coupled to the plurality of sixth selection lines at a portion, of the sixth region, other than ends in the first direction, in which the plurality of first selection lines and the plurality of third selection lines are formed in a first layer, the plurality of second selection lines and the plurality of fourth selection lines are formed in a second layer, the plurality of sixth selection lines is formed in a third layer, the first layer, the second layer, and the third layer are disposed in this order, the driver further includes a sixth circuit provided in a sixth circuit region adjacent to the second circuit region in the first direction, the sixth circuit being coupled to the sixth coupling part in a region of the sixth circuit region and driving the plurality of sixth selection lines, a third end, which is one of ends of the first region in the first direction, is located within the region of the sixth circuit region, and a fourth end, which is one of ends of the sixth region in the first direction, is located within the region of the first circuit region.

(12)

The semiconductor device according to (11), in which the third end of the first region is located in a region, within the region of the sixth circuit region, other than the ends in the first direction, and the fourth end of the sixth region is located in a region, within the region of the first circuit region, other than the ends in the first direction.

(13)

The semiconductor device according to (11) or (12), in which one of the ends of the fourth region in the second direction is located within the region of the first circuit region.

(14)

The semiconductor device according to (11), further including:

a plurality of seventh selection lines provided in a seventh region having a portion that overlaps a portion of the second region and a portion of the third region, the plurality of seventh selection lines extending in the second direction and being aligned in the first direction; and a seventh coupling part coupled to the plurality of seventh selection lines at a portion, of the seventh region, other than ends in the second direction, in which the plurality of seventh selection lines is formed in a fourth layer, the first layer, the second layer, the third layer, and the fourth layer are disposed in this order, the driver further includes a seventh circuit provided in a seventh circuit region adjacent to the third circuit region in the second direction, the seventh circuit being coupled to the seventh coupling part in a region of the seventh circuit region and driving the plurality of seventh selection lines, a fifth end, which is one of the ends of the second region in the second direction, is located within the region of the seventh circuit region, and a sixth end, which is one of the ends of the seventh region in the second direction, is located within the region of the second circuit region.

(15)

The semiconductor device according to (14), further including a plurality of eighth selection lines provided in the first region, the plurality of eighth selection lines extending in the first direction and being aligned in the second direction, in which the plurality of eighth selection lines is coupled to the first coupling part at the portion, of the first region, other than the ends in the first direction, and the first circuit also drives the eighth selection lines in addition to the plurality of first selection lines.

This application claims the benefit of Japanese Priority Patent Application JP2017-104176 filed with the Japan Patent Office on May 26, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device comprising:
a plurality of first selection lines provided in a first region, the plurality of first selection lines extending in a first direction and being aligned in a second direction that intersects the first direction;
a plurality of second selection lines provided in a second region having a portion that overlaps a portion of the first region, the plurality of second selection lines extending in the second direction and being aligned in the first direction;
a plurality of third selection lines provided in a third region having a portion that overlaps a portion of the second region, the plurality of third selection lines extending in the first direction and being aligned in the second direction;
a plurality of fourth selection lines provided in a fourth region having one portion that overlaps a portion of the first region and having another portion that overlaps a portion of the third region, the plurality of fourth selection lines extending in the second direction and being aligned in the first direction;
a first coupling part coupled to the plurality of first selection lines at a portion, of the first region, other than ends in the first direction;
a second coupling part coupled to the plurality of second selection lines at a portion, of the second region, other than ends in the second direction;
a third coupling part coupled to the plurality of third selection lines at a portion, of the third region, other than ends in the first direction;
a fourth coupling part coupled to the plurality of fourth selection lines at a portion, of the fourth region, other than ends in the second direction;
a driver that drives the plurality of first selection lines, the plurality of second selection lines, the plurality of third selection lines, and the plurality of fourth selection lines, respectively, through the first coupling part, the second coupling part, the third coupling part, and the fourth coupling part;
a first memory cell interposed between one of the plurality of first selection lines and one of the plurality of fourth selection lines;
a second memory cell interposed between one of the plurality of second selection lines and one of the plurality of first selection lines;
a third memory cell interposed between one of the plurality of third selection lines and one of the plurality of second selection lines; and
a fourth memory cell interposed between one of the plurality of fourth selection lines and one of the plurality of third selection lines.

2. The semiconductor device according to claim 1, wherein
the driver includes
a first circuit provided in a first circuit region, the first circuit being coupled to the first coupling part in a region of the first circuit region and driving the plurality of first selection lines,
a second circuit provided in a second circuit region adjacent to the first circuit region in the first direction, the second circuit being coupled to the second coupling part in a region of the second circuit region and driving the plurality of second selection lines, a third circuit provided in a third circuit region adjacent to the second circuit region in the second direction, the third circuit being coupled to the third coupling part in a region of the third circuit region and driving the plurality of third selection lines, and a fourth circuit (CLD) provided in a fourth circuit region that is adjacent to the first circuit region in the second direction and is adjacent to the third circuit region in the second direction, the fourth circuit being coupled to the fourth coupling part in a region of the fourth circuit region and driving the plurality of fourth selection lines.

3. The semiconductor device according to claim 2, wherein the first circuit is coupled to the first coupling part at a portion, of the first circuit region, other than ends in the first direction, the second circuit is coupled to the second coupling part at a portion, of the second circuit region, other than ends in the second direction, the third circuit is coupled to the third coupling part at a portion, of the third circuit region, other than ends in the first direction, and the fourth circuit is coupled to the fourth coupling part at a portion, of the fourth circuit region, other than ends in the second direction.

4. The semiconductor device according to claim 2, wherein the plurality of first selection lines and the plurality of third selection lines are formed in a first layer, the plurality of second selection lines and the plurality of fourth selection lines are formed in a second layer, and a first end, which is one of ends of the first region in the first direction, is located within the region of the second circuit region.

5. The semiconductor device according to claim 4, wherein the first end is located in a region other than ends within the region of the second circuit region in the first direction.

6. The semiconductor device according to claim 4, further comprising:

a plurality of fifth selection lines provided in a fifth region, the plurality of fifth selection lines extending in the first direction and being aligned in the second direction, the fifth region being adjacent to and apart from the first region in the first direction and having a portion that overlaps a portion of the second region; and a fifth coupling part coupled to the plurality of fifth selection lines at a portion, of the fifth region, other than ends in the first direction, wherein the driver further includes a fifth circuit provided in a fifth circuit region adjacent to the second circuit region in the first direction, the fifth circuit being coupled to the fifth coupling part in a region of the fifth circuit region and driving the plurality of fifth selection lines, and a second end, which is one of ends of the fifth region in the first direction, is located within the region of the second circuit region.

7. The semiconductor device according to claim 6, further comprising:

a controller that generates a control signal;

a control signal line formed in an upper layer of the first layer and the second layer, the control signal line extending in the first direction and transmitting the control signal; and a control signal coupling part coupled to the control signal line, wherein the second circuit is coupled to the control signal coupling part at a portion, in the second circuit region, sandwiched between the first end of the first region and the second end of the fifth region.

8. The semiconductor device according to claim 4, wherein one of ends of the fourth region in the second direction is located within the region of the first circuit region.

9. The semiconductor device according to claim 2, wherein the first coupling part includes a first partial coupling part and a second partial coupling part arranged in the second direction, and a layer in which selection lines, of the plurality of first selection lines, coupled to the first partial coupling part are formed is different from a layer in which selection lines, of the plurality of first selection lines, coupled to the second partial coupling part are formed.

10. The semiconductor device according to claim 2, wherein a layer in which line portions, of the plurality of second selection lines, on one side as viewed from the second coupling part in the second direction are formed is different from a layer in which line portions, of the plurality of second selection lines, on the other side as viewed from the second coupling part in the second direction are formed.

11. The semiconductor device according to claim 2, further comprising:

a plurality of sixth selection lines provided in a sixth region having a portion that overlaps a portion of the first region and a portion of the second region, the plurality of sixth selection lines extending in the first direction and being aligned in the second direction; and a sixth coupling part coupled to the plurality of sixth selection lines at a portion, of the sixth region, other than ends in the first direction, wherein the plurality of first selection lines and the plurality of third selection lines are formed in a first layer, the plurality of second selection lines and the plurality of fourth selection lines are formed in a second layer, the plurality of sixth selection lines is formed in a third layer, the first layer, the second layer, and the third layer are disposed in this order, the driver further includes a sixth circuit provided in a sixth circuit region adjacent to the second circuit region in the first direction, the sixth circuit being coupled to the sixth coupling part in a region of the sixth circuit region and driving the plurality of sixth selection lines, a third end, which is one of ends of the first region in the first direction, is located within the region of the sixth circuit region, and a fourth end, which is one of ends of the sixth region in the first direction, is located within the region of the first circuit region.

12. The semiconductor device according to claim 11, wherein the third end of the first region is located in a region, within the region of the sixth circuit region, other than the ends in the first direction, and the fourth end of the sixth region is located in a region, within the region of the first circuit region, other than the ends in the first direction.

13. The semiconductor device according to claim 11, wherein one of the ends of the fourth region in the second direction is located within the region of the first circuit region.

14. The semiconductor device according to claim 11, further comprising:
- a plurality of seventh selection lines provided in a seventh region having a portion that overlaps a portion of the second region and a portion of the third region, the plurality of seventh selection lines extending in the second direction and being aligned in the first direction; and
- a seventh coupling part coupled to the plurality of seventh selection lines at a portion, of the seventh region, other than ends in the second direction, wherein the plurality of seventh selection lines is formed in a fourth layer, the first layer, the second layer, the third layer, and the fourth layer are disposed in this order, the driver further includes a seventh circuit provided in a seventh circuit region adjacent to the third circuit region in the second direction, the seventh circuit being coupled to the seventh coupling part in a region of the seventh circuit region and driving the plurality of seventh selection lines, a fifth end, which is one of the ends of the second region in the second direction, is located within the region of the seventh circuit region, and a sixth end, which is one of the ends of the seventh region in the second direction, is located within the region of the second circuit region.

15. The semiconductor device according to claim 14, further comprising a plurality of eighth selection lines provided in the first region, the plurality of eighth selection lines extending in the first direction and being aligned in the second direction, wherein the plurality of eighth selection lines is coupled to the first coupling part at the portion, of the first region, other than the ends in the first direction, and the first circuit also drives the eighth selection lines in addition to the plurality of first selection lines.

* * * * *